(12) United States Patent
Ino et al.

(10) Patent No.: US 11,171,156 B2
(45) Date of Patent: Nov. 9, 2021

(54) FERROELECTRIC MEMORY DEVICE

(71) Applicant: Kioxia Corporation, Tokyo (JP)

(72) Inventors: Tsunehiro Ino, Fujisawa Kanagawa (JP); Kazuhiko Yamamoto, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/806,253

(22) Filed: Mar. 2, 2020

(65) Prior Publication Data
US 2021/0091095 A1 Mar. 25, 2021

(30) Foreign Application Priority Data

Sep. 20, 2019 (JP) .............................. JP2019-171667

(51) Int. Cl.
  *H01L 27/1159* (2017.01)
  *H01L 27/11597* (2017.01)
  *H01L 27/11502* (2017.01)
  *H01L 27/11514* (2017.01)

(52) U.S. Cl.
  CPC .... *H01L 27/1159* (2013.01); *H01L 27/11502* (2013.01); *H01L 27/11514* (2013.01); *H01L 27/11597* (2013.01)

(58) Field of Classification Search
  CPC ......... H01L 27/11502; H01L 27/11514; H01L 27/1159; H01L 27/11597
  USPC ....................................................... 257/295
  See application file for complete search history.

(56) References Cited

U.S. PATENT DOCUMENTS

| 10,510,862 | B2 | 12/2019 | Ino | |
| 2003/0234449 | A1* | 12/2003 | Aratani | ............... H01L 27/2472 257/758 |
| 2010/0176488 | A1* | 7/2010 | Aoyama | ............. H01L 27/1021 257/536 |

(Continued)

FOREIGN PATENT DOCUMENTS

| JP | H04-208565 A | 7/1992 |
| JP | 2018-527737 A | 9/2018 |
| JP | 2019-169574 A | 10/2019 |

OTHER PUBLICATIONS

U.S. Appl. No. 16/670,375, filed Oct. 19, 2019, Ino.

(Continued)

*Primary Examiner* — Matthew E Warren
(74) *Attorney, Agent, or Firm* — Foley & Lardner LLP

(57) ABSTRACT

According to an embodiment, a memory device includes a first conductive layer extending in a first direction, a second conductive layer extending in the first direction, a third conductive layer extending in a second direction intersecting with the first direction, an insulating layer provided between the first conductive layer and the second conductive layer, and a dielectric layer provided between the first conductive layer and the third conductive layer, and between the insulating layer and the third conductive layer, the dielectric layer having a first thickness thinner than a second thickness, the first thickness being a thickness between the first conductive layer and the third conductive layer, the second thickness being a thickness between the insulating layer and the third conductive layer, and the dielectric layer including an oxide including at least one of hafnium oxide and zirconium oxide.

8 Claims, 44 Drawing Sheets

(56) References Cited

U.S. PATENT DOCUMENTS

| | | | |
|---|---|---|---|
| 2013/0062588 A1* | 3/2013 | Sakotsubo | G11C 13/0004 |
| | | | 257/4 |
| 2014/0312385 A1 | 10/2014 | Sluka | |
| 2018/0096717 A1 | 4/2018 | Jiang | |
| 2019/0296122 A1 | 9/2019 | Ino | |
| 2019/0296234 A1* | 9/2019 | Yoshimura | H01L 27/249 |
| 2020/0066868 A1 | 2/2020 | Ino et al. | |
| 2021/0082957 A1* | 3/2021 | Sakuma | H01L 27/11587 |

OTHER PUBLICATIONS

J. Seidel et al., "Domain Wall Conductivity in La-Doped $BiFeO_3$", Physical Review Letters, 105, 197603, 2010, 3 pages.

Y. Dai et al., "First principle simulations on the effects of oxygen vacancy in $HfO_2$-based RRAM", AIP Advances, 5, 017133, 2015, 12 pages.

P. Paruch et al., "Nanoscale studies of ferroelectric domain walls as pinned elastic interfaces", Preprint submitted to Elsevier, 2013, 46 pages.

* cited by examiner

FIG.2A
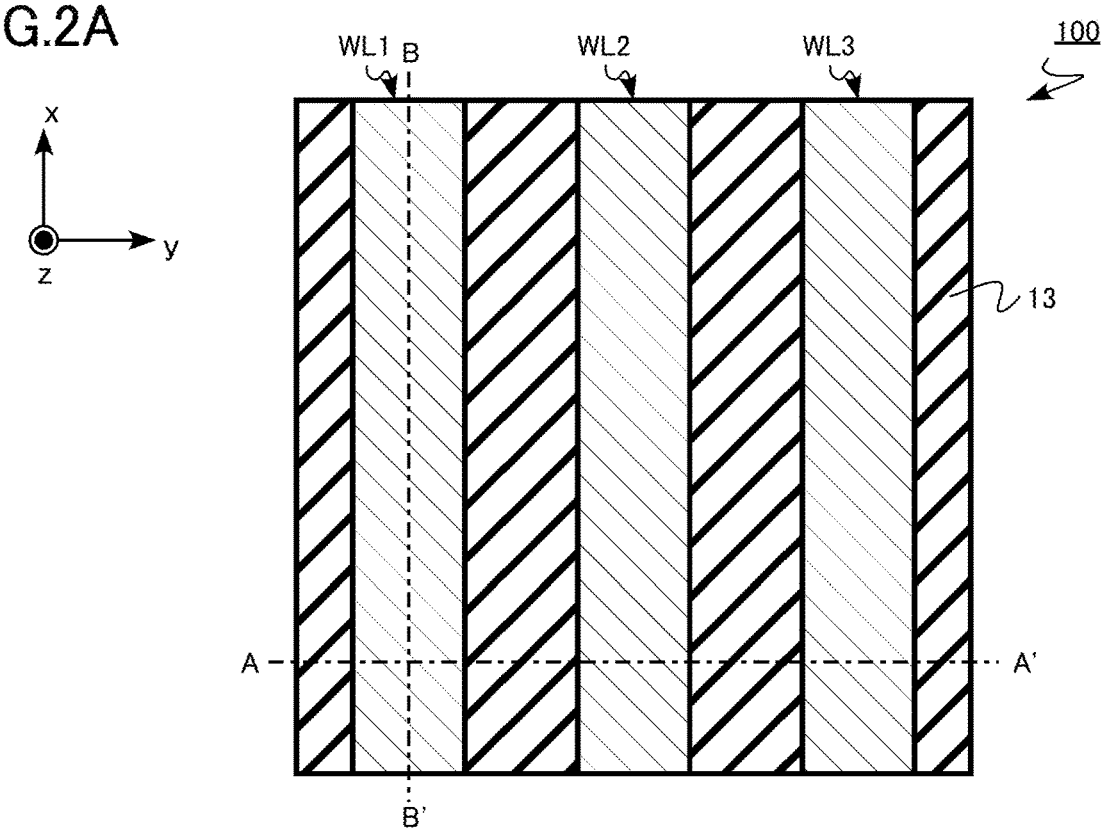
FIG.2B AA' SECTION
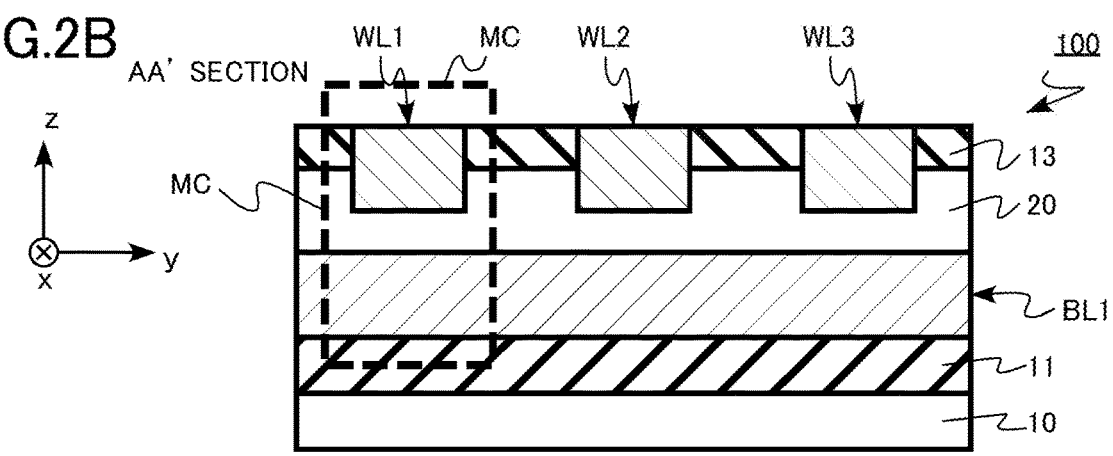
FIG.2C BB' SECTION
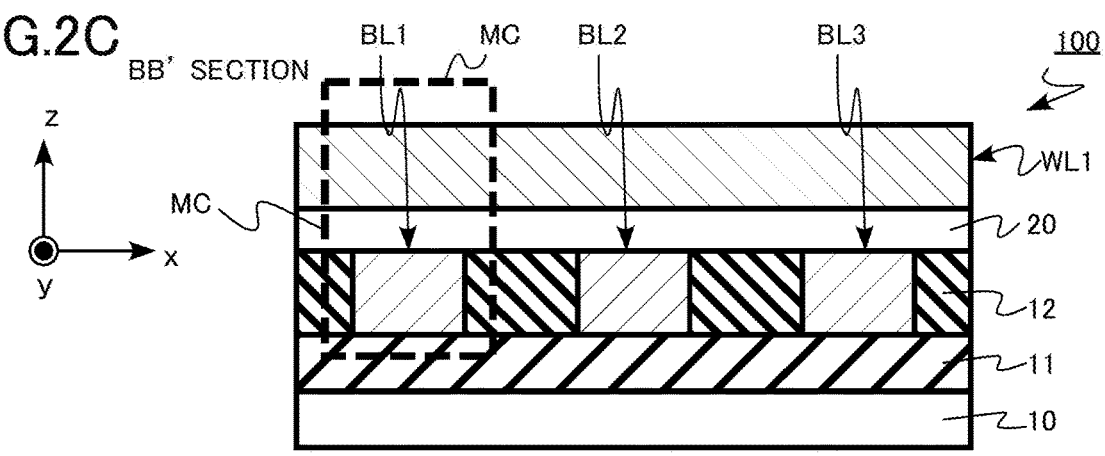

FIG.4A
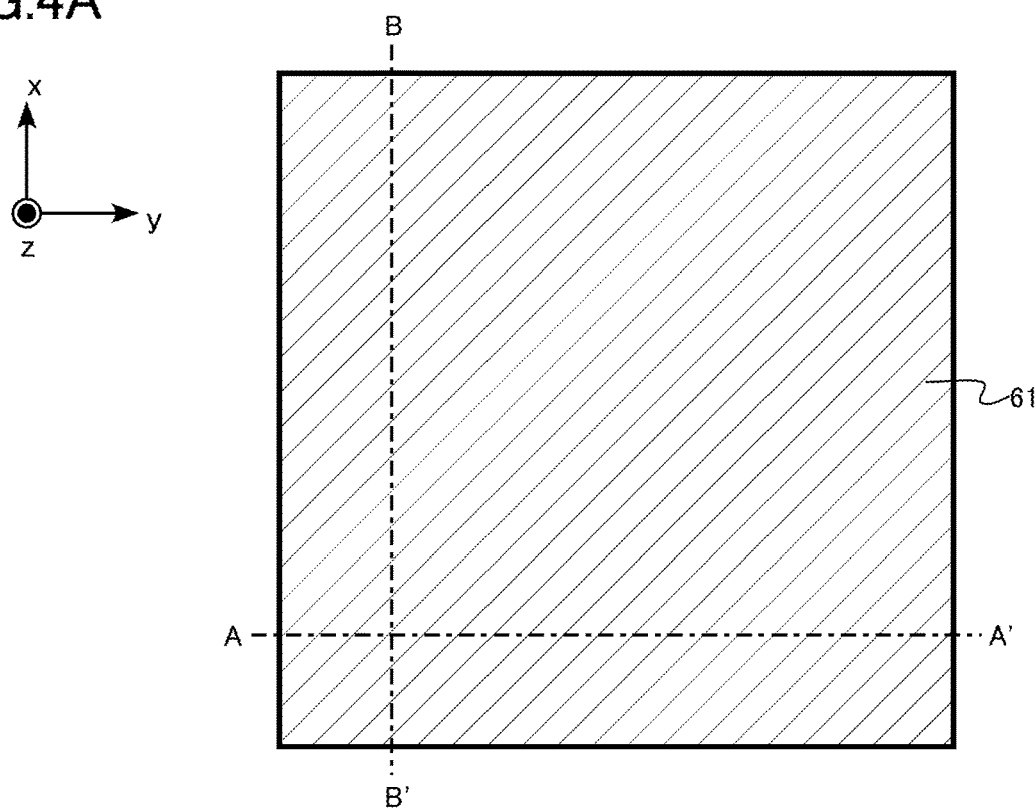
FIG.4B AA' SECTION
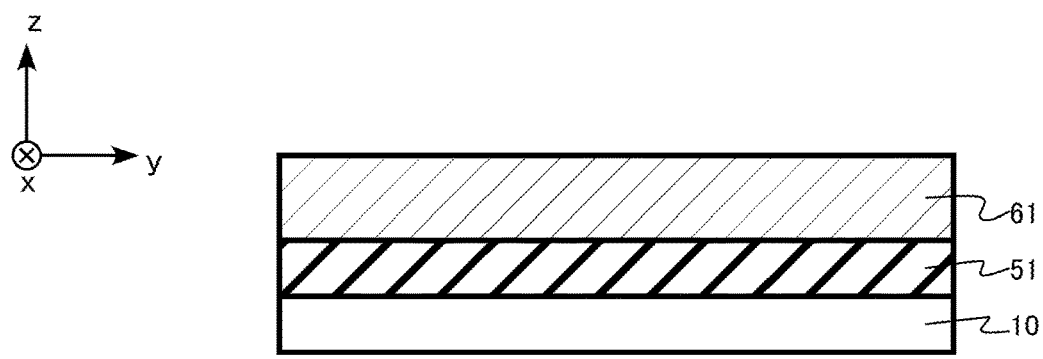
FIG.4C BB' SECTION
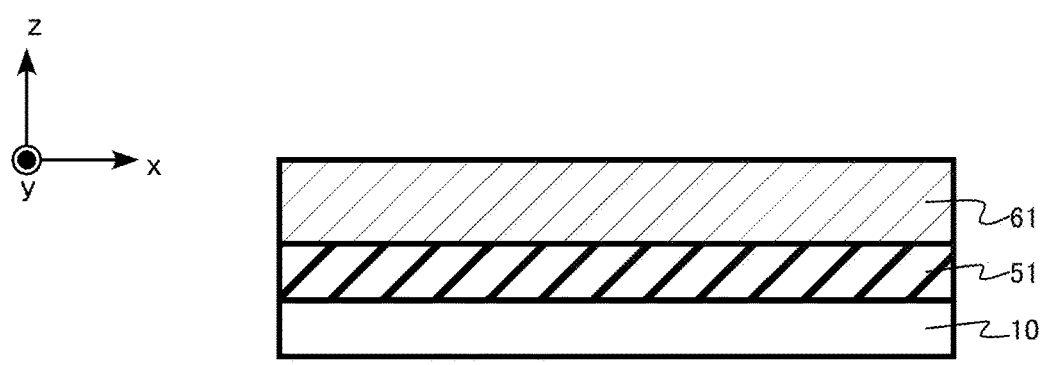

FIG.5A
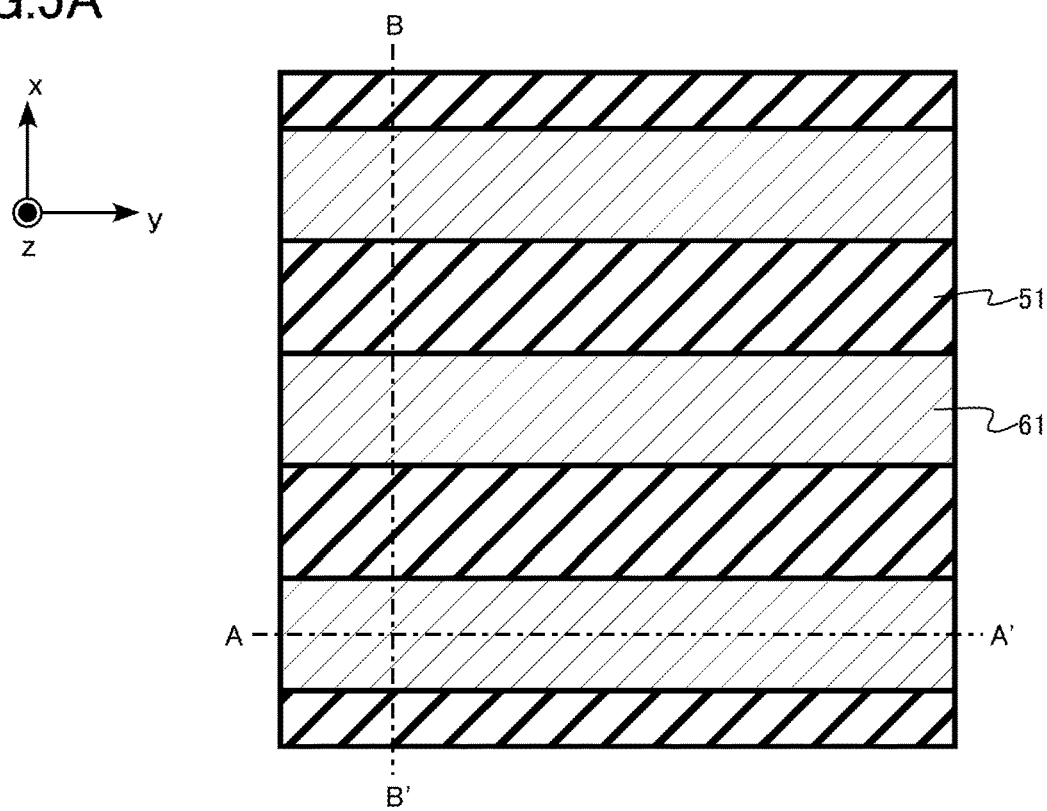
FIG.5B AA' SECTION
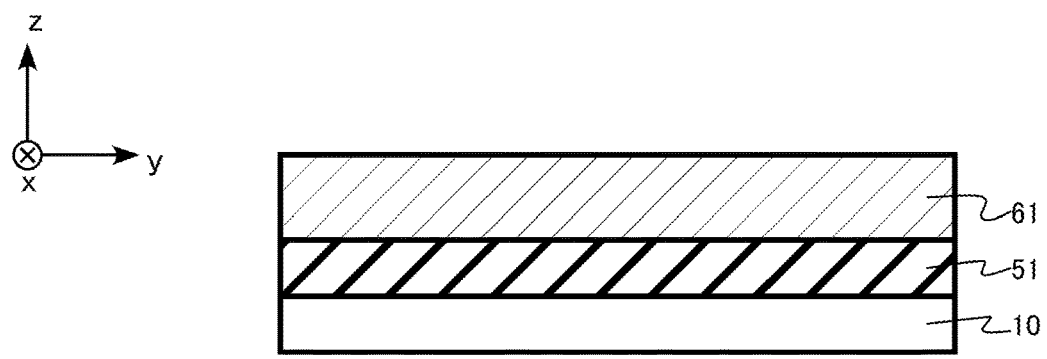
FIG.5C BB' SECTION
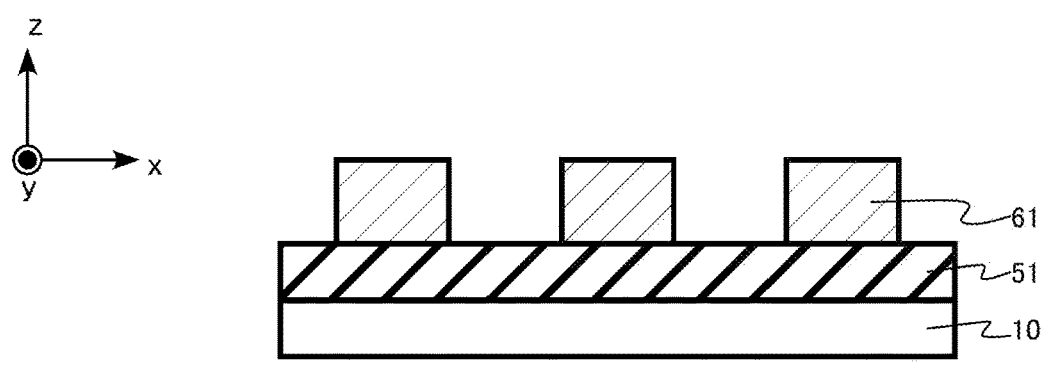

FIG.6A
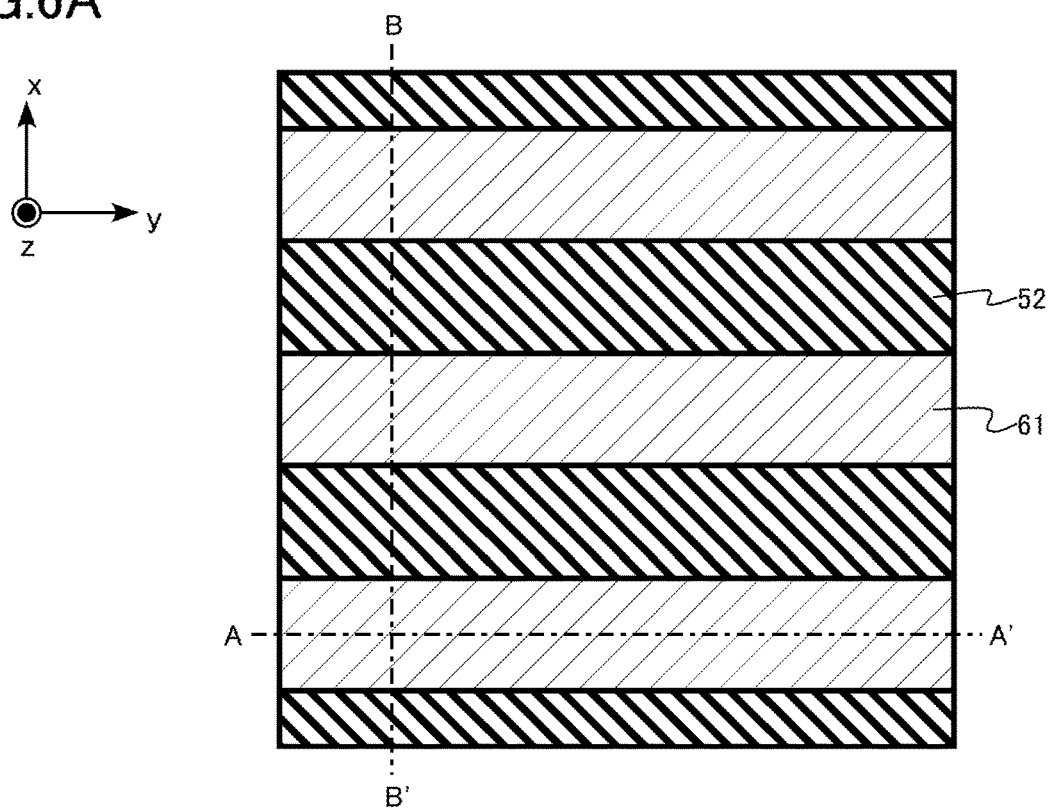
FIG.6B AA' SECTION
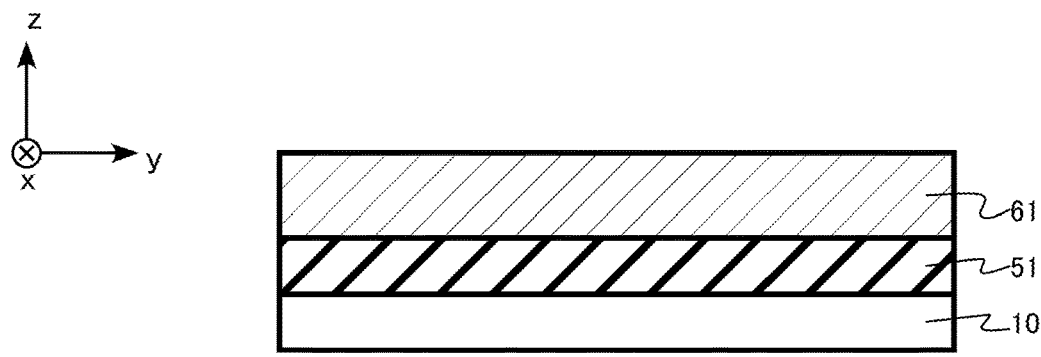
FIG.6C BB' SECTION
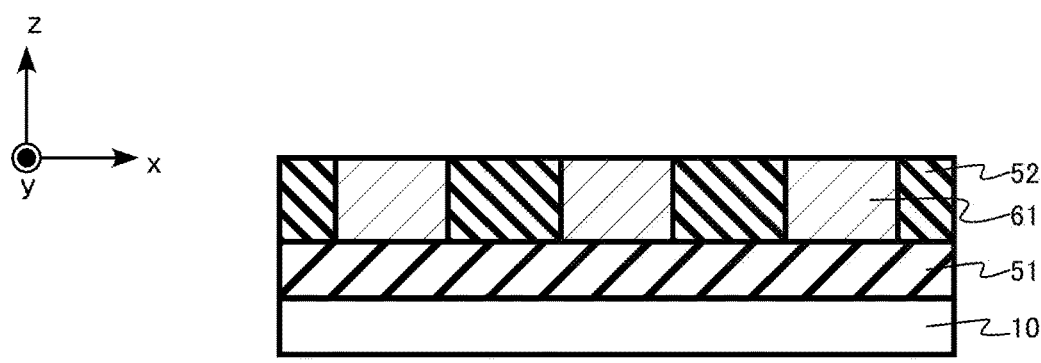

FIG.7A
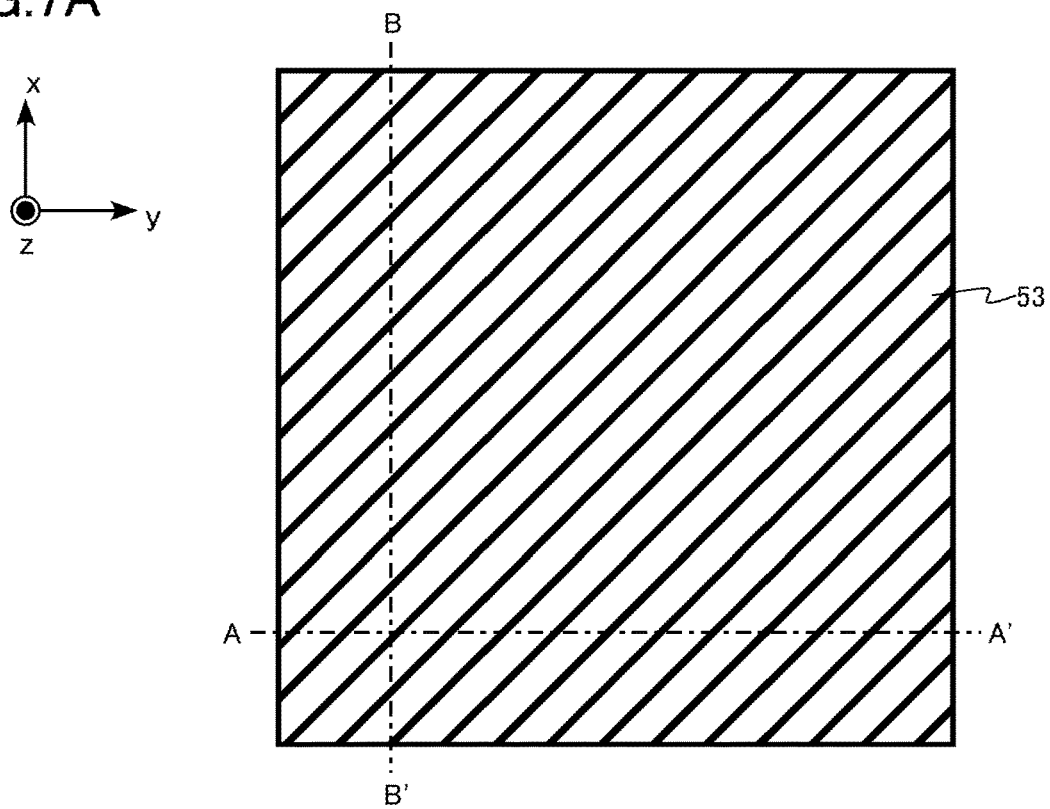
FIG.7B AA' SECTION
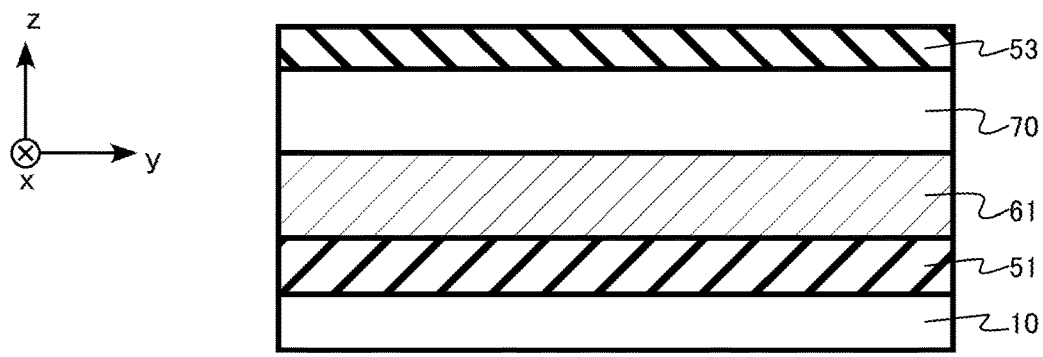
FIG.7C BB' SECTION
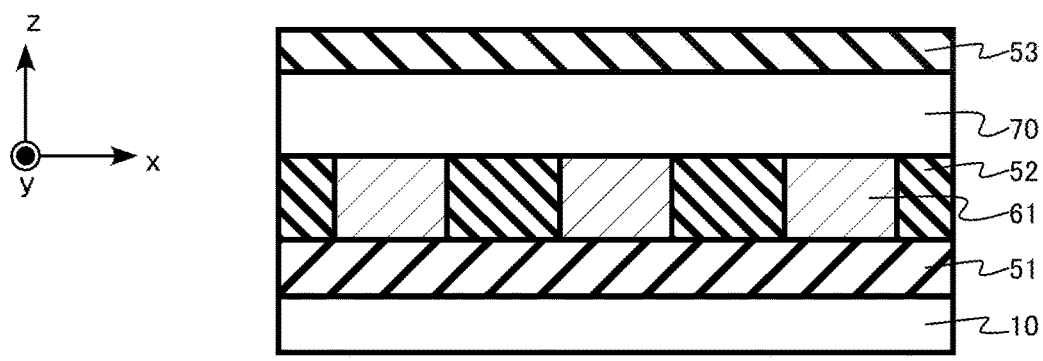

FIG.8A
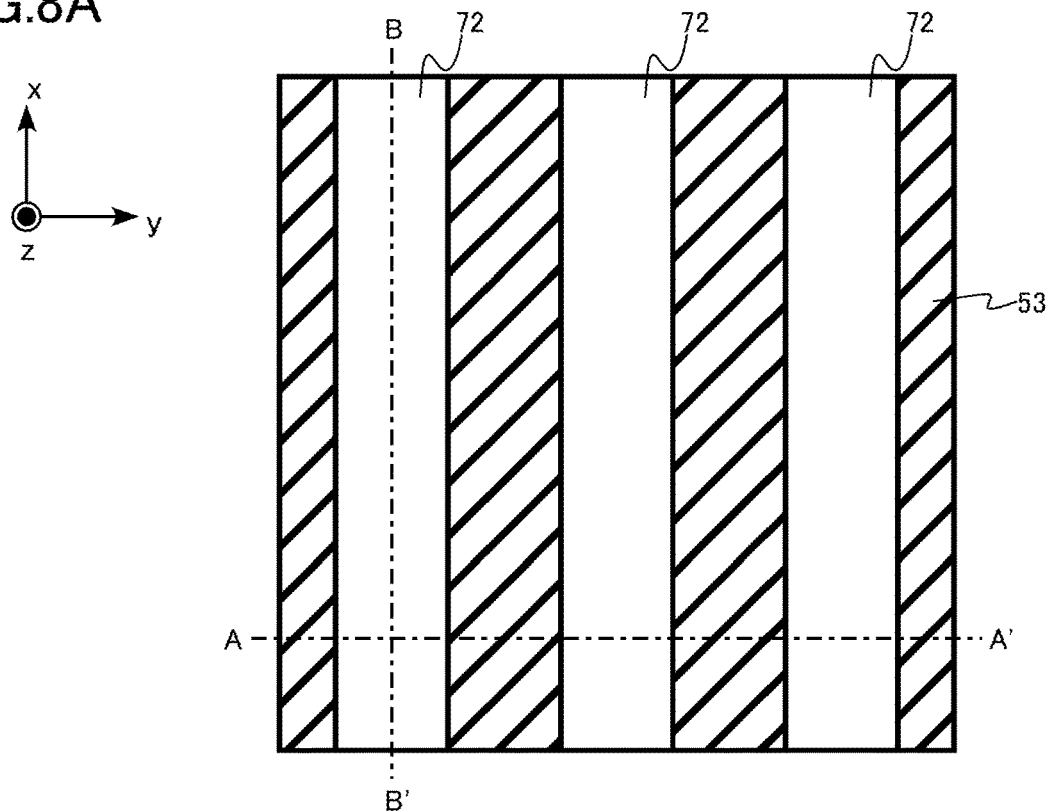
FIG.8B AA' SECTION
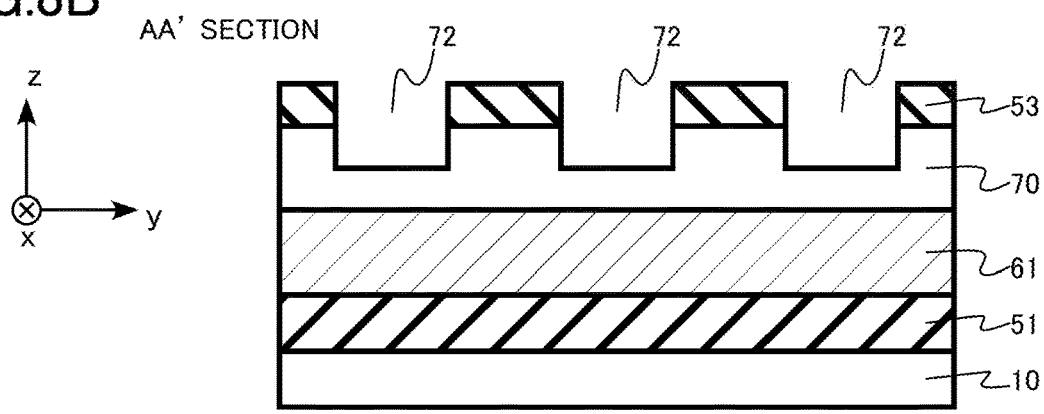
FIG.8C BB' SECTION
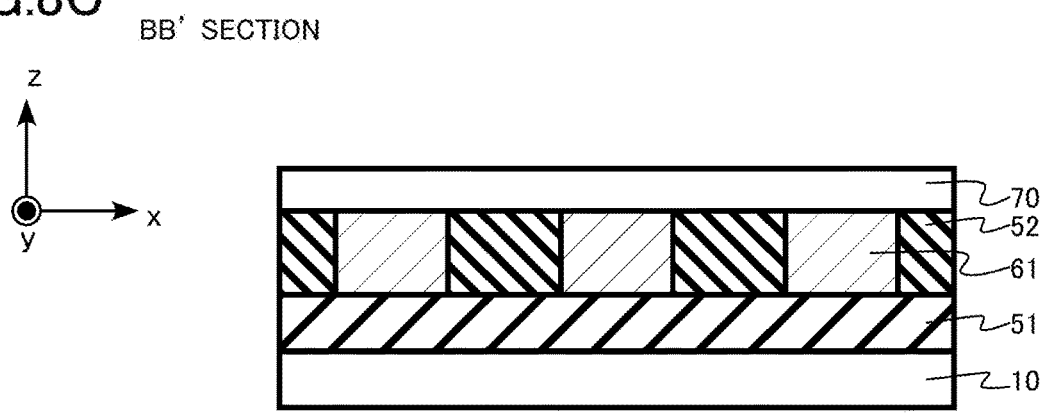

FIG.9A
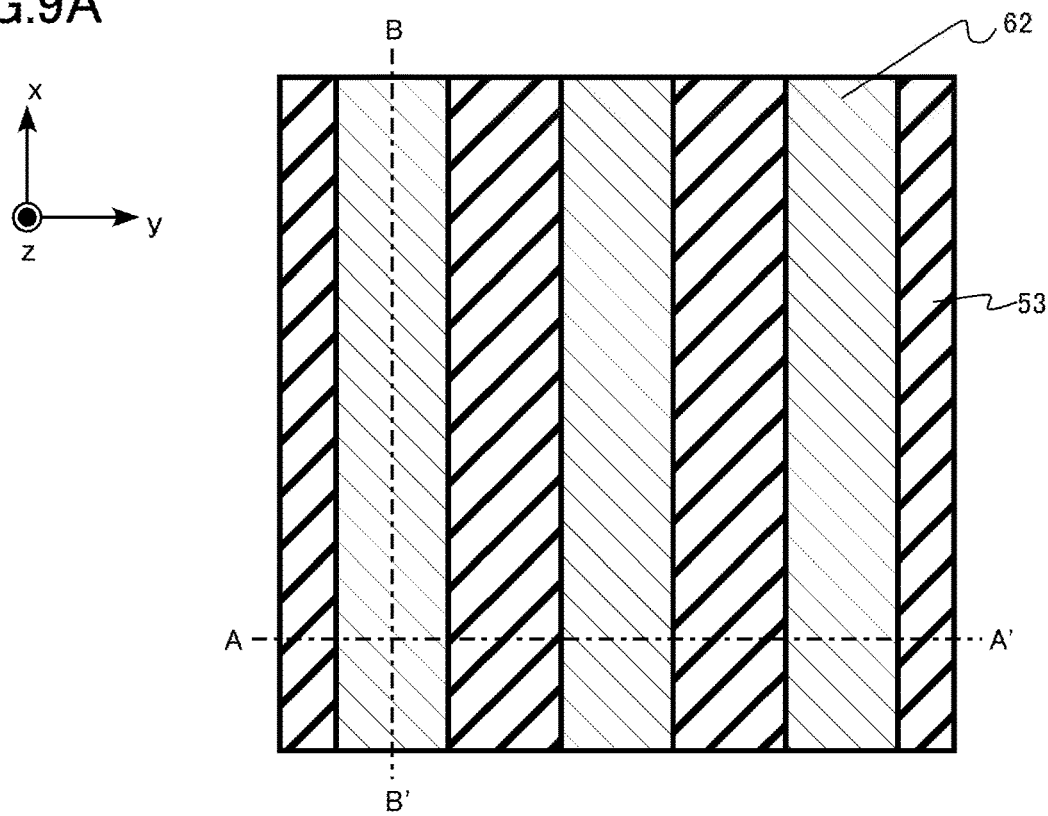
FIG.9B AA' SECTION
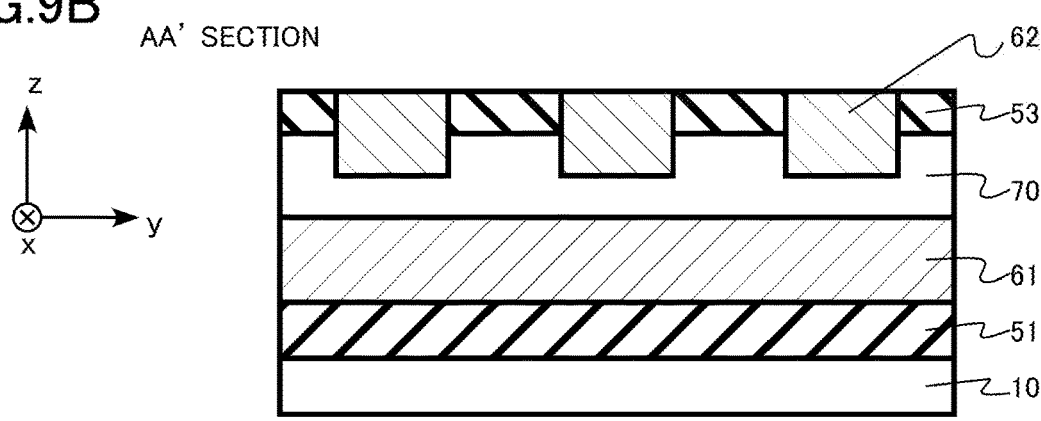
FIG.9C BB' SECTION
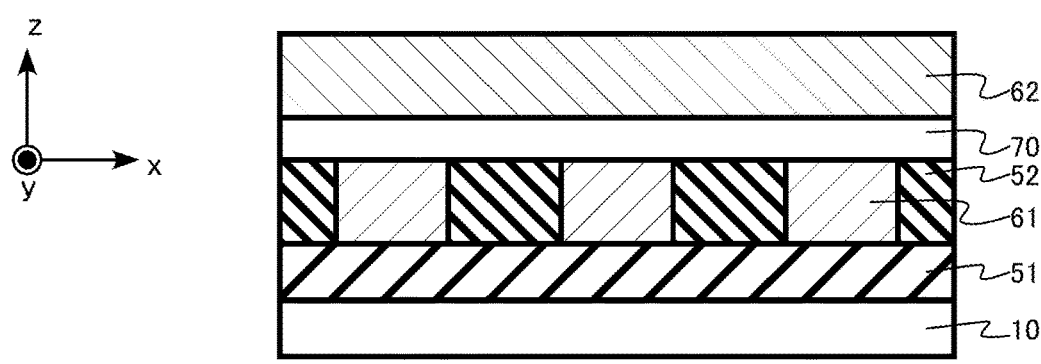

FIG.13
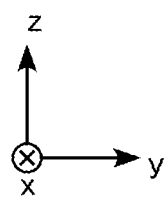
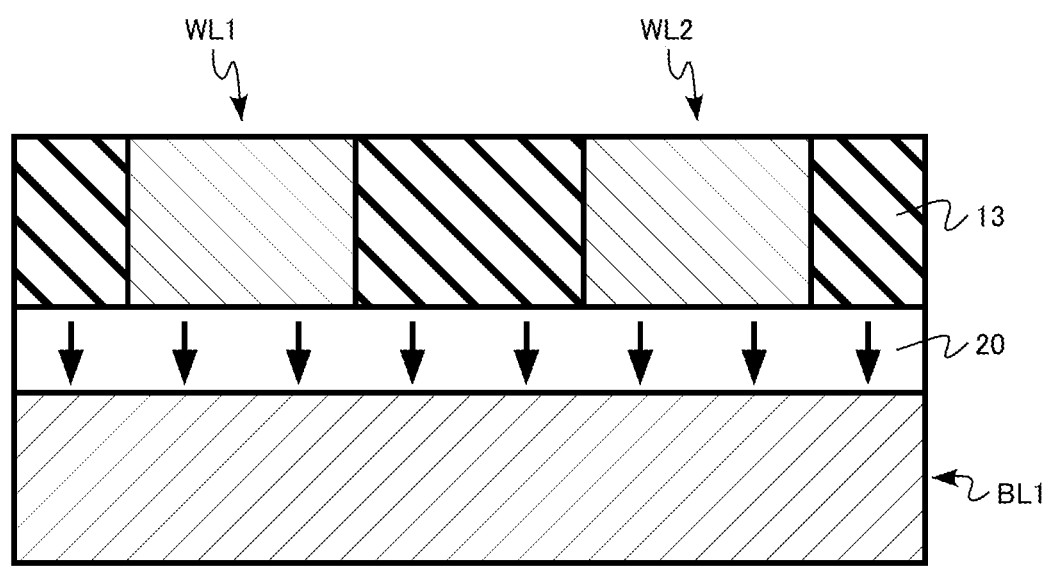

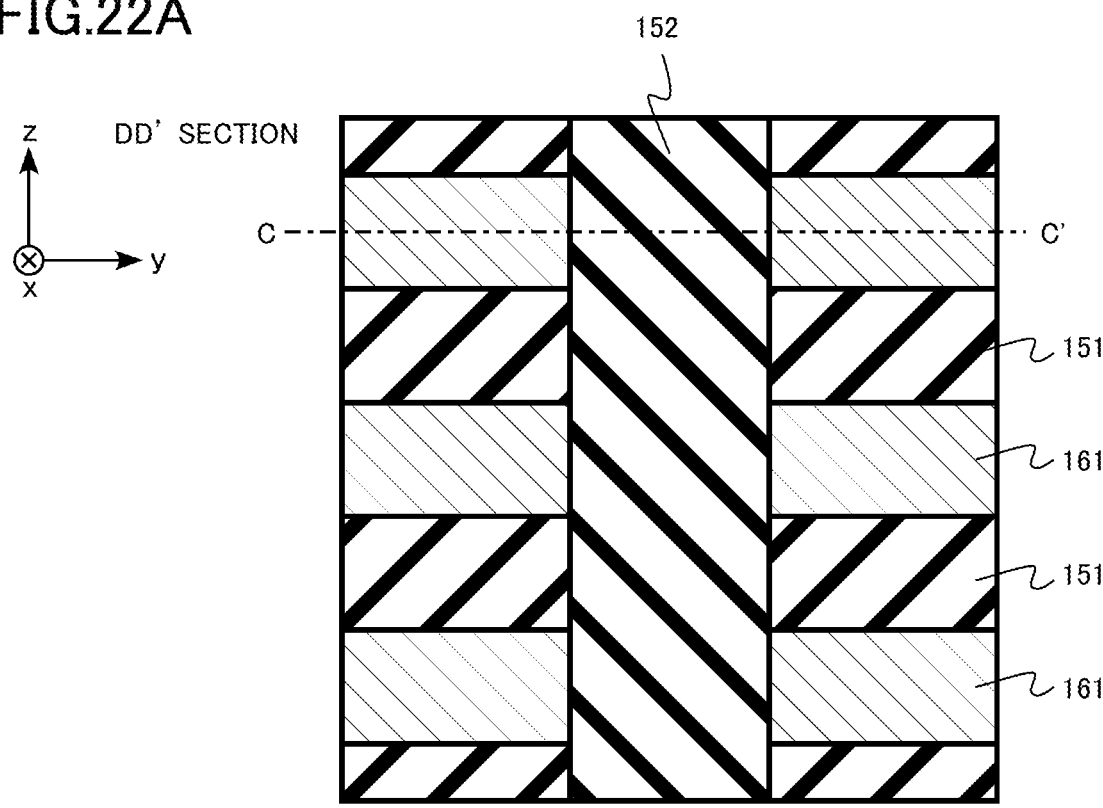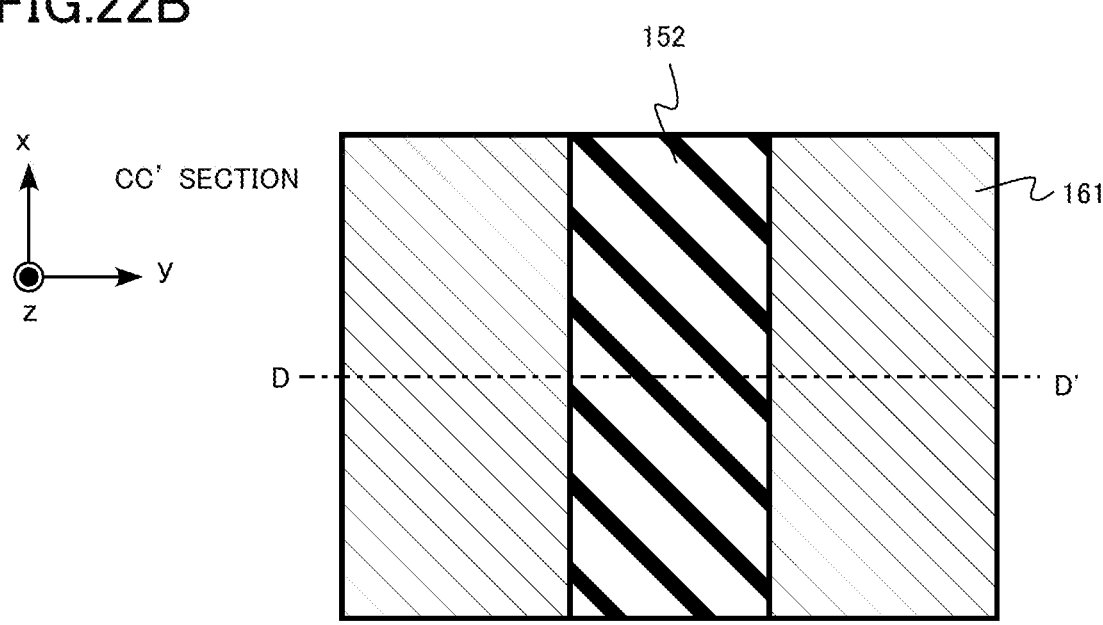

FERROELECTRIC MEMORY DEVICE

CROSS-REFERENCE TO RELATED APPLICATION

This application is based upon and claims the benefit of priority from Japanese Patent Application No. 2019-171667, filed on Sep. 20, 2019, the entire contents of which are incorporated herein by reference.

FIELD

Embodiments described herein relate generally to a memory device.

BACKGROUND

Ferroelectric memories are attracting attention as nonvolatile memories. The ferroelectric memory includes a two-terminal type memory, such as a ferroelectric random access memory (FeRAM), in which a ferroelectric film and the like are provided between two electrode films to modulate induced nonvolatile charges generated in a ferroelectric substance; a two-terminal type memory, such as a ferroelectric tunnel junction (FTJ), in which a ferroelectric film and the like are provided between two electrode films to modulate a tunnel current flowing in a ferroelectric substance in a non-volatile manner; and an FeFET type three-terminal memory in which a ferroelectric film is applied to a gate insulating film of a field effect transistor (PET) type transistor to modulate a transistor threshold voltage. The two-terminal type memory generally connected to a source or a drain of an additional transistor. However, the representative types of ferroelectric memories in the related art have many problems in producing a large-capacity nonvolatile memory device.

BRIEF DESCRIPTION OF THE DRAWINGS

FIGS. 2A to 2C are schematic diagrams illustrating a portion of the memory cell array in the memory device in the first embodiment;

FIGS. 4A to 4C are schematic diagrams illustrating an example of a manufacturing method of the memory device in the first embodiment;

FIGS. 5A to 5C are schematic diagrams illustrating the example of the manufacturing method of the memory device in the first embodiment;

FIGS. 6A to 6C are schematic diagrams illustrating the example of the manufacturing method of the memory device in the first embodiment;

FIGS. 7A to 7C are schematic diagrams illustrating the example of the manufacturing method of the memory device in the first embodiment;

FIGS. 8A to 8C are schematic diagrams illustrating the example of the manufacturing method of the memory device in the first embodiment;

FIGS. 9A to 9C are schematic diagrams illustrating the example of the manufacturing method of the memory device in the first embodiment;

FIG. 13 is a diagram for the function and effect of the memory device in the first embodiment;

FIGS. 22A and 22B are schematic diagrams illustrating the example of the manufacturing method of the memory device in the second embodiment;

DETAILED DESCRIPTION

Figure 1:
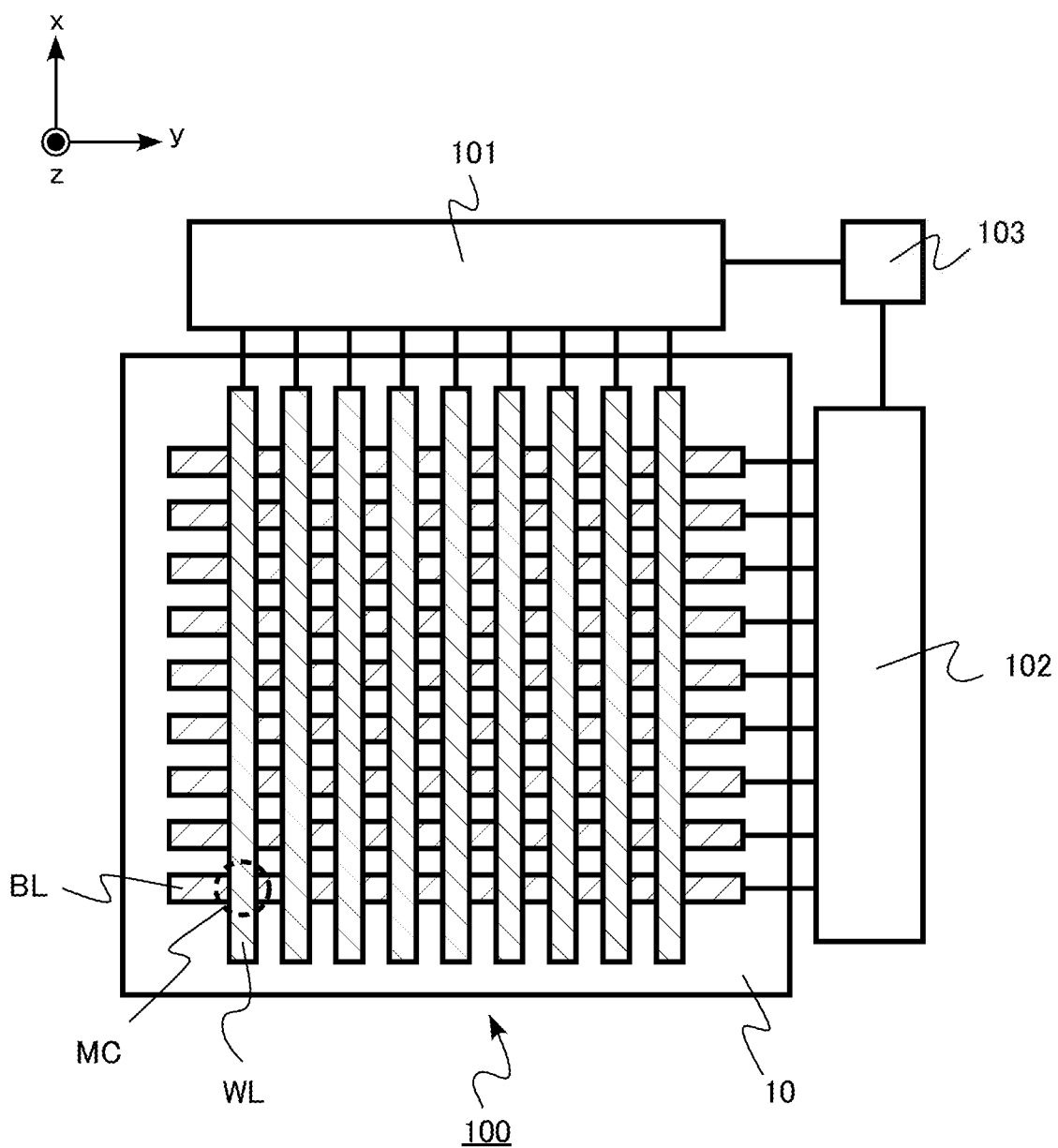
FIG. 1 is a block diagram illustrating a memory cell array and a peripheral circuit of a memory device according to a first embodiment.

According to an embodiment, a memory device includes a first conductive layer extending in a first direction; a second conductive layer extending in the first direction; a third conductive layer extending in a second direction intersecting with the first direction; an insulating layer provided between the first conductive layer and the second conductive layer; and a dielectric layer provided between the first conductive layer and the third conductive layer, and between the insulating layer and the third conductive layer, the dielectric layer having a first thickness thinner than a second thickness, the first thickness being a thickness between the first conductive layer and the third conductive layer, the second thickness being a thickness between the insulating layer and the third conductive layer, and the dielectric layer including an oxide including at least one of hafnium oxide and zirconium oxide.

Hereinafter, embodiments will be described with reference to the drawings. In the following descriptions, the same or similar members and the like are denoted by the same reference signs, and descriptions of members which are described once will be omitted as appropriate.

In this specification, the terms of "upper" or "lower" may be used for convenience. The term of "upper" or "lower" is a term indicating a relative positional relationship in the drawings, and not defining a positional relationship with respect to gravity.

In this specification, for example, secondary ion mass spectroscopy (SIMS), energy dispersive X-ray spectroscopy (EDX), or electron energy loss spectroscopy (EELS) may be performed for qualitative analysis and quantitative analysis of the chemical composition of a member constituting a memory device. The thickness of the member constituting the memory device, the distance between members, and the like may be measured with a transmission electron microscope (TEM), for example. For example, a transmission electron microscope, X-ray diffraction (XRD), electron beam diffraction (EBD), X-ray photoelectron spectroscopy (XPS), or a synchrotron radiation X-ray absorption fine structure (XAFS) may be used for identification of a crystal system of the member constituting the memory device and size comparison of a proportion of the crystal system.

In this specification, "a ferroelectric substance" means a substance having spontaneous polarization without applying an electric field from the outside, and having a polarity which is reversed if the electric field is applied from the outside. In this specification, "a paraelectric substance" means a substance in which polarization occurs if an electric field is applied, and disappears if the electric field is removed. In this specification, "a high-k dielectric substance" means a substance in which relative dielectric constant is higher than that of silicon dioxide ($SiO_2$). In this specification, "a low-k dielectric substance" means a substance in which relative dielectric constant is lower than that of silicon dioxide ($SiO_2$). "A domain" means a region in which an orientation of the polarization of the ferroelectric substance is aligned. "A domain wall" means a boundary region between domains having different polarization directions from each other.

In this specification, "metal" is a general term for substances exhibiting metallic properties, and, it is assumed that, for example, metal nitrides exhibiting metallic properties are also included in the scope of "the metal".

First Embodiment

According to a first embodiment, a memory device includes a first conductive layer extending in a first direction, a second conductive layer extending in the first direction, a third conductive layer extending in a second direction intersecting with the first direction, an insulating layer provided between the first conductive layer and the second conductive layer, and a dielectric layer provided between the first conductive layer and the third conductive layer, and between the insulating layer and the third conductive layer, the dielectric layer having a first thickness thinner than a second thickness, the first thickness being a thickness between the first conductive layer and the third conductive layer, the second thickness being a thickness between the insulating layer and the third conductive layer, and the dielectric layer including an oxide including at least one of hafnium oxide and zirconium oxide.

The memory device in the first embodiment is a ferroelectric memory using a current flowing in a ferroelectric domain wall. If a predetermined condition is satisfied, a current flows in a domain wall being a boundary between domains having different polarization directions from each other. In this case, the current is generated by a mechanism different from a mechanism of a tunnel current, in which a current flows by a quantum mechanical tunnel effect caused when a film thickness of a material which is an insulating substance and in which a current does not flow is thin, for example, equal to or smaller than several of nm. In the mechanism for generating the above current, when polarization charges are provided in the domain wall, the current easily flows by doping of the polarization charges. This mechanism for generating the above current is different from the mechanism of a tunnel current in that the current flows even though the film thickness is thicker than several of nm. In the first embodiment, the ferroelectric memory controls a ferroelectric domain structure to control the amount of a current flowing between electrodes. In the first embodiment, the ferroelectric memory controls the amount of the current flowing between the electrodes to store data in a memory cell.

FIG. 1 is a block diagram illustrating a memory cell array and a peripheral circuit of the memory device according to the first embodiment. In a memory cell array 100 in FIG. 1, a region indicated by a dotted line indicates one memory cell MC.

An x-direction illustrated in FIG. 1 is defined as a first direction below, a y-direction is defined as a second direction below, and a z-direction is defined as a third direction below.

In the first embodiment, the memory cell array 100 of the memory device includes a plurality of word lines WL and a plurality of bit lines EL intersecting with the word line WL, through an insulating layer on a semiconductor substrate 10, for example. The word line WL is provided on a layer above the bit line EL, for example. A first control circuit 101, a second control circuit 102, and a sense circuit 103 are provided, as peripheral circuits, around the memory cell array 100.

A plurality of memory cells MC is provided in regions in which the word lines WL intersect with the bit lines BL. The memory device in the first embodiment is a ferroelectric memory having a cross-point structure. The memory cell MC is a two-terminal element.

Each of the plurality of word lines WL is connected to the first control circuit 101. Each of the plurality of bit lines BL is connected to the second control circuit 102. The sense circuit 103 is connected to the first control circuit 101 and the second control circuit 102.

The first control circuit 101 and the second control circuit 102 have, for example, functions of selecting a desired memory cell MC, writing data to the memory cell, reading data from the memory cell, and erasing data from the memory cell.

When data is read out, the data in the memory cell is read out in a form of the amount of a current flowing between the word line WL and the bit line FL. The sense circuit 103 has a function of determining the amount of the current and determining a polarity of the data. For example, the sense circuit 103 determines "0" or "1" of data. The sense circuit 103 determines the amount of the current flowing in the memory cell and determines the polarity of the data.

When data is written, the first control circuit 101 and the second control circuit 102 appropriately control the magnitude and an application time of a voltage pulse to be applied between the word line WL and the bit line BL and control the ferroelectric domain structure. From a viewpoint of forming the domain wall functioning as a current path in a ferroelectric substance, the application time of the voltage pulse applied between the word line WL and the bit line BL is preferably equal to or more than 10 ns and equal to or smaller than 200 ns.

The first control circuit 101, the second control circuit 102, and the sense circuit 103 are configured, for example, by electronic circuits using semiconductor devices formed on the semiconductor substrate 10.

FIGS. 2A to 2C are schematic diagrams illustrating a portion of the memory cell array in the memory device in the first embodiment. FIG. 2A is a top view, FIG. 2B is a sectional view taken along line AA' in FIG. 2A, and FIG. 2C is a sectional view taken along line BB' in FIG. 2A. For example, in FIGS. 2B and 2C, a region surrounded by a broken line indicates one memory cell MC.

Figure 3:
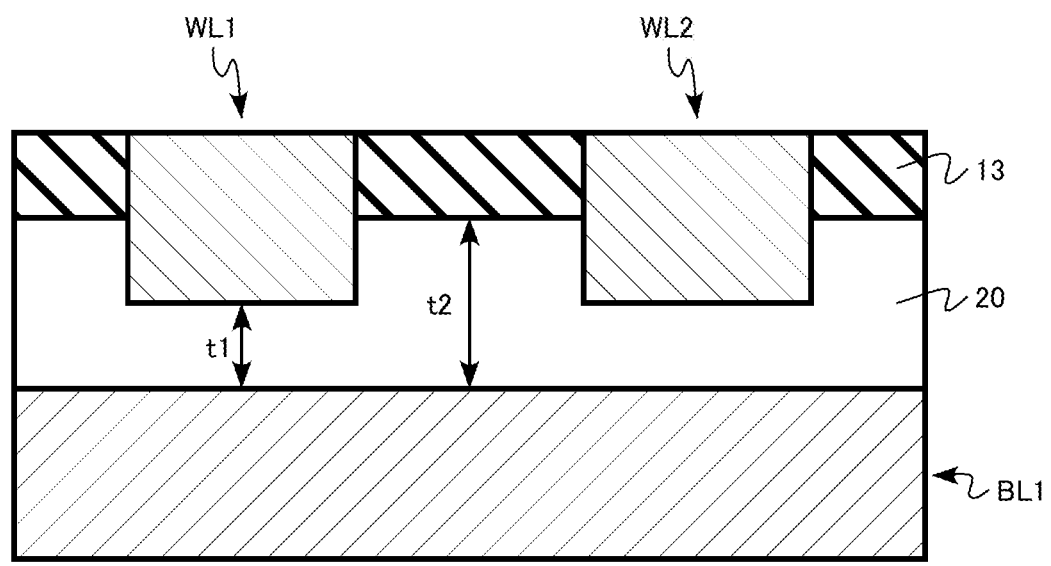
FIG. 3 is an enlarged sectional view schematically illustrating the portion of the memory cell array in the memory device in the first embodiment.

FIG. 3 is an enlarged sectional view schematically illustrating the portion of the memory cell array in the memory device in the first embodiment. FIG. 3 is an enlarged view of the portion in FIG. 2B.

The memory cell array 100 includes the semiconductor substrate 10, a word line WL1 (first conductive layer), a word line WL2 (second conductive layer), a word line WL3, a bit line BL1 (third conductive layer), a bit line BL2, a bit line BL3, a first interlayer insulating layer 11, a second interlayer insulating layer 12, a third interlayer insulating layer 13 (insulating layer), and a dielectric layer 20. The word line WL1 (first conductive layer), the word line WL2 (second conductive layer), and the word line WL3 may be collectively and simply described as the word line WL below. The bit line BL1 (third conductive layer), the bit line BL2, and the bit line BL3 may be collectively and simply described as the bit line BL.

The word line WL1 is an example of the first conductive layer. The word line WL2 is an example of the second conductive layer. The bit line BL1 is an example of the third conductive layer.

The word line WL extends in the x-direction (first direction). The word line WL includes metal, for example. The word line WL contains metal having high heat resistance, for example. The word line WL contains, for example, titanium nitride (TiN), tungsten nitride (WN), tantalum nitride (TaN), tungsten (W), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt). The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The bit line BL extends in the y-direction (second direction). The y-direction (second direction) intersects with the x-direction. The y-direction (second direction) is, for example, perpendicular to the x-direction. For example, the bit line BL includes metal. For example, the bit line FL includes metal having high heat resistance. The bit line BL contains, for example, tungsten (N), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt). The bit line BL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The word line WL and the bit line BL include the same material, for example. All of the word line WL and the bit line BL include titanium nitride, for example.

The semiconductor substrate 10 is a silicon substrate, for example.

The first interlayer insulating layer 11 is provided on the semiconductor substrate 10. The first interlayer insulating layer 11 is provided between the semiconductor substrate 10 and the word line WL. The first interlayer insulating layer 11 includes silicon oxide, for example.

The second interlayer insulating layer 12 is provided between the bit line BL and the bit line BL. The second interlayer insulating layer 12 includes silicon oxide, for example. The second interlayer insulating layer 12 includes low-k dielectric substances, for example, paraelectric substance of silicon, carbon, oxygen composition, or substance of porous silicon oxides. Using low-k dielectric substance to the second interlayer insulating layer 12 has a merit of lower voltage driving because the electric field applied on dielectric layer 20 becomes stronger at the same driving voltages.

The third interlayer insulating layer 13 is provided between the word line WL and the word line. The third interlayer insulating layer 13 is an example of the insulating layer. The third interlayer insulating layer 13 includes silicon oxide, for example. The third interlayer insulating layer 13 includes low-k dielectric substances, for example, paraelectric substance of silicon, carbon, oxygen composition, or substance of porous silicon oxides. Using low-k dielectric substance to the third interlayer insulating layer 13 has a merit of lower voltage driving because the electric field applied on dielectric layer 20 becomes stronger at the same driving voltages.

The dielectric layer 20 is provided between the word line WL and the bit line BL. The dielectric layer 20 is provided between the word line (first conductive layer) WL1 and the bit line (third conductive layer) BL1. The dielectric layer 20 is provided between the third interlayer insulating layer (insulating layer) 13 and the bit line (third conductive layer) BL1.

The first thickness (t1 in FIG. 3) of the dielectric layer 20 between the word line WL1 (first conductive layer) and the bit line BL1 (third conductive layer) is thinner than the second thickness (t2 in FIG. 3) of the dielectric layer 20 between the third interlayer insulating layer 13 (insulating layer) and the bit line BL1 (third conductive layer).

The first thickness t1 of the dielectric layer 20 is, for example, equal to or more than 3 nm and equal to or smaller than 20 nm. The second thickness t2 of the dielectric layer 20 is, for example, equal to or more than 5 nm and equal to or smaller than 40 nm. A difference between the first thickness t1 and the second thickness t2 is, for example, equal to or more than 2 nm and equal to or smaller than 20 nm.

The second thickness t2 is, for example, equal to or more than 1.1 times the first thickness t1 and equal to or smaller than 3 times the first thickness t1.

A corner of an end portion of the word line WL on the bit line BL side is covered by the dielectric layer 20. An end portion of the word line WL on the bit line BL side is buried in the dielectric layer 20.

The dielectric layer 20 includes a ferroelectric substance. The dielectric layer 20 includes an oxide which includes at least one of hafnium oxide and zirconium oxide. The oxide in the dielectric layer 20 is a ferroelectric substance. The oxide in the dielectric layer 20 mainly has at least one of orthorhombic crystal and trigonal crystal. The oxide in the dielectric layer 20 includes crystal of at least one of an orthorhombic crystal system and a trigonal crystal system.

The oxide in the dielectric layer 20 is, for example, hafnium oxide being a ferroelectric substance. The dielectric layer 20 includes, for example, hafnium oxide as the main component. The phrase "including hafnium oxide as the main component" means that a molar ratio of hafnium oxide is the highest among substances in the dielectric layer 20. The molar ratio of hafnium oxide is equal to or more than 90%, for example.

The oxide in the dielectric layer 20 is, for example, zirconium oxide being a ferroelectric substance. The dielectric layer 20 includes, for example, zirconium oxide as the main component. The phrase "including zirconium oxide as the main component" means that a molar ratio of zirconium oxide is the highest among the substances in the dielectric layer 20.

The molar ratio of zirconium oxide in the dielectric layer 20 is equal to or more than 40% and equal to or less than 60%, for example. The oxide in the dielectric layer 20 is, for example, mixed crystal of hafnium oxide being the ferroelectric substance and zirconium oxide being the ferroelectric substance.

The oxide in the dielectric layer 20 includes, for example, at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), germanium (Ge), and barium (Ba). In a case where the oxide is hafnium oxide, if the oxide includes the additive element, hafnium oxide is caused to easily exhibit ferroelectricity.

From a viewpoint of causing hafnium oxide to exhibit ferroelectricity, the concentration of the additive element is preferably equal to or more than 0.1 atomic % and equal to or less than 60 atomic %. An appropriate range of the concentration of the additive element for causing hafnium oxide to exhibit ferroelectricity varies depending on the type of additive element. For example, in a case where the additive element is silicon (Si) or trivalent elements of above elements for example aluminum (Al), the appropriate range of the concentration of the additive element for causing hafnium oxide to exhibit ferroelectricity is equal to or more than 3 atomic % and equal to or less than 7 atomic %. For example, in a case where the additive element is barium (Ba), the appropriate range of the concentration of the additive element for causing hafnium oxide to exhibit ferroelectricity is equal to or more than 0.1 atomic % and equal to or less than 3 atomic %. For example, in a case where the additive element is germanium (Ge), the appropriate range of the concentration of the additive element for causing hafnium oxide to exhibit ferroelectricity is equal to or more than 5 atomic % and equal to or less than 11 atomic %. For example, in a case where the additive element is zirconium (Zr), the appropriate range of the concentration of the additive element for causing hafnium oxide to exhibit ferroelectricity is equal to or more than 10 atomic % and equal to or less than 60 atomic %.

The oxide in the dielectric layer 20 includes crystal of the orthorhombic crystal system. The oxide in the dielectric layer 20 is, for example, hafnium oxide mainly including hafnium oxide of the orthorhombic crystal system. Hafnium oxide is, for example, hafnium oxide mainly including the third orthorhombic crystal system (Orthorhombic III, space group Pbc2$_1$, space group number 29). Hafnium oxide of the third orthorhombic crystal system has ferroelectricity. Even though hafnium oxide of the trigonal crystal system (trigonal, space group R3m, or P3, or R3, space group number 160, or 143, or 146) is provided, this hafnium oxide may be used because this hafnium oxide has ferroelectricity.

The oxide in the dielectric layer 20 is, for example, zirconium oxide mainly including zirconium oxide of the orthorhombic crystal system. Zirconium oxide is, for example, zirconium oxide mainly including the third orthorhombic crystal system (Orthorhombic III, space group $Pbc2_1$, space group number 29). Zirconium oxide of the orthorhombic crystal system has ferroelectricity. Even though zirconium oxide mainly including zirconium oxide having a crystal structure of the trigonal crystal system (trigonal, space group R3m, or P3, or R3, space group number 160, or 143, or 146) is provided, this zirconium oxide may be used because this zirconium oxide has ferroelectricity.

Next, an example of a manufacturing method of the memory device according to the first embodiment will be described.

FIGS. 4A to 9C are schematic diagrams illustrating the manufacturing method of the memory device in the first embodiment. FIGS. 4A, 5A, 6A, 7A, 8A, and 9A are top views corresponding to FIG. 2A. FIGS. 4B, 5B, 6B, 7B, 8B, and 9B are sectional views corresponding to FIG. 2B. FIGS. 4C, 5C, 6C, 7C, 8C, and 9C are sectional views corresponding to FIG. 2C.

Firstly, a first silicon oxide film 51 is formed on a semiconductor substrate 10. The first silicon oxide film 51 finally becomes a first interlayer insulating layer 11. The first silicon oxide film 51 is formed, for example, by a chemical vapor deposition method (CVD method).

Then, a first titanium nitride film 61 is formed on the first silicon oxide film 51 (FIGS. 4A to 4C). A portion of the first titanium nitride film 61 finally becomes a bit line BL. The first titanium nitride film 61 is formed, for example, by the CVD method.

Then, the first titanium nitride film 61 is patterned in a stripe shape extending in the y-direction (FIGS. 5A to 5C). The first titanium nitride film 61 is patterned, for example, by a known lithographic method and a known reactive ion etching method (RIE method).

Then, a second silicon oxide film 52 is formed between the patterned first titanium nitride films 61 (FIGS. 6A to 6C). The second silicon oxide film 52 finally becomes a second interlayer insulating layer 12. The second silicon oxide film 52 is formed, for example, by film deposition by the CVD method and planarization by a chemical mechanical polishing method (CMP method).

Then, a hafnium oxide film 70 and a third silicon oxide film 53 are formed on the first titanium nitride film 61 and the second silicon oxide film 52 (FIGS. 7A to 7C). A portion of the hafnium oxide film 70 finally becomes a portion of a dielectric layer 20. The hafnium oxide film 70 includes, for example, silicon (Si) as an additive element. The third silicon oxide film 53 finally becomes a third interlayer insulating layer 13.

The hafnium oxide film 70 is formed, for example, by an atomic layer deposition method (ALD method). The hafnium oxide film 70 is amorphous immediately after the hafnium oxide film is formed. The third silicon oxide film 53 is formed, for example, by the CVD method.

Then, a stripe-like groove 72 reaching the hafnium oxide film 70 from the surface of the third silicon oxide film 53 is formed (FIGS. 8A to 8C). The groove 72 is formed, for example, by the known lithographic method and the known RIE method.

Then, the groove 72 is filled with a second titanium nitride film 62 (FIGS. 9A to 9C). The second titanium nitride film 62 finally becomes a word line WL. The second titanium nitride film 62 is formed, for example, by the CVD method.

Then, heat treatment is performed to crystallize the hafnium oxide film 70. The heat treatment is performed, for example, in a nitrogen gas atmosphere at a temperature which is equal to or higher than 600° C. and equal to or lower than 1050° C., for a period of 1 microsecond or more and 30 seconds or less. The heat treatment is so-called crystallization annealing.

With the heat treatment, the hafnium oxide film 70 is crystallized to have at least one of orthorhombic crystal and trigonal crystal. With the heat treatment, the hafnium oxide film 70 becomes a ferroelectric film.

With the above-described manufacturing method, the memory device illustrated in FIGS. 2A to 2C according to the first embodiment is manufactured.

Next, an operation principle of the ferroelectric memory in the first embodiment will be described. The ferroelectric memory in the first embodiment uses the current flowing in the ferroelectric domain wall. The domain wall is a boundary between the domains having different polarization directions from each other. If a predetermined condition is satisfied, a current flows in the domain wall.

In the first embodiment, the ferroelectric memory controls a ferroelectric domain structure to control the amount of a current flowing between electrodes. In the first embodiment, the ferroelectric memory controls the amount of the current flowing between the electrodes to store data in a memory cell.

FIGS. 10A to 11B are diagrams illustrating the operation principle of the memory device in the first embodiment. FIGS. 10A to 11B are diagrams corresponding to FIG. 3.

Figure 10A:
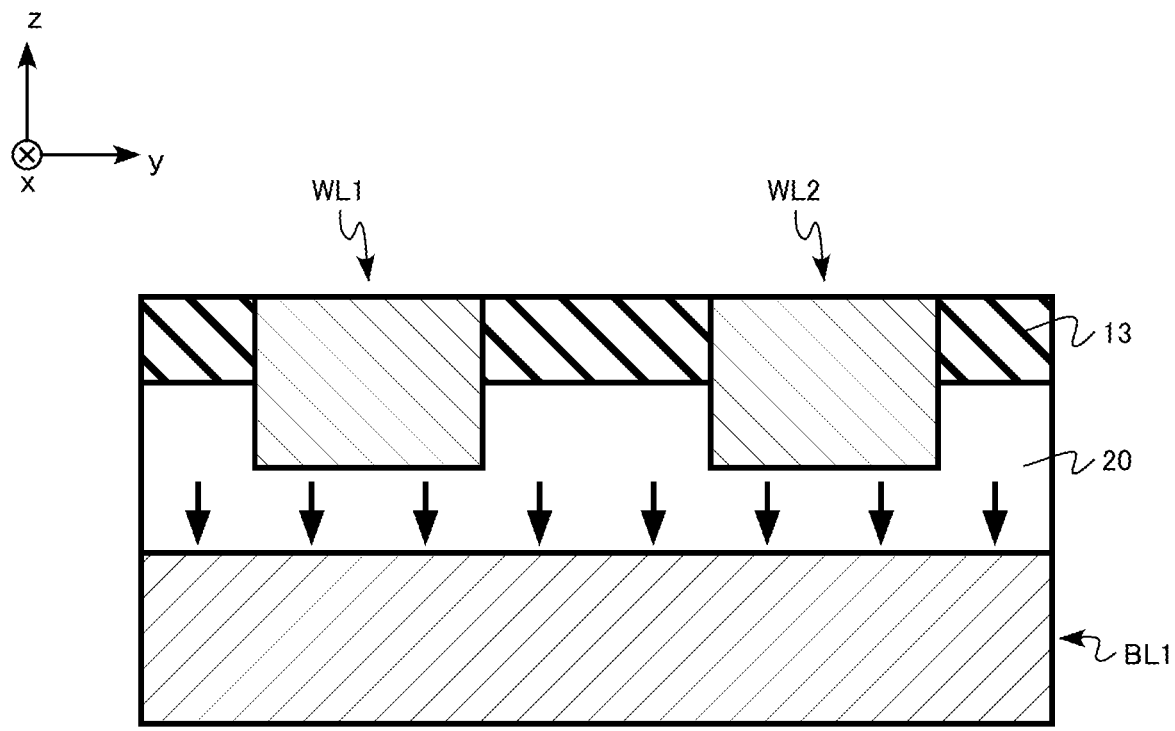
FIGS. 10A and 10B are diagrams illustrating an operation principle of the memory device in the first embodiment.
Figure 11A:
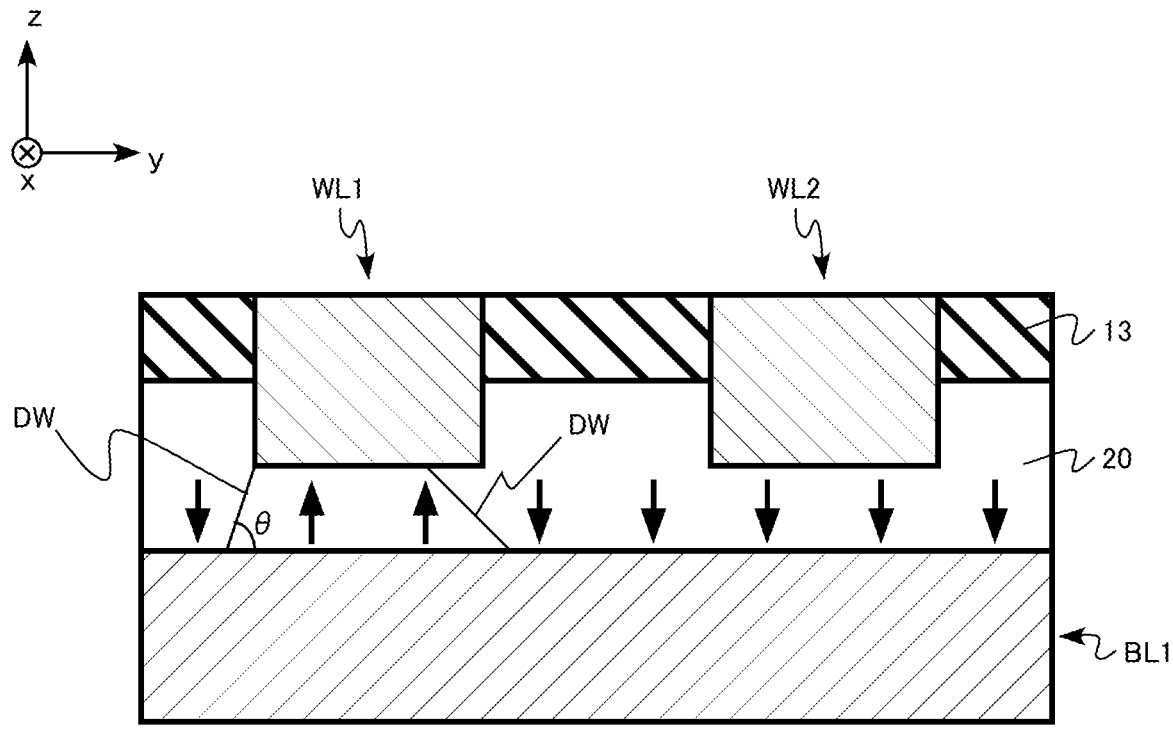
FIGS. 11A and 11B are diagrams illustrating the operation principle of the memory device in the first embodiment.

FIG. 10A illustrates a high resistance state where a current has difficulty in flowing between the word line WL and the bit line EL of the memory cell MC. FIG. 11A illustrates a low resistance state where a current easily flows between the word line WL and the bit line EL of the memory cell MC. If the high resistance state is defined to be data "0", and the low resistance state is defined to be data "1", the memory cell MC may store 1-bit data of "0" or "1".

In the high resistance state illustrated in FIG. 10A, polarization of the dielectric layer 20 including the ferroelectric substance is aligned in one direction. An arrow in FIG. 10A indicates a polarization direction. In other words, domains having different polarization directions are not formed in the dielectric layer 20. In this state, basically no current flows between the word line WL and the bit line BL.

In the low resistance state illustrated in FIG. 11A, domains having different polarization directions are formed in the dielectric layer 20 being the ferroelectric substance. A domain wall (DW in FIG. 11A) is formed between the word line WL and the bit line BL. If a predetermined condition is satisfied, a current flows in the domain wall DW. The domain wall DW acts as a current path.

The predetermined condition means, for example, a case where an angle (θ in FIG. 11A) formed by the domain wall DW and an interface between the bit line BL and the dielectric layer 20 is equal to or smaller than 89 degrees. In the low resistance state, a current flows between the word line WL and the bit line BL through the domain wall DW. When the domain wall angle θ is greater than 89 degrees, a sufficient amount of polarization charges is not induced in the domain wall. Thus, the amount of charges doping to the domain wall becomes insufficient, and a domain wall having electric conductivity required for a cell operation is not obtained.

As illustrated in FIG. 10E, an orientation of spontaneous polarization may be shifted from a direction of the shortest distance from the word line WL to the bit line BL. Even in a case, it is preferable that the orientations of spontaneous polarization of the adjacent domains differ by 180 degrees. In a case of a ferroelectric substance which is used in the memory device in the first embodiment and mainly includes hafnium oxide or zirconium oxide, regarding a section in which the orientation of spontaneous polarization is the same, a boundary region when orientations of spontaneous polarization of sections adjacent to each other have an angle other than 180 degrees is not the domain wall (that is, domain), but a grain wall (that is, a grain boundary of microcrystals). The grain wall is essentially different from the domain wall in that a crystal axis itself of the ferroelectric substance is shifted. In a case of the ferroelectric substance which is used in the memory device in the first embodiment and mainly includes hafnium oxide or zirconium oxide, carriers are localized in the grain wall portion. Thus, it is difficult to cause modulation of electrical conductivity as used in the memory device in the first embodiment. Even though the grain wall is provided, it is difficult to apply an essential influence to an operation of the memory device in the first embodiment.

In a perovskite type ferroelectric substance, even in a case where the orientations of spontaneous polarization of the domains adjacent to each other, as used in the memory device in the first embodiment, have an angle other than 180 degrees, it is possible to obtain not the grain wall, but the domain wall by symmetry of the crystal. However, when a domain wall having an angle other than 180 degrees is used in such ferroelectric crystal having a domain wall having an angle other than 180 degrees, distortion is applied to the vicinity of the ferroelectric substance in the memory element during writing and erasing, due to the physical principle. That causes crack of device or impossibility of domain inversion. Thus, this is not preferable.

Figure 11B:
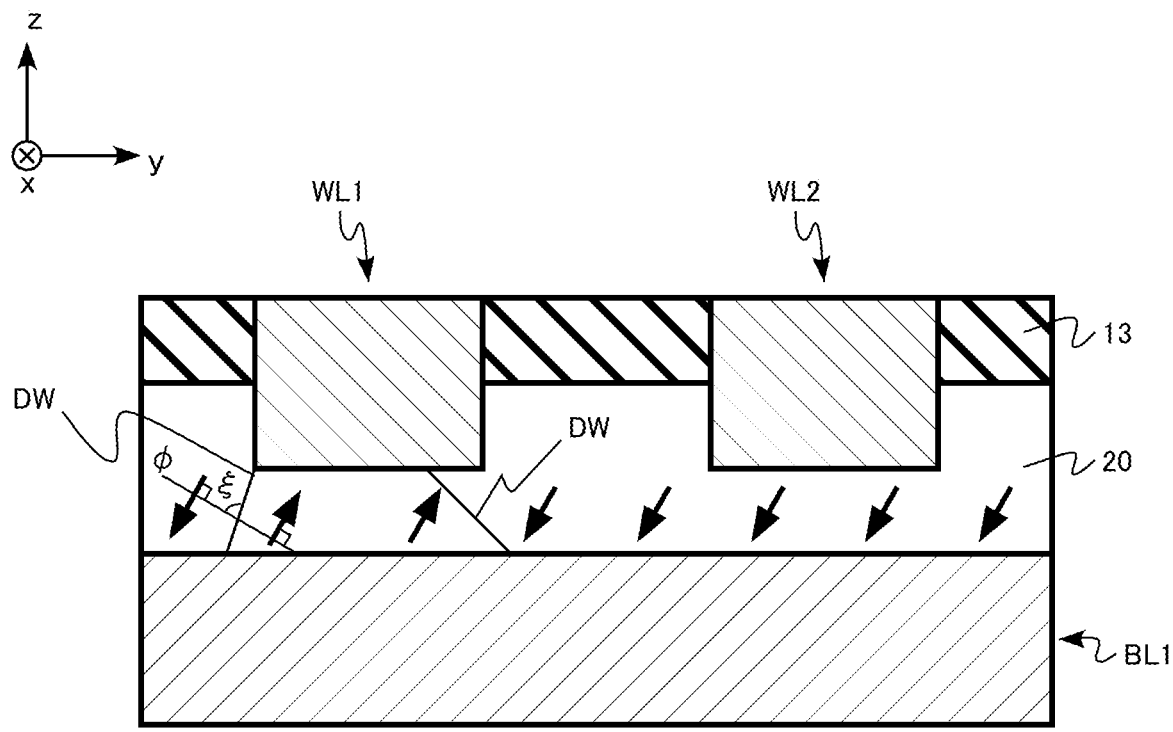

As illustrated in FIG. 11B, in a case where the orientation of spontaneous polarization is shifted from the direction of the shortest distance from the word line WL to the bit line BL, an angle $\xi$ (xi) formed by the domain wall DW and a plane $\varphi$ perpendicular to the orientation of the polarization in the domain may be equal to or smaller than 89 degrees. The angle $\xi$(xi) ($\xi$xi) in FIG. 11B) in this case is essentially equal to the angle ($\theta$ in FIG. 11A) of the interface between the bit line BL and the dielectric layer 20 to the domain wall DW when the orientation of spontaneous polarization coincides with the direction of the shortest distance from the word line WL to the bit line BL. The reason is that, when the orientation of spontaneous polarization coincides with the direction of the shortest distance from the word line WL to the bit line BL, the plane $\varphi$ perpendicular to the orientation of the polarization in the domain is a plane spreading in xy directions in FIG. 11A.

In order to achieve a stable low resistance state, when transition from the high resistance state to the low resistance state is performed, it is preferable that the amplitude of the voltage pulse applied between the word line WL and the bit line BL, and the application time are appropriately controlled. With the appropriate control, the domains having different polarization directions are maintained in the dielectric layer 20, and the angle $\xi$(xi) formed by the domain wall DW and the plane p perpendicular to the orientation of polarization is secured to be equal to or smaller than 89 degrees. From the above viewpoint, the application time of the voltage pulse applied between the word line WL and the bit line BL is preferably equal to or more than 10 ns and equal to or smaller than 200 ns, for example.

From a viewpoint of suppressing an occurrence of cell interference by extending the domain wall DW to the adjacent memory cell MC, the angle $\theta$ formed by the domain wall DW and the interface between the bit line BL and the dielectric layer 20 is preferably controlled to be equal to or larger than 20 degrees.

The function and effect of the memory device in the first embodiment will be described below.

Figure 10B:
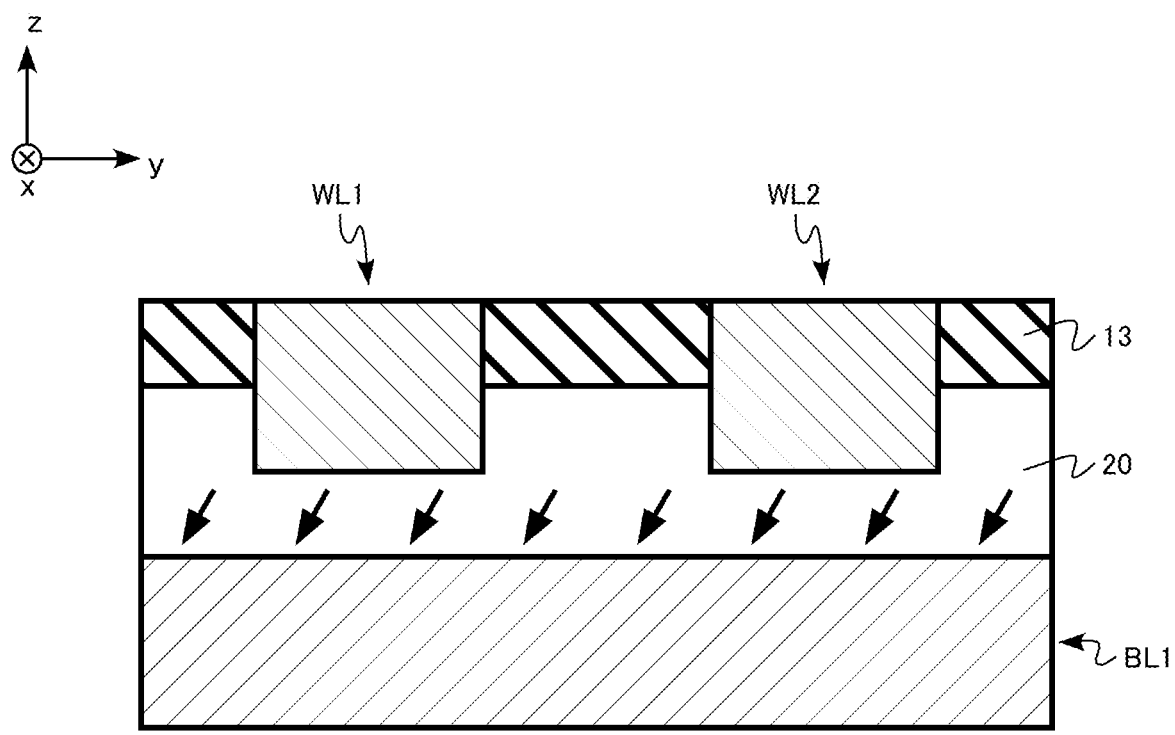
Figure 12:
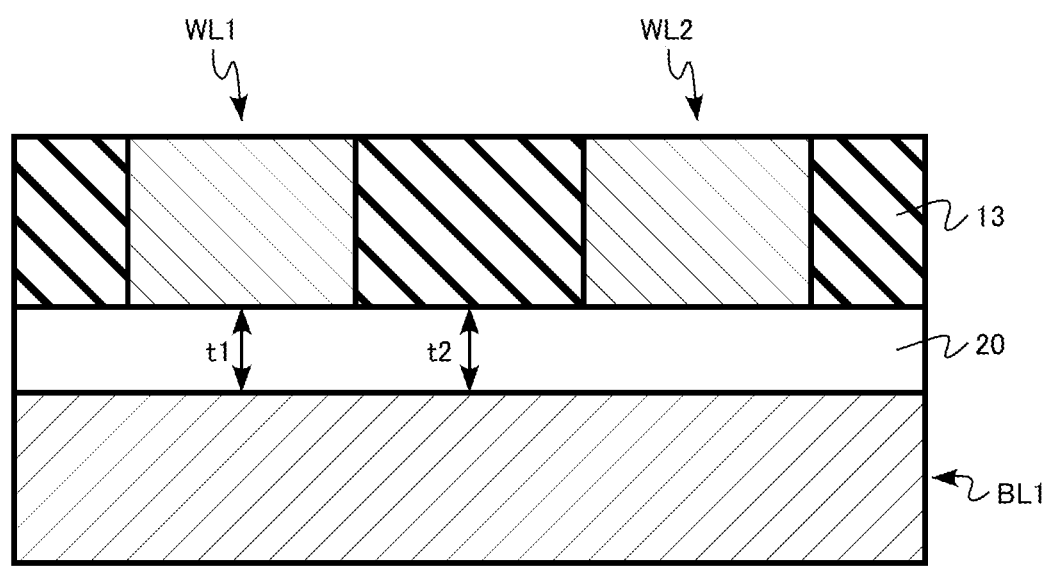
FIG. 12 is a diagram for a function and effect of the memory device in the first embodiment.
Figure 14:
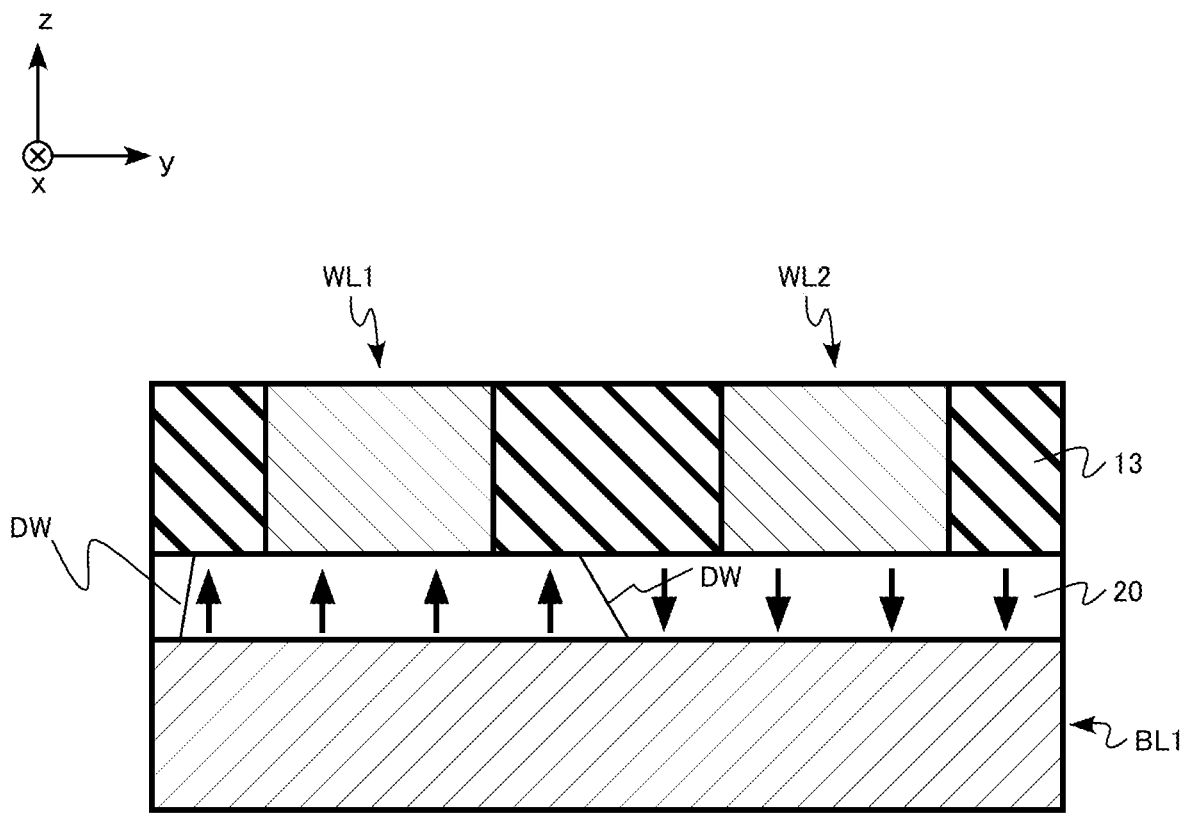
FIG. 14 is a diagram for the function and effect of the memory device in the first embodiment.

FIGS. 12 to 14 are diagrams for the function and effect of the memory device in the first embodiment. FIGS. 12 to 14 are enlarged sectional views schematically illustrating a memory cell array of a ferroelectric memory in a comparative example. FIG. 13 is a diagram corresponding to FIG. 10 illustrating the high resistance state. FIG. 14 is a diagram corresponding to FIG. 11 illustrating the low resistance state.

The ferroelectric memory in the comparative example is different from the ferroelectric memory in the first embodiment in that the first thickness (t1 in FIG. 12) of the dielectric layer 20 between the word line WL1 (first conductive layer) and the bit line BL1 (third conductive layer) is equal to the second thickness (t2 in FIG. 12) of the dielectric layer 20 between the third interlayer insulating layer 13 (insulating layer) and the bit line BL1 (third conductive layer). In the ferroelectric memory in the comparative example, the thickness of the dielectric layer 20 is uniform.

In the state illustrated in FIG. 13, domains having different polarization directions are not formed in the dielectric layer 20. Thus, basically no current flows between the word line WL and the bit line BL. FIG. 13 illustrates the high resistance state.

The state illustrated in FIG. 14 is a state where a voltage is applied between the word line WL and the bit line BL from the high resistance state, so as to form domains having different polarization directions. In FIG. 14, since the domain wall DW is not in contact with the word line WL, a current does not flow between the word line WL and the bit line BL.

In the ferroelectric memory in the comparative example, the thickness of the dielectric layer 20 is uniform. Thus, it is difficult to stably form the domain wall DW acting as a current path between the word line WL and the bit line BL.

In the ferroelectric memory in the first embodiment, the first thickness (t1 in FIG. 3) of the dielectric layer 20 between the word line WL1 (first conductive layer) and the bit line BL1 (third conductive layer) is thinner than the second thickness (t2 in FIG. 3) of the dielectric layer 20 between the third interlayer insulating layer 13 (insulating layer) and the bit line BL1 (third conductive layer). Thus, the corner of the end portion of the word line WL on the bit line BL side is covered by the dielectric layer 20. In other words, the end portion of the word line WL on the bit line BL side is buried in the dielectric layer 20.

It is possible to stably form the domain wall DW between the word line WL and the bit line BL by the structure in the vicinity of the corner of the end portion of the word line WL. The reason is that the domain wall DW is easily formed using the corner of the end portion of the word line WL as a start point. In addition, this is because that, even though the formed domain wall DW moves, the domain wall DW is easily pinned at the corners of the end portion of the word line WL.

In the ferroelectric memory in the first embodiment, it is possible to stably form the domain wall DW between the word line WL and the bit line BL. Thus, it is possible to stably transition the state of the memory cell MC from the high resistance state to the low resistance state. That is, a write operation of data '1' is stably performed. Accordingly, the stable operation of the memory cell MC is possible.

The first thickness t1 of the dielectric layer 20 is, preferably, equal to or more than 3 nm and equal to or smaller than 20 nm. If the first thickness t1 is greater than the lower limit value, it is possible to suppress a leakage current flowing between the word line WL and the bit line BL. If the first thickness t1 is smaller than the upper limit value, the current of the memory cell MC in the low resistance state increases, and thus the margin of a read operation of data "1" increases.

A difference between the first thickness t1 and the second thickness t2 is, preferably, equal to or more than 2 nm and equal to or smaller than 20 nm. If the difference satisfies the above range, stability of forming the domain wall DW is improved.

Figure 15:
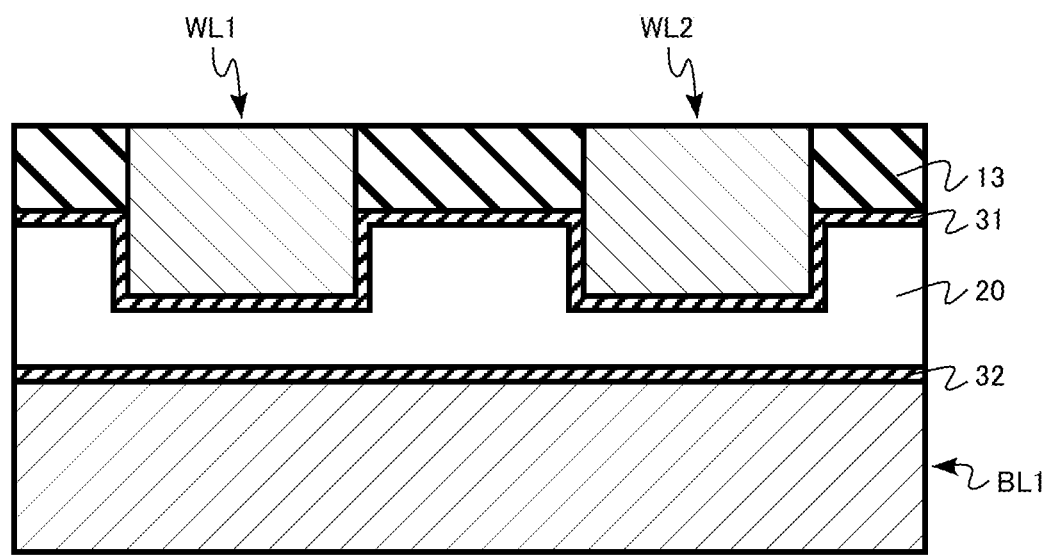
FIG. 15 is an enlarged sectional view schematically illustrating the portion of a memory cell array in a memory device according to a modification example of the first embodiment.

FIG. 15 is an enlarged sectional view schematically illustrating the portion of a memory cell array in a memory device according to a modification example of the first embodiment. FIG. 15 is a sectional view corresponding to FIG. 3.

The memory device in the modification example of the first embodiment is a ferroelectric memory using a current flowing in a ferroelectric domain wall. The ferroelectric memory in the modification example is different from the ferroelectric memory in the first embodiment in that the ferroelectric memory in the modification example includes a first switching layer and a second switching layer. The first switching layer is provided in one of a position between the dielectric layer and the first conductive layer and a position between the dielectric layer and the third conductive layer. The second switching layer is provided in the other of the position between the dielectric layer and the first conductive layer and the position between the dielectric layer and the third conductive layer and includes the same material as the material of the first switching layer.

A first switching layer 31 is provided between the dielectric layer 20 and the word line WL. The first switching layer 31 is provided between the dielectric layer 20 and the word line WL1 (first conductive layer).

The first switching layer 31 has non-linear current-voltage characteristics in which the current sharply rises at a specific voltage (threshold voltage). The first switching layer 31 has a function of suppressing the leakage current which flows in the not-selected memory cell MC and flows between the word line WL and the bit line BL. The first switching layer 31 is a so-called selector film.

The first switching layer 31 includes, for example, tellurium (Te), aluminum (Al), and at least any one element of silicon (Si) and germanium (Ge). The first switching layer 31 may include an oxide, an oxynitride, or a chalcogenide. The first switching layer 31 is not limited to a single film, and may be a stacked film. What kind of switching material and structure are used can be optimized in accordance with the material, film thickness, a writing speed during use, and the like of the ferroelectric domain wall memory.

A second switching layer 32 is provided between the dielectric layer 20 and the bit line BL. The second switching layer 32 is provided between the dielectric layer 20 and the bit line BL1 (third conductive layer).

The second switching layer 32 has non-linear current-voltage characteristics in which the current sharply rises at a specific voltage (threshold voltage). The second switching layer 32 has a function of suppressing the leakage current which flows in the not-selected memory cell MC and flows between the word line WL and the bit line BL. The second switching layer 32 is a so-called selector film.

The second switching layer 32 includes, for example, tellurium (Te), aluminum (Al), and at least any one element of silicon (Si) and germanium (Ge). The second switching layer 32 may include an oxide, an oxynitride, or a chalcogenide. The second switching layer 32 is not limited to a single film, and may be a stacked film. What kind of switching material and structure are used can be optimized in accordance with the material, film thickness, a writing speed during use, and the like of the ferroelectric domain wall memory.

An erroneous operation of the memory cell MC is suppressed by providing the first switching layer 31 and the second switching layer 32. In addition, power consumption of the ferroelectric memory is reduced.

The second switching layer 32 has the same material as the material of the first switching layer 31, for example. Since the material of the first switching layer 31 is the same as the material of the second switching layer 32, the stability of forming the domain wall DW is improved.

A configuration in which only one of the first switching layer 31 and the second switching layer 32 is provided may be made. The material of the first switching layer 31 may be set to be different from the material of the second switching layer 32. It is not necessary that the first switching layer 31 or the second switching layer 32 is provided on the entire surface of the dielectric layer 20. The first switching layer 31 or the second switching layer 32 may be provided only at a portion of the dielectric layer 20, which is in contact with the word line.

As described above, according to the memory device in the first embodiment, the stable operation of the memory cell is possible. Thus, according to the memory device in the first embodiment, it is possible to realize a memory device having high reliability and large capacity.

Second Embodiment

A memory device according to a second embodiment is different from the memory device in the first embodiment in that a memory cell array includes a three-dimensional structure. Descriptions of some contents overlapping those in the first embodiment may be omitted.

The memory device in the second embodiment is a ferroelectric memory using a current flowing in a ferroelectric domain wall.

Figure 16:
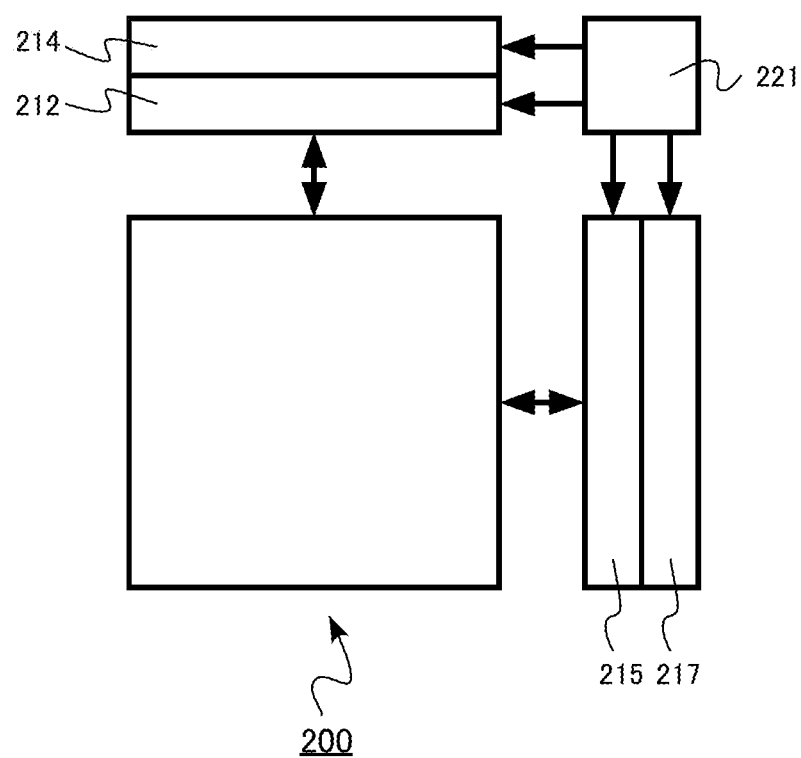
FIG. 16 is a block diagram illustrating a memory device according to a second embodiment.
Figure 17:
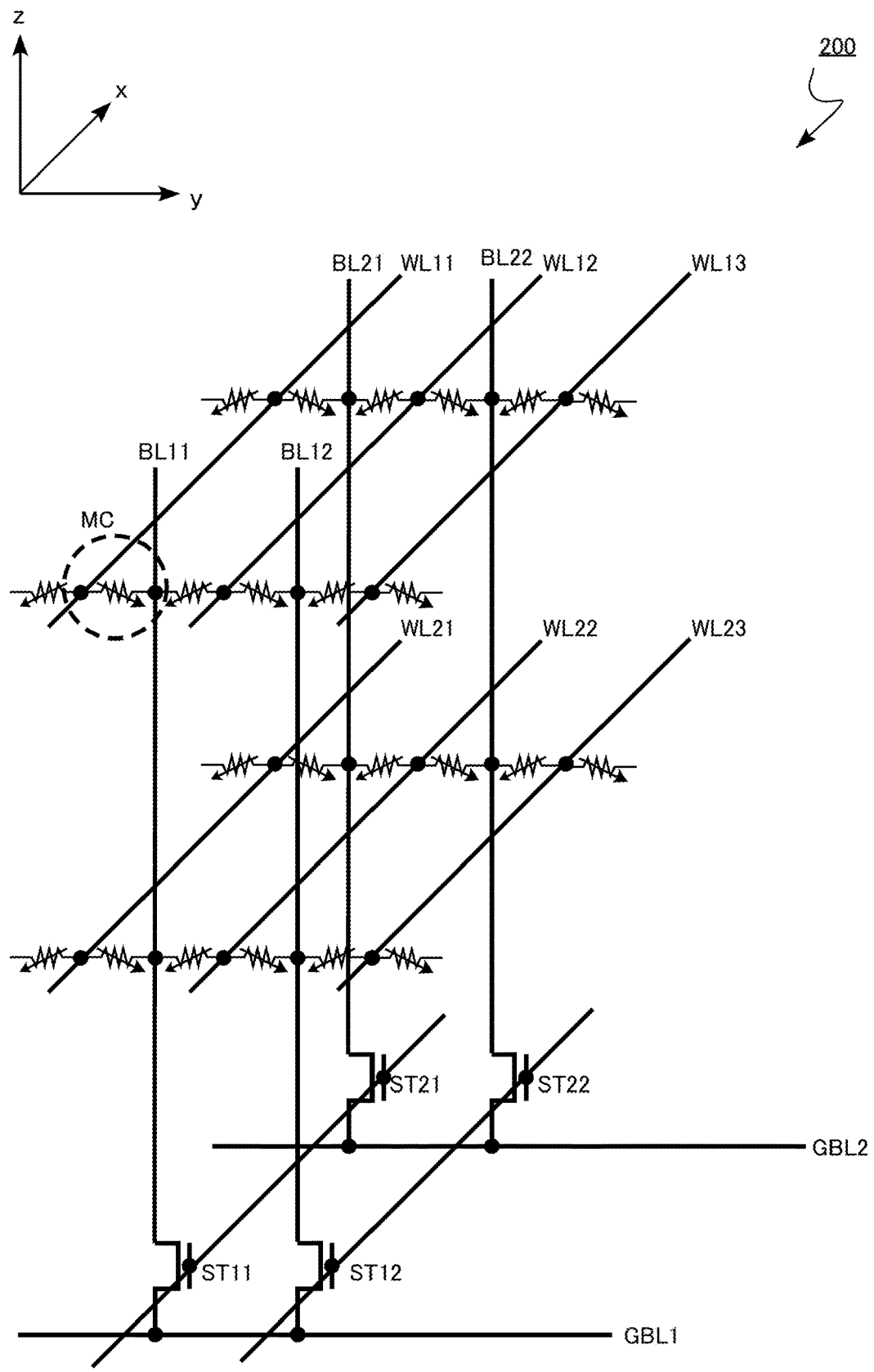
FIG. 17 is an equivalent circuit diagram illustrating a memory cell array of the memory device in the second embodiment.

FIG. 16 is a block diagram illustrating the memory device in the second embodiment. FIG. 17 is an equivalent circuit diagram illustrating the memory cell array of the memory device in the second embodiment. FIG. 17 schematically illustrating a wiring structure in the memory cell array. A memory cell array 200 in the second embodiment includes a three-dimensional structure in which memory cells MC are three-dimensionally arranged.

As illustrated in FIG. 16, the memory device includes a memory cell array 200, a word line driver circuit 212, a row decoder circuit 214, a sense amplifier circuit 215, a column decoder circuit 217, and a control circuit 221.

As illustrated in FIG. 17, a plurality of memory cells MC is three-dimensionally arranged in the memory cell array 200. In FIG. 17, a region surrounded by a dotted line corresponds to one memory cell MC.

The x-direction illustrated in FIG. 16 is defined as the first direction below, the y-direction is defined as the third direction below, and the z-direction is defined as the second direction below.

The memory cell array 200 includes, for example, a plurality of word lines WL (WL11, WL12, WL13, WL21, WL22, and WL23) and a plurality of bit lines EL (BL11, BL12, BL21, and BL22). The word line WL extends in the x-direction. The bit line EL extends in the z-direction. The word line WL and the bit line BL vertically intersect with each other. The memory cells MC are disposed at intersection portions between the word lines WL and the bit lines BL.

The plurality of word lines WL is electrically connected to the row decoder circuit 214. The plurality of bit lines BL is connected to the sense amplifier circuit 215. Select transistors ST (ST11, ST21, ST12, and ST22) and global bit lines GBL (GBL1 and GBL2) are provided between the plurality of bit lines BL and the sense amplifier circuit 215.

The row decoder circuit 214 has a function of selecting a word line WL in accordance with an input row address signal. The word line driver circuit 212 has a function of applying a predetermined voltage to the word line WL selected by the row decoder circuit 214.

The column decoder circuit 217 has a function of selecting a bit line BL in accordance with an input column address signal. The sense amplifier circuit 215 has a function of applying a predetermined voltage to the bit line BL selected by the column decoder circuit 217. The sense amplifier circuit 215 has a function of detecting and amplifying a current flowing between the selected word line WL and the selected bit line EL.

The control circuit 221 has a function of controlling the word line driver circuit 212, the row decoder circuit 214, the sense amplifier circuit 215, the column decoder circuit 217, and other circuits (not illustrated).

The circuits such as the word line driver circuit 212, the row decoder circuit 214, the sense amplifier circuit 215, the column decoder circuit 217, and the control circuit 221 are configured, for example, by transistors and wiring layers using semiconductor layers (not illustrated).

Figure 18A:
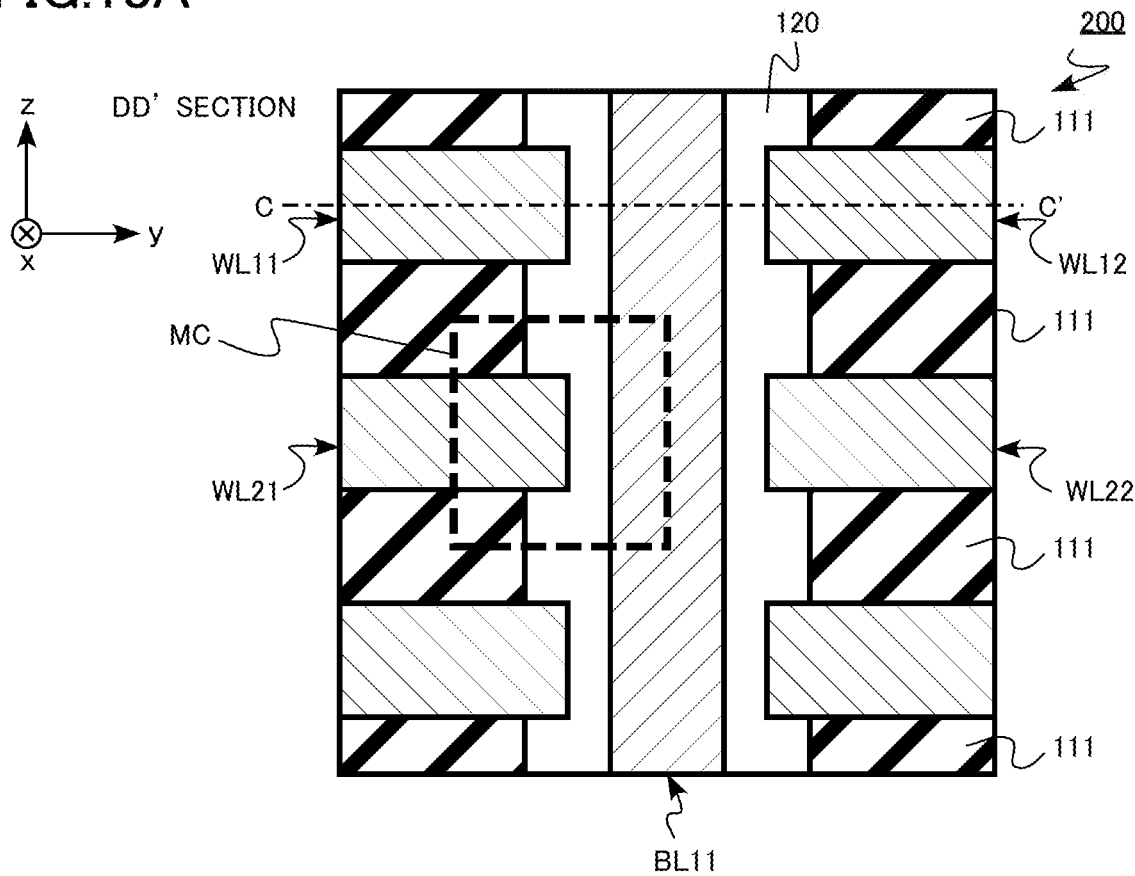
FIGS. 18A and 18B are schematic diagrams illustrating a portion of the memory cell array in the memory device in the second embodiment.
Figure 18B:
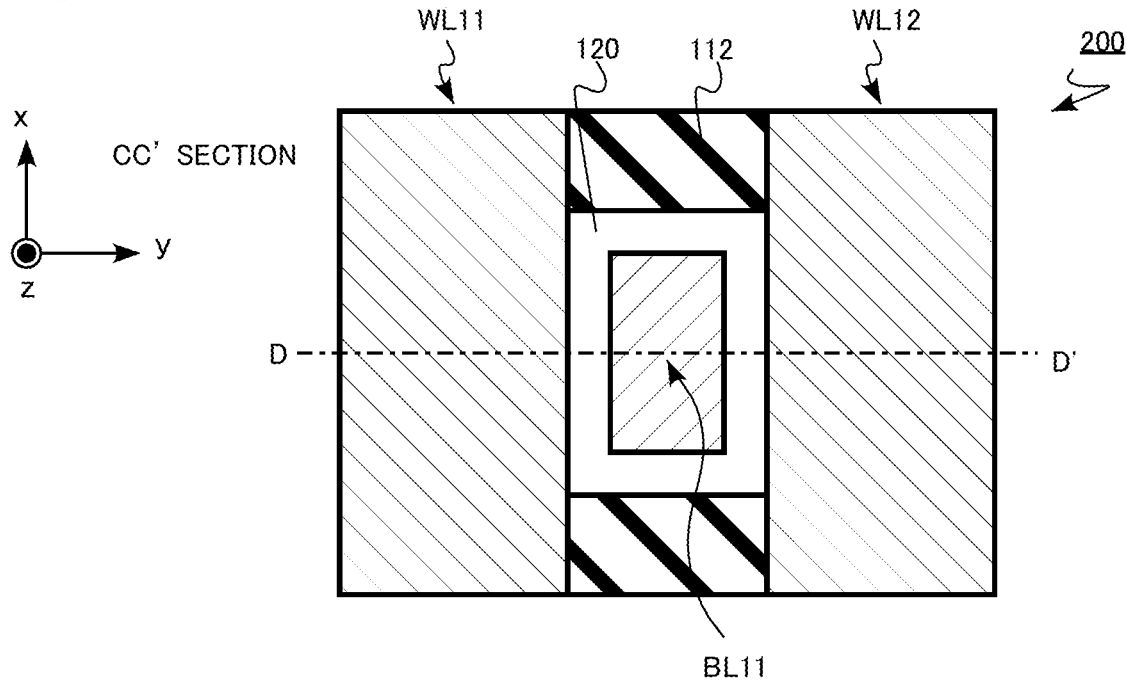

FIGS. 18A and 18B are schematic diagrams illustrating a portion of the memory cell array in the memory device in the second embodiment. FIG. 18A is a sectional view of the memory cell array 200 taken along a yz plane. FIG. 18B is a sectional view of the memory cell array 200 taken along an xy plane. FIG. 18A corresponds to a sectional view taken along line DD' in FIG. 18B. FIG. 18B corresponds to a sectional view taken along line CC' in FIG. 18A. For example, in FIG. 18A, a region surrounded by a broken line indicates one memory cell MC.

Figure 19:
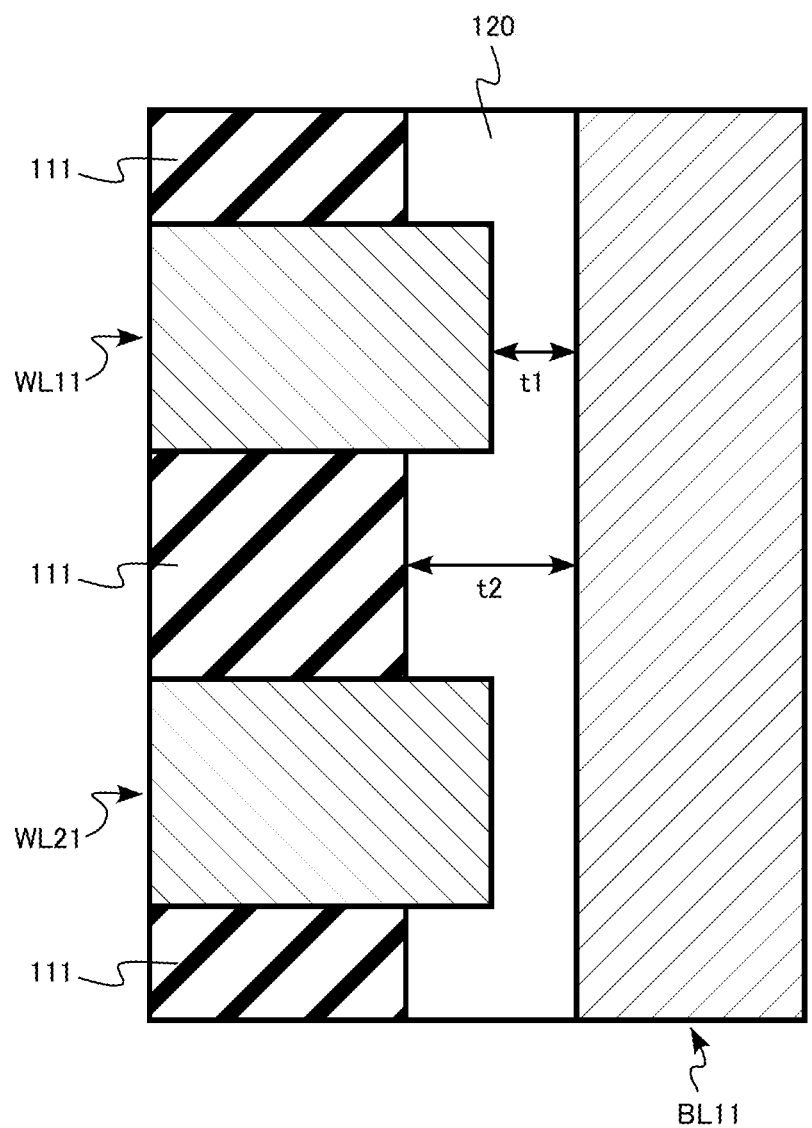
FIG. 19 is an enlarged sectional view schematically illustrating the portion of the memory cell array in the memory device in the second embodiment.

FIG. 19 is an enlarged sectional view schematically illustrating the portion of the memory cell array in the memory device in the second embodiment. FIG. 19 is an enlarged view of the portion in FIG. 18A.

The memory cell array 200 includes the plurality of word lines including the word line WL11 (first conductive layer) and the word line WL21 (second conductive layer), the plurality of bit lines including the bit line BL11 (third conductive layer), a first interlayer insulating layer 111 (insulating layer), a second interlayer insulating layer 112, and a dielectric layer 120. The plurality of word lines including the word line WL11 (first conductive layer) and the word line WL21 (second conductive layer) may be collectively and simply described as the word line WL below. The plurality of bit lines including the bit line BL11 (third conductive layer) may be collectively and simply described as the bit line BL below.

The word line WL is alternately stacked with the first interlayer insulating layer 111 in the z-direction (second direction). The word line WL extends in the x-direction (first direction).

The word line WL includes metal, for example. The word line WL includes titanium nitride, for example. The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The first interlayer insulating layer 111 is provided between the word line WL and the word line WL. The first interlayer insulating layer 111 includes silicon oxide, for example. The first interlayer insulating layer 111 is an example of the insulating layer. The first interlayer insulating layer 111 includes low-k dielectric substances, for example, paraelectric substance of silicon, carbon, oxygen composition, or substance of porous silicon oxides. Using low-k dielectric substance to the first interlayer insulating layer 111 has a merit of lower voltage driving because the electric field applied on dielectric layer 20 becomes stronger at the same driving voltages.

The bit line BL intersects with the word line WL. The bit line BL is provided between the word line WL and the word line WL. The bit line BL extends in the z-direction (second direction).

For example, the bit line BL includes metal or a semiconductor. The bit line FL includes titanium nitride or tungsten, for example. The bit line BL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The second interlayer insulating layer 112 is provided between the bit line FL and the bit line BL. The second interlayer insulating layer 112 includes silicon oxide, for example. The second interlayer insulating layer 112 includes low-k dielectric substances, for example, paraelectric substance of silicon, carbon, oxygen composition, or substance of porous silicon oxides. Using low-k dielectric substance to the second interlayer insulating layer 112 has a merit of lower voltage driving because the electric field applied on dielectric layer 20 becomes stronger at the same driving voltages.

The dielectric layer 120 is provided between the word line WL and the bit line FL. The dielectric layer 120 is provided between the word line (first conductive layer) WL11 and the bit line (third conductive layer) BL11. The dielectric layer 120 is provided between the first interlayer insulating layer (insulating layer) 111 and the bit line (third conductive layer) BL11.

The first thickness (t1 in FIG. 19) of the dielectric layer 120 between the word line WL11 (first conductive layer) and the bit line BL11 (third conductive layer) is thinner than the second thickness (t2 in FIG. 19) of the dielectric layer 120 between the first interlayer insulating layer 111 (insulating layer) and the bit line BL11 (third conductive layer).

The first thickness t1 of the dielectric layer 120 is, for example, equal to or more than 3 nm and equal to or smaller than 20 nm. The second thickness t2 of the dielectric layer 120 is, for example, equal to or more than 5 nm and equal to or smaller than 40 nm. A difference between the first thickness t1 and the second thickness t2 is, for example, equal to or more than 2 nm and equal to or smaller than 20 nm.

A corner of an end portion of the word line WL on the bit line BL side is covered by the dielectric layer 120. An end portion of the word line WL on the bit line BL side is buried in the dielectric layer 120.

The dielectric layer 120 includes a ferroelectric substance. The dielectric layer 120 includes an oxide which includes at least one of hafnium oxide and zirconium oxide. The oxide in the dielectric layer 120 is the ferroelectric substance. The oxide in the dielectric layer 120 mainly has at least one of orthorhombic crystal and trigonal crystal. The oxide in the dielectric layer 120 includes crystal of at least one of an orthorhombic crystal and trigonal crystal system.

The oxide in the dielectric layer 120 is, for example, hafnium oxide being the ferroelectric substance. The dielectric layer 120 includes, for example, hafnium oxide as the main component. The phrase "including hafnium oxide as the main component" means that a molar ratio of hafnium oxide is the highest among substances in the dielectric layer 120. The molar ratio of hafnium oxide is equal to or more than 90%, for example.

The oxide in the dielectric layer 120 is, for example, zirconium oxide being the ferroelectric substance. The dielectric layer 120 includes, for example, zirconium oxide as the main component. The phrase "including zirconium oxide as the main component" means that a molar ratio of zirconium oxide is the highest among the substances in the dielectric layer 120.

The molar ratio of zirconium oxide in the dielectric layer 120 is equal to or more than 40% and equal to or less than 60%, for example. The oxide in the dielectric layer 120 is, for example, mixed crystal of hafnium oxide being the ferroelectric substance and zirconium oxide being the ferroelectric substance.

The oxide in the dielectric layer 120 includes, for example, at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), germanium (Ge), and barium (Ba). In a case where the oxide is hafnium oxide, if the oxide includes the additive element, hafnium oxide is caused to easily exhibit ferroelectricity.

From a viewpoint of causing hafnium oxide to exhibit ferroelectricity, the concentration of the additive element is preferably equal to or more than 0.1 atomic % and equal to or less than 60 atomic %. An appropriate range of the concentration of the additive element for causing hafnium oxide to exhibit ferroelectricity varies depending on the type of additive element. For example, in a case where the additive element is silicon (Si) or trivalent elements of above elements for example aluminum (Al), the appropriate range of the concentration of the additive element for causing hafnium oxide to exhibit ferroelectricity is equal to or more than 3 atomic % and equal to or less than 7 atomic %. For example, in a case where the additive element is barium (Ba), the appropriate range of the concentration of the additive element for causing hafnium oxide to exhibit ferroelectricity is equal to or more than 0.1 atomic % and equal to or less than 3 atomic %. For example, in a case where the additive element is germanium (Ge), the appropriate range of the concentration of the additive element for causing hafnium oxide to exhibit ferroelectricity is equal to or more than 5 atomic % and equal to or less than 11 atomic %. For example, in a case where the additive element is zirconium (Zr), the appropriate range of the concentration of the additive element for causing hafnium oxide to exhibit ferroelectricity is equal to or more than 10 atomic % and equal to or less than 60 atomic %.

The oxide in the dielectric layer 120 includes crystal of the orthorhombic crystal system. The oxide in the dielectric layer 120 is, for example, hafnium oxide mainly including hafnium oxide of the orthorhombic crystal system. Hafnium oxide is, for example, hafnium oxide mainly including the third orthorhombic crystal system (Orthorhombic III, space group Pbc2$_1$, space group number 29). Even though hafnium oxide of the trigonal crystal system (trigonal, space group R3m, or P3, or R3, space group number 160, or 143, or 146) is provided, this hafnium oxide may be used because this hafnium oxide has ferroelectricity.

The oxide in the dielectric layer 120 is, for example, zirconium oxide mainly including zirconium oxide of the orthorhombic crystal system. Zirconium oxide is, for example, zirconium oxide mainly including the third orthorhombic crystal system (Orthorhombic III, space group Pbc2$_1$, space group number 29). Even though zirconium oxide mainly including zirconium oxide having a crystal structure of the trigonal crystal system (trigonal, space group R3m, or P3, or P3, space group number 160, or 143, or 146) is provided, this zirconium oxide may be used because this zirconium oxide has ferroelectricity.

Next, an example of a manufacturing method of the memory device according to the second embodiment will be described.

FIGS. 20A to 26B are schematic diagrams illustrating the manufacturing method of the memory device in the second embodiment. FIGS. 20A, 21A, 22A, 23A, 24A, 25A, and 26A are sectional views corresponding to FIG. 18A. FIGS. 20B, 21B, 22B, 23B, 24B, 25B, and 26B are sectional views corresponding to FIG. 18B.

Figure 20A:
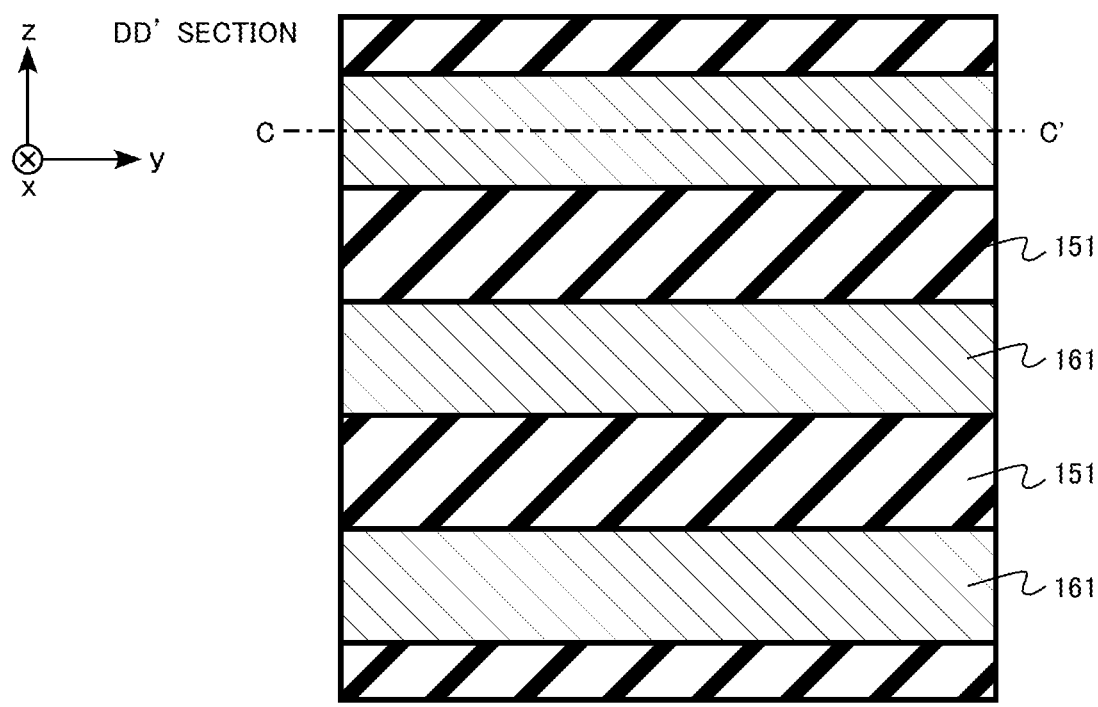
FIGS. 20A and 20B are schematic diagrams illustrating an example of a manufacturing method of the memory device in the second embodiment.
Figure 20B:
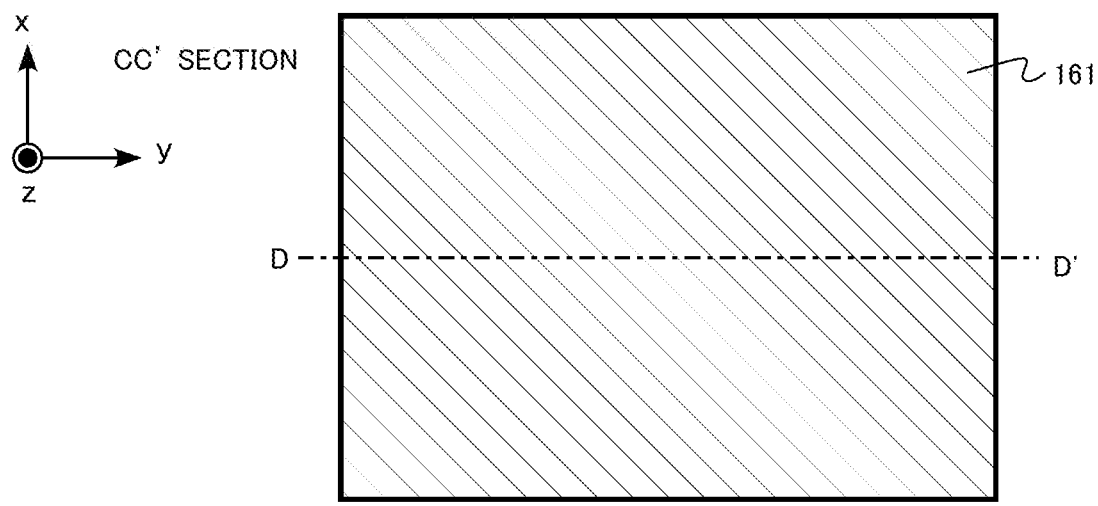

Firstly, a stacked body in which a first titanium nitride film 161 and a first silicon oxide film 151 are alternately stacked in the z-direction is formed on a substrate (not illustrated) (FIGS. 20A and 20B). A portion of the first titanium nitride film 161 finally becomes the word line WL. A portion of the first silicon oxide film 151 finally becomes a portion of the first interlayer insulating layer 111. The first silicon oxide film 151 and the first titanium nitride film 161 are formed, for example, by a CVD method.

Figure 21A:
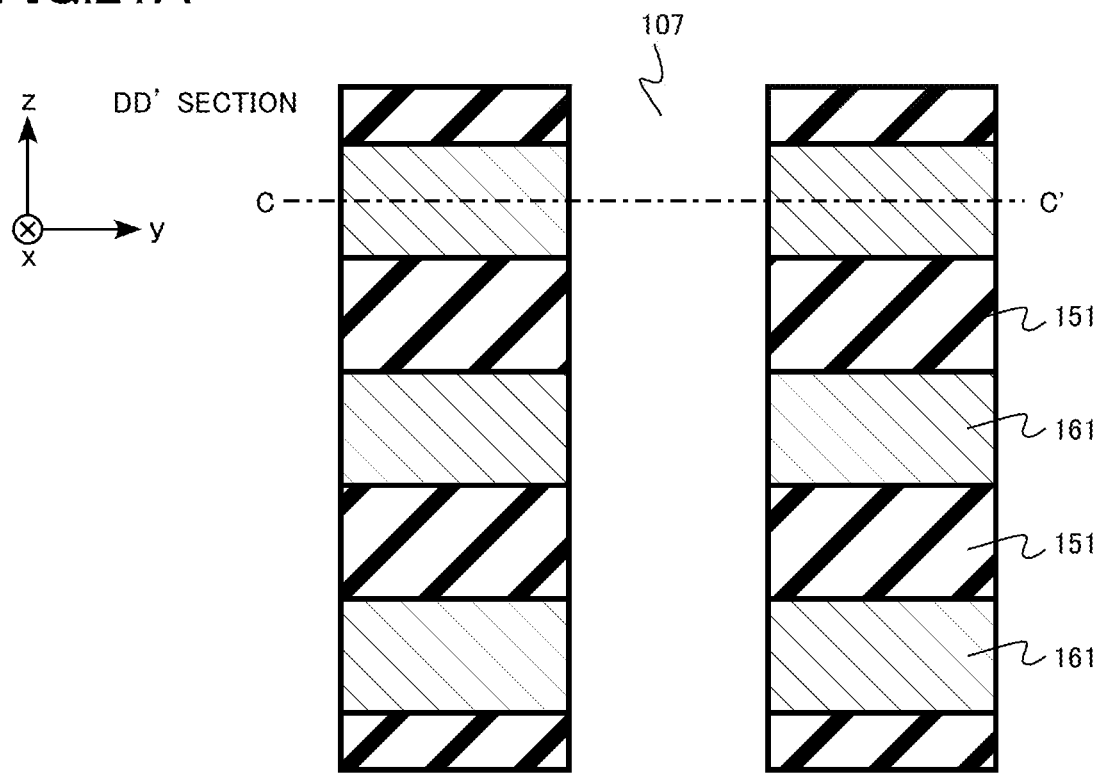
FIGS. 21A and 21B are schematic diagrams illustrating the example of the manufacturing method of the memory device in the second embodiment.
Figure 21B:
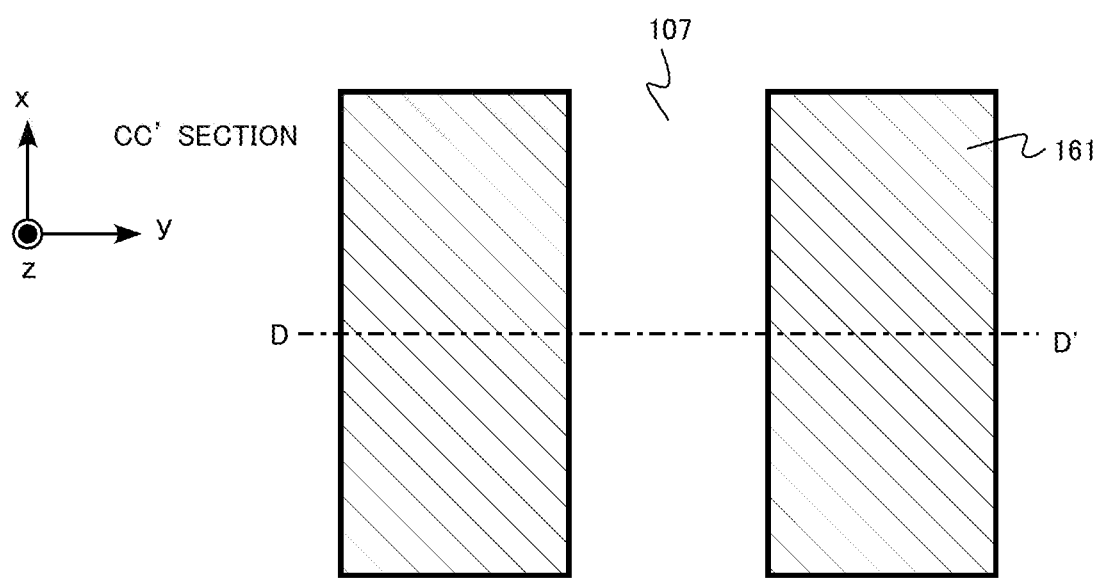

Then, a groove 107 parallel to an xz plane is formed in the stacked body (FIGS. 21A and 21B). For example, a line and space pattern extending in the x direction is formed on the stacked body by a lithographic method. The groove 107 is formed in a manner that the first silicon oxide film 151 and the first titanium nitride film 161 corresponding to a space portion are alternately etched by an RIE method.

Then, the groove 107 formed in the stacked body is filled with a second silicon oxide film 152 (FIGS. 22A and 22B). The second silicon oxide film 152 includes, for example, silicon oxide. The second silicon oxide film 152 is formed, for example, by the CVD method.

Figure 23A:
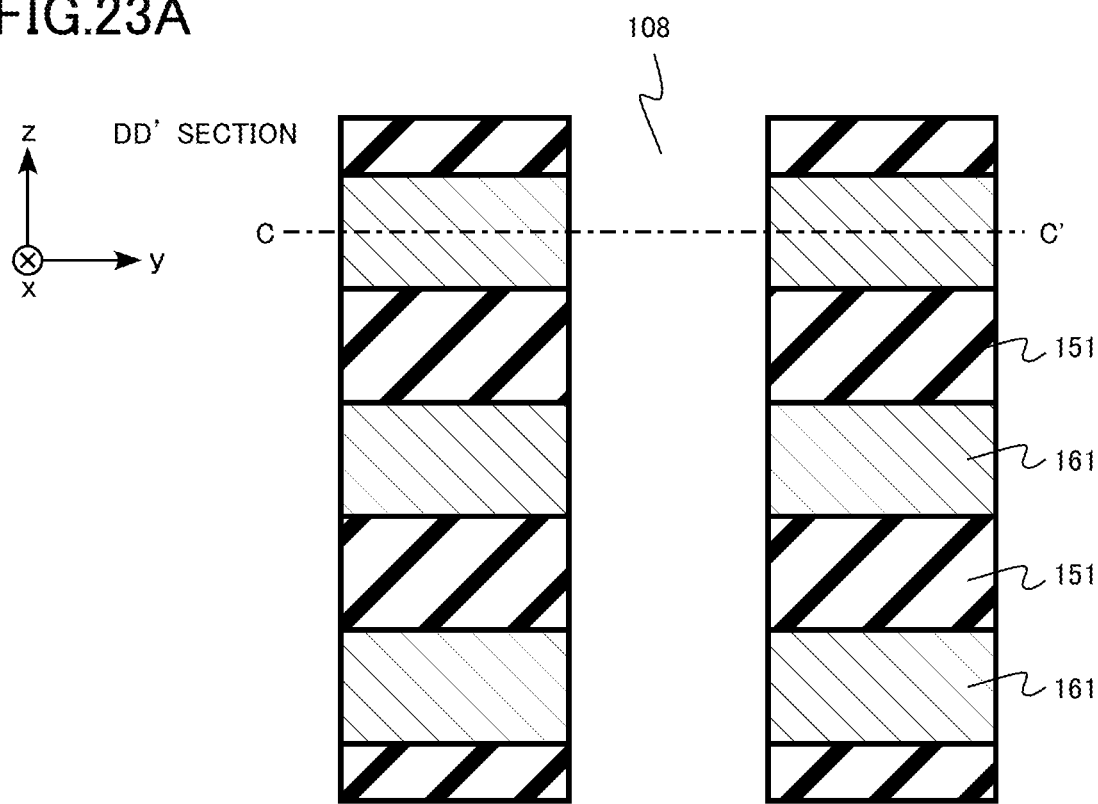
FIGS. 23A and 23B are schematic diagrams illustrating the example of the manufacturing method of the memory device in the second embodiment.
Figure 23B:
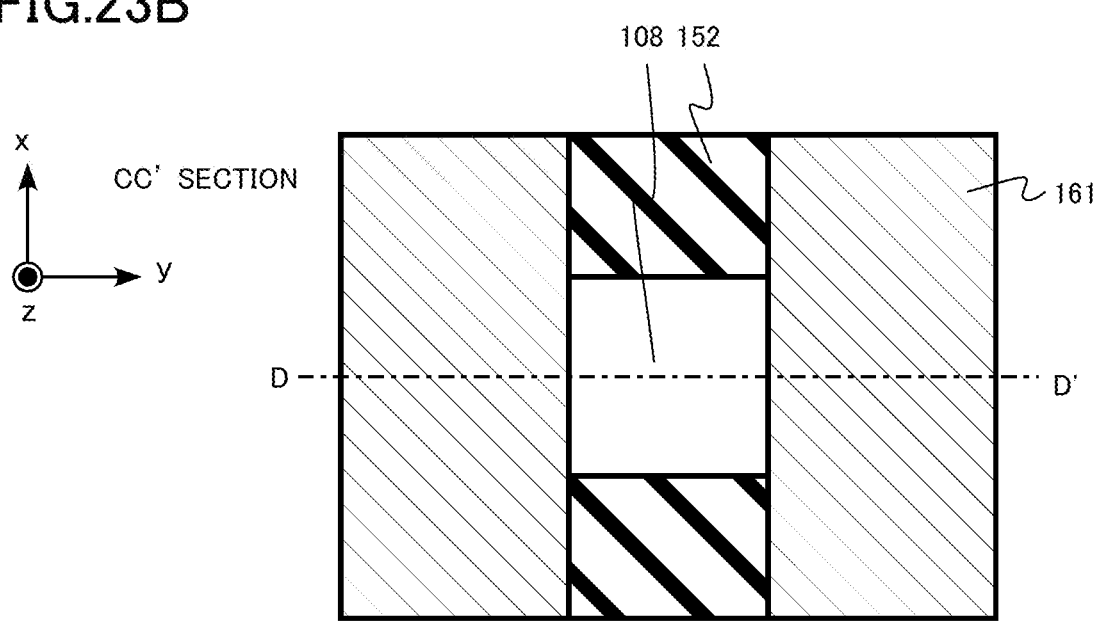

Then, a hole 108 is formed in the stacked body (FIGS. 23A and 23B). For example, a line and space pattern extending in the y-direction is formed on the stacked body by the lithographic method. The hole 108 is formed in the stacked body in a manner that the second silicon oxide film 152 corresponding to a space portion is selectively etched with respect to the first titanium nitride film 161.

Figure 24A:
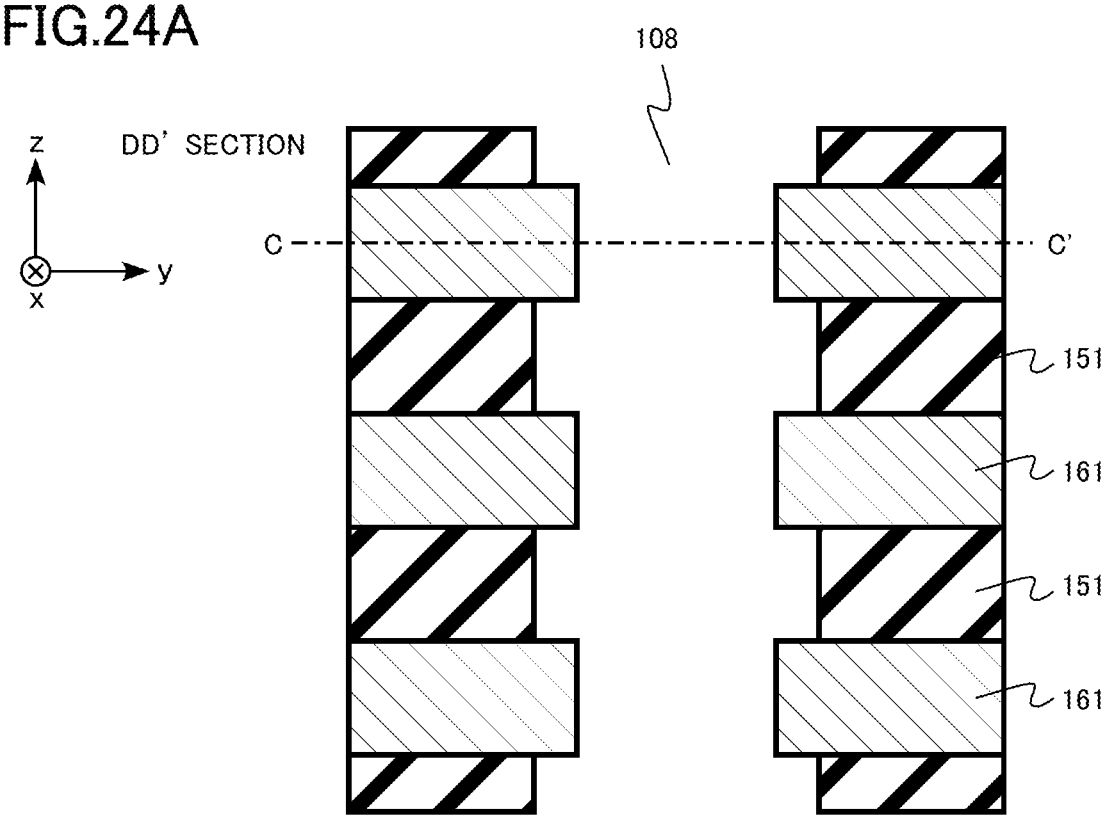
FIGS. 24A and 24B are schematic diagrams illustrating the example of the manufacturing method of the memory device in the second embodiment.
Figure 24B:
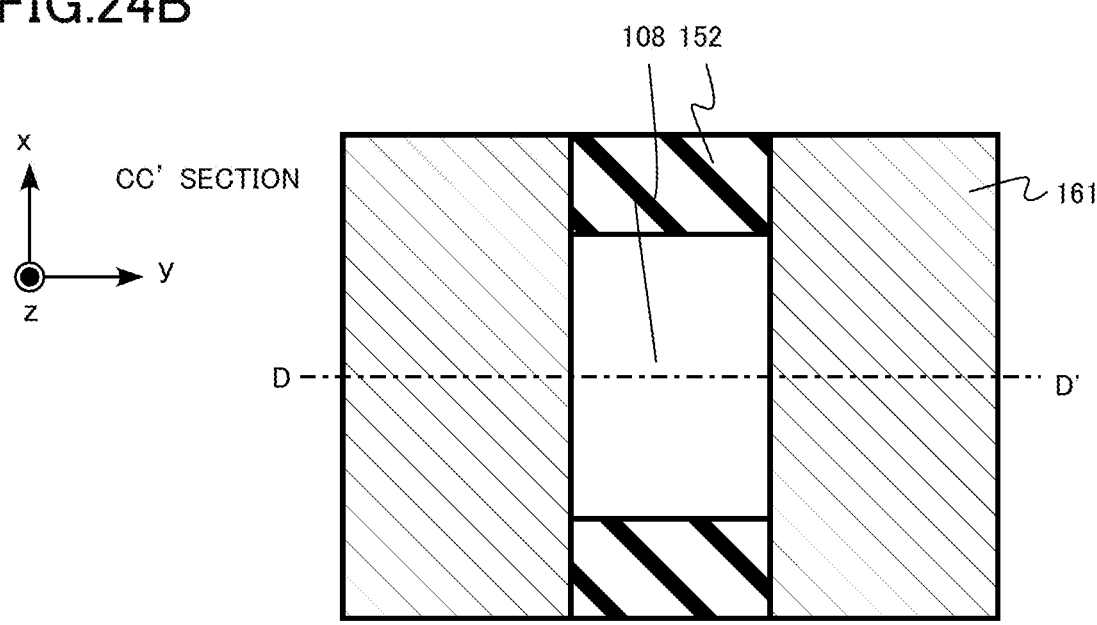

Then, the first silicon oxide film 151 on the inner surface of the hole 108 is retracted by wet etching (FIGS. 24A and 24B). The first silicon oxide film 151 is selectively etched with respect to the first titanium nitride film 161 by wet etching.

Figure 25A:
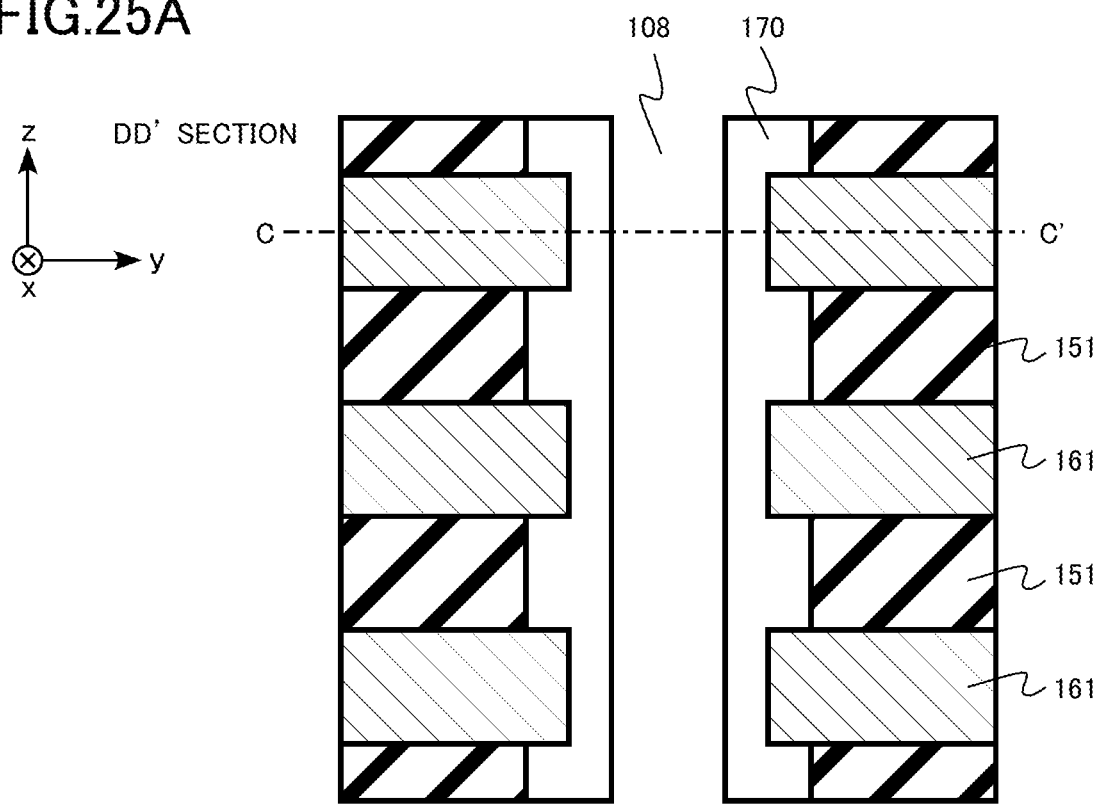
FIGS. 25A and 25B are schematic diagrams illustrating the example of the manufacturing method of the memory device in the second embodiment.
Figure 25B:
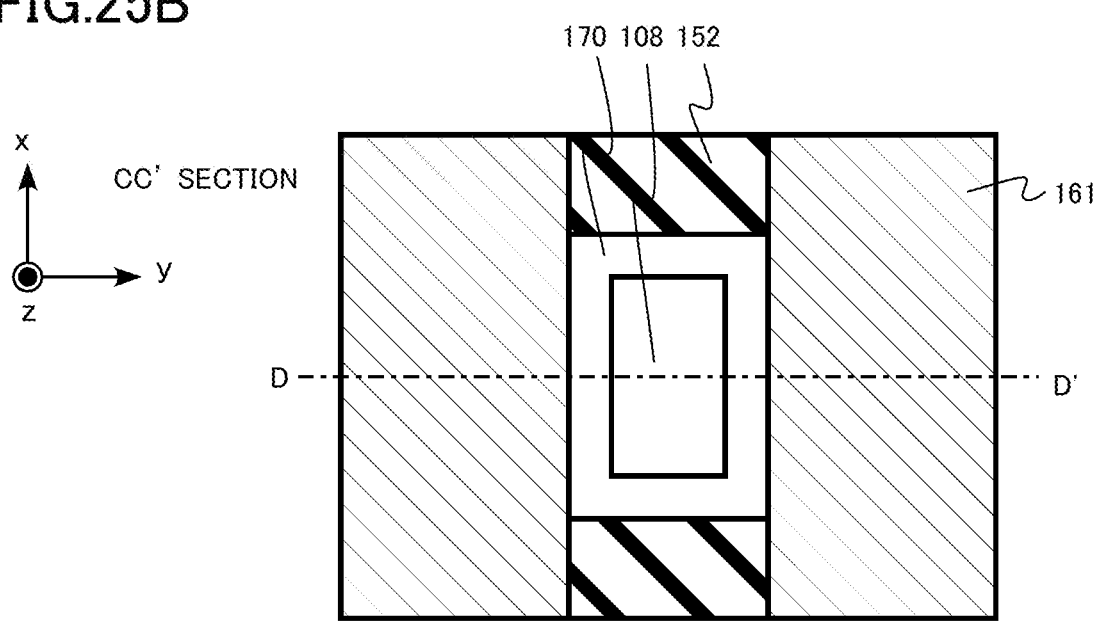

Then, a hafnium oxide film 170 is formed on the inner surface of the hole 108 (FIGS. 25A and 25B). A portion of the hafnium oxide film 170 finally becomes a portion of a dielectric layer 120. The hafnium oxide film 170 includes, for example, silicon (Si) as an additive element.

The hafnium oxide film 170 is formed, for example, by an ALD method. The hafnium oxide film 70 is amorphous immediately after the hafnium oxide film is formed.

Figure 26A:
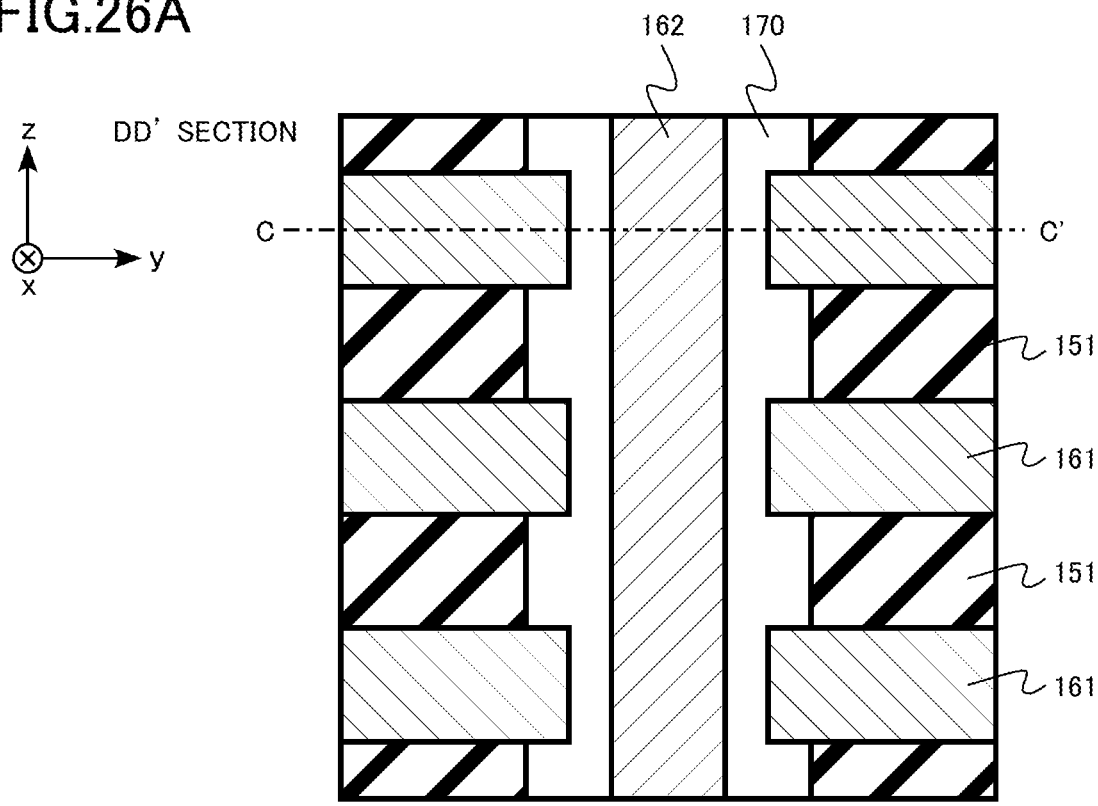
FIGS. 26A and 26B are schematic diagrams illustrating the example of the manufacturing method of the memory device in the second embodiment.
Figure 26B:
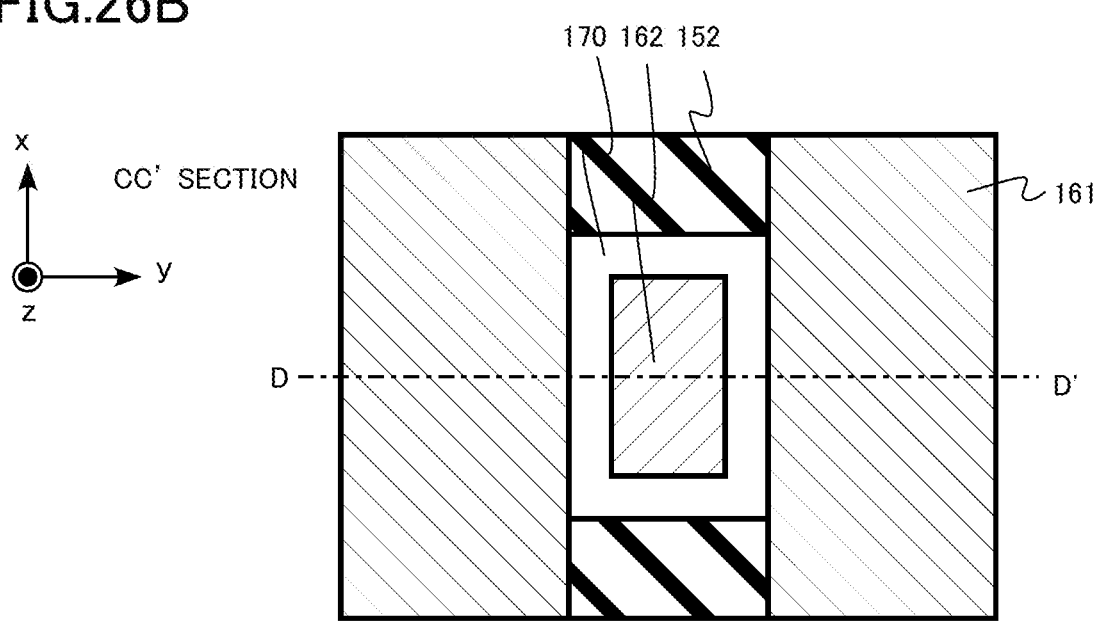

Then, the hole 108 is filled with a second titanium nitride film 162 (FIGS. 26A and 26B). The second titanium nitride film 162 finally becomes the bit line BL. The second titanium nitride film 162 is formed, for example, by the CVD method.

Then, heat treatment is performed to crystallize the hafnium oxide film 170. The heat treatment is performed, for example, in a nitrogen gas atmosphere at a temperature which is equal to or higher than 600° C. and equal to or lower than 1050° C., for a period of 1 second or more and 30 seconds or less. The heat treatment is so-called crystallization annealing.

With the heat treatment, the hafnium oxide film 170 is crystallized to have at least one of orthorhombic crystal and trigonal crystal. With the heat treatment, the hafnium oxide film 170 becomes a ferroelectric film.

With the above-described manufacturing method, the memory device illustrated in FIGS. 18A and 18B according to the second embodiment is manufactured.

In the ferroelectric memory in the second embodiment, similar to the ferroelectric memory in the first embodiment, the first thickness (t1 in FIG. 19) of the dielectric layer 120 between the word line (first conductive layer) WL11 and the bit line (third conductive layer) BL11 is thinner than the second thickness (t2 in FIG. 19) of the dielectric layer 120 between the first interlayer insulating layer 111 (insulating layer) and the bit line BL11 (third conductive layer). Thus, the corner of the end portion of the word line WL on the bit line BL side is covered by the dielectric layer 120. In other words, the end portion of the word line WL on the bit line EL side is buried in the dielectric layer 120.

Accordingly, with the function similar to the function of the ferroelectric memory in the first embodiment, it is possible to stably form a domain wall DW between the word line WL and the bit line BL. Accordingly, the stable operation of the memory cell MC is possible.

Figure 27:
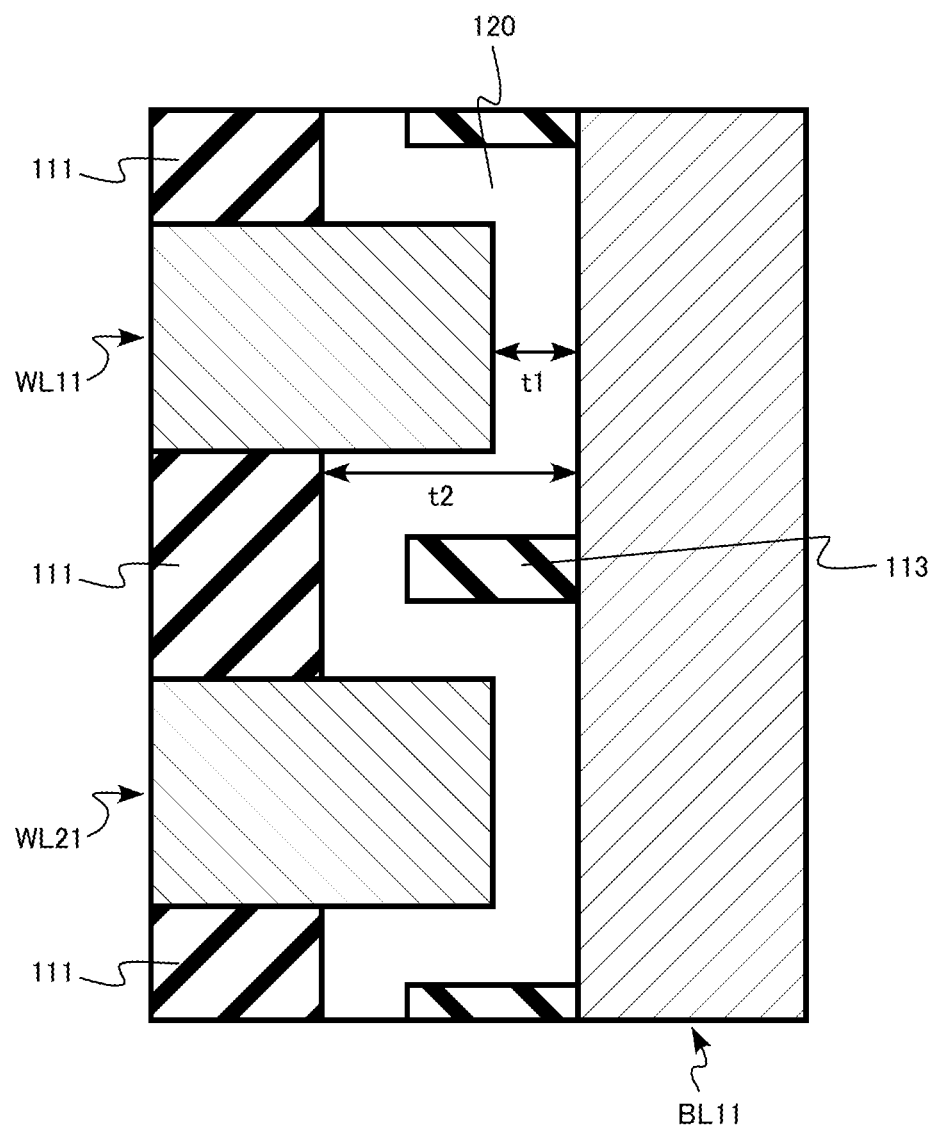
FIG. 27 is an enlarged sectional view schematically illustrating the portion of a memory cell array in a memory device according to a first modification example of the second embodiment.

FIG. 27 is an enlarged sectional view schematically illustrating the portion of a memory cell array in a memory device according to a first modification example of the second embodiment. FIG. 27 is a sectional view corresponding to FIG. 19.

The memory device in the first modification example of the second embodiment is a ferroelectric memory using a current flowing in a ferroelectric domain wall. The ferroelectric memory in the first modification example is different from the ferroelectric memory in the second embodiment in that the ferroelectric memory in the first modification example includes an insulating layer provided between the dielectric layer and the third conductive layer.

The ferroelectric memory in the first modification example includes a third interlayer insulating layer 113 between the dielectric layer 120 and the bit line BL11 (third conductive layer).

According to the ferroelectric memory in the first modification example, extending the domain wall DW to the adjacent memory cell MC has difficulty. Thus, the stable operation of the memory cell MC is possible.

Figure 28:
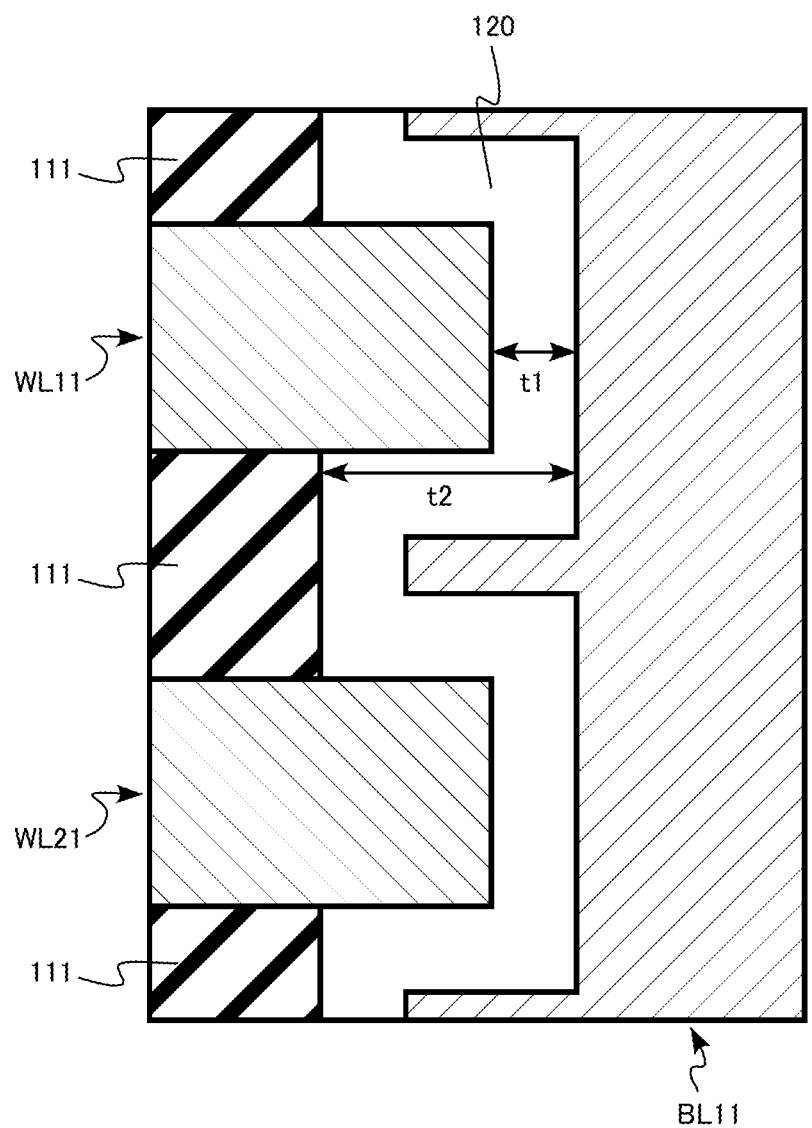
FIG. 28 is an enlarged sectional view schematically illustrating the portion of a memory cell array in a memory device according to a second modification example of the second embodiment.

FIG. 28 is an enlarged sectional view schematically illustrating the portion of a memory cell array in a memory device according to a second modification example of the second embodiment. FIG. 28 is a sectional view corresponding to FIG. 19.

The memory device in the second modification example of the second embodiment is a ferroelectric memory using a current flowing in a ferroelectric domain wall. The ferroelectric memory in the second modification example is different from the ferroelectric memory in the second embodiment in that a portion of the third conductive layer protrudes toward the insulating layer.

In the ferroelectric memory in the second modification example, a portion of the bit line (third conductive layer) BL11 protrudes toward the first interlayer insulating layer 111.

According to the ferroelectric memory in the second modification example of the second embodiment, extending the domain wall DW to the adjacent memory cell MC has difficulty. Thus, the stable operation of the memory cell MC is possible.

As described above, according to the memory device in the second embodiment, similar to the memory device in the first embodiment, the stable operation of the memory cell is possible. Thus, according to the memory device in the second embodiment, it is possible to realize a memory device having high reliability and large capacity. Since the memory cell array includes the three-dimensional structure, it is possible to increase the capacity of the memory device.

Third Embodiment

According to a third embodiment, a memory device includes a first conductive layer extending in a first direction, a second conductive layer extending in the first direction, a third conductive layer extending in a second direction intersecting with the first direction, an insulating layer provided between the first conductive layer and the second conductive layer, and a dielectric layer provided between the first conductive layer and the third conductive layer, and between the insulating layer and the third conductive layer, the dielectric layer having a first thickness thicker than a second thickness, the first thickness being a thickness between the first conductive layer and the third conductive layer, the second thickness being a thickness between the insulating layer and the third conductive layer, and the dielectric layer including an oxide including at least one of hafnium oxide and zirconium oxide. The memory device in the third embodiment is different from the memory device in the first embodiment in that the first thickness between the first conductive layer and the third conductive layer is thicker than the second thickness between the insulating layer and the third conductive layer. Descriptions of some contents overlapping those in the first embodiment may be omitted.

The memory device in the third embodiment is a ferroelectric memory using a current flowing in a ferroelectric domain wall.

Figure 29A:
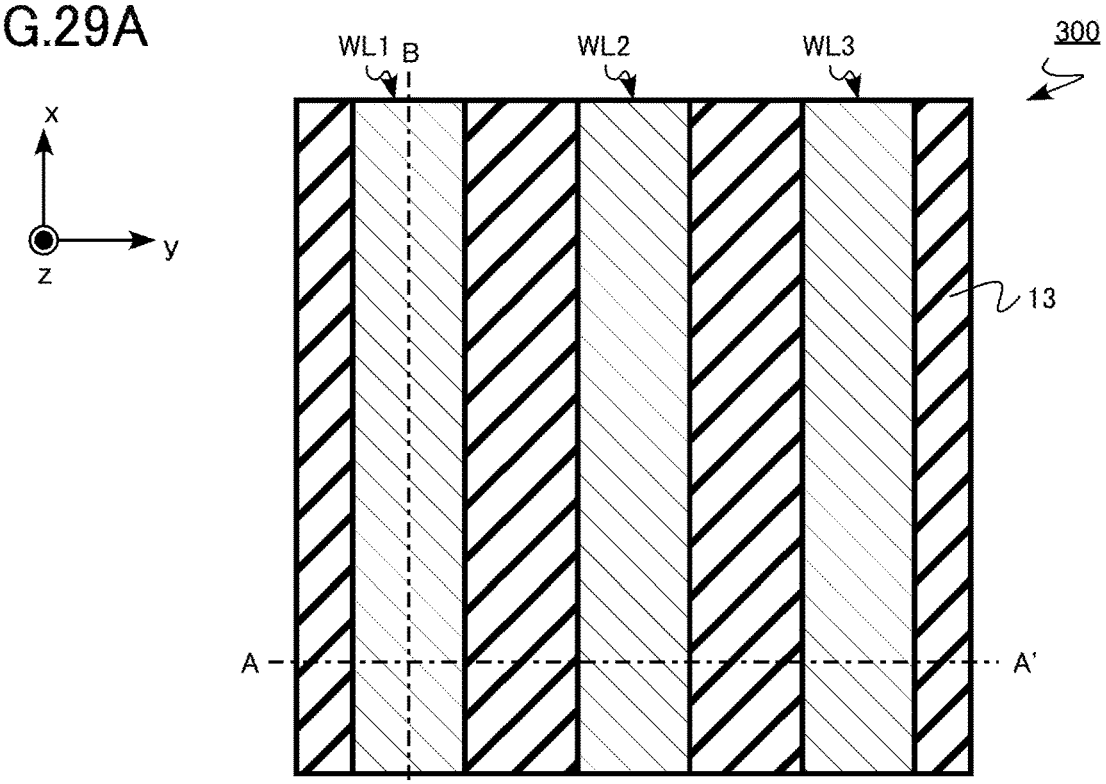
FIGS. 29A to 29C are schematic diagrams illustrating a portion of a memory cell array in a memory device according to a third embodiment.
Figure 29B:
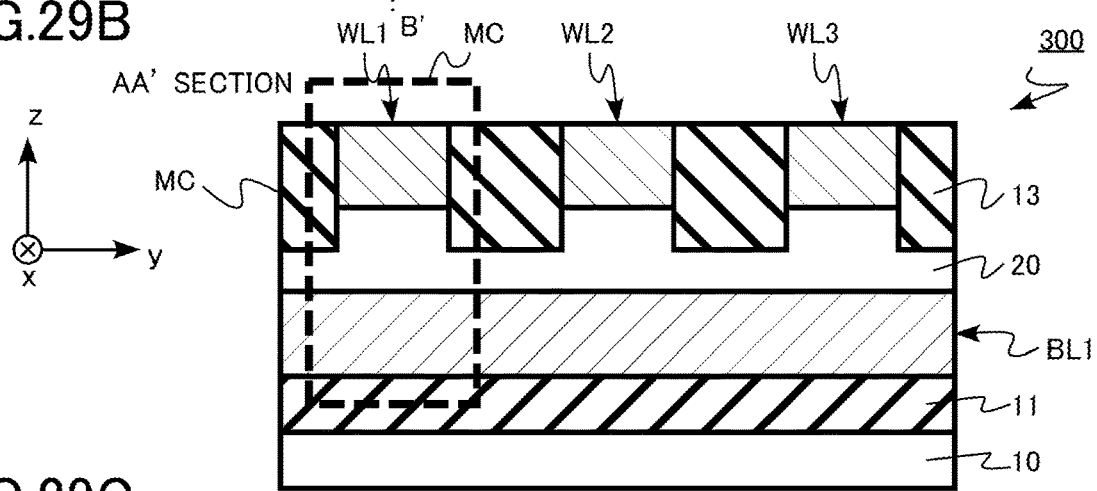
Figure 29C:
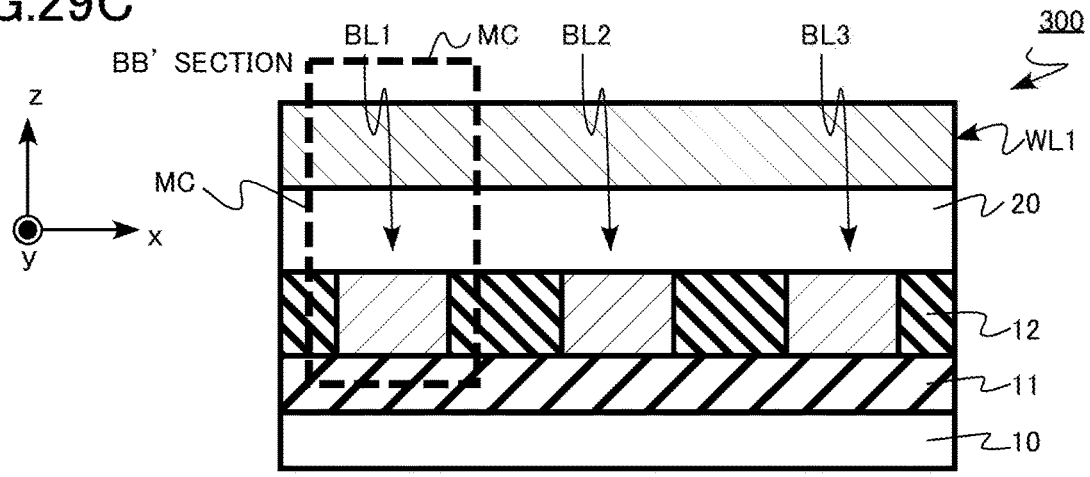

FIGS. 29A to 29C are schematic diagrams illustrating a portion of a memory cell array in the memory device in the third embodiment. FIG. 29A is a top view, FIG. 29B is a sectional view taken along line AA' in FIG. 29A, and FIG. 29C is a sectional view taken along line BB' in FIG. 29A. For example, in FIGS. 29B and 29C, a region surrounded by a broken line indicates one memory cell MC.

Figure 30:
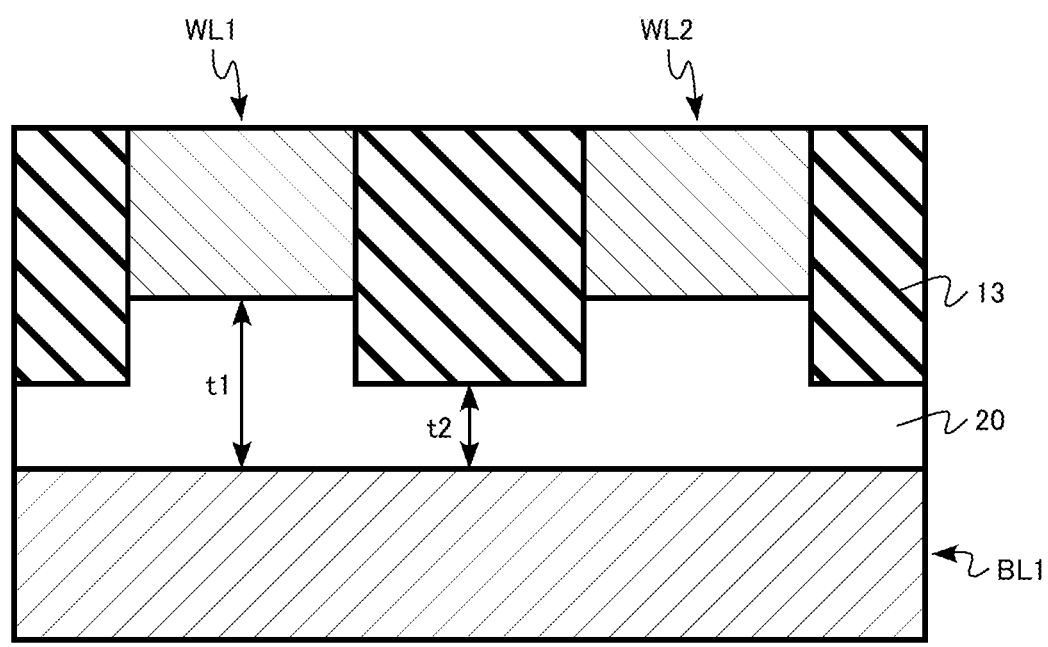
FIG. 30 is an enlarged sectional view schematically illustrating the portion of the memory cell array in the memory device in the third embodiment.

FIG. 30 is an enlarged sectional view schematically illustrating the portion of the memory cell array in the memory device in the third embodiment. FIG. 30 is an enlarged view of the portion in FIG. 29B.

A memory cell array 300 includes a semiconductor substrate 10, a word line WL1 (first conductive layer), a word line WL2 (second conductive layer), a word line WL3, a bit line ELI (third conductive layer), a bit line BL2, a bit line BL3, a first interlayer insulating layer 11, a second interlayer insulating layer 12, a third interlayer insulating layer 13 (insulating layer), and a dielectric layer 20. The word line WL1 (first conductive layer), the word line WL2 (second conductive layer), and the word line WL3 may be collectively and simply described as the word line WL below. The bit line BL1 (third conductive layer), the bit line BL2, and the bit line BL3 may be collectively and simply described as the bit line BL.

The word line WL1 is an example of the first conductive layer. The word line WL2 is an example of the second conductive layer. The bit line BL1 is an example of the third conductive layer.

The word line WL extends in the x-direction (first direction). The word line WL includes metal, for example. The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The bit line BL extends in the y-direction (second direction). The y-direction (second direction) intersects with the x-direction. The v-direction (second direction) is, for example, perpendicular to the x-direction. For example, the bit line BL includes metal.

The word line WL and the bit line EL include the same material, for example. All of the word line WL and the bit line EL include titanium nitride, for example. The word line WL and the bit line BL contain conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The semiconductor substrate 10 is a silicon substrate, for example.

The first interlayer insulating layer 11 is provided on the semiconductor substrate 10. The first interlayer insulating layer 11 is provided between the semiconductor substrate 10 and the word line WL. The first interlayer insulating layer 11 includes silicon oxide, for example.

The second interlayer insulating layer 12 is provided between the bit line EL and the bit line BL. The second interlayer insulating layer 12 includes silicon oxide, for example. The second interlayer insulating layer 12 includes low-k dielectric substances, for example, paraelectric substance of silicon, carbon, oxygen composition, or substance of porous silicon oxides. Using low-k dielectric substance to the second interlayer insulating layer 12 has a merit of lower voltage driving because the electric field applied on dielectric layer 20 becomes stronger at the same driving voltages.

The third interlayer insulating layer 13 is provided between the word line WL and the word line. The third interlayer insulating layer 13 is an example of the insulating layer. The third interlayer insulating layer 13 includes silicon oxide, for example. The third interlayer insulating layer 13 includes low-k dielectric substances, for example, paraelectric substance of silicon, carbon, oxygen composition, or substance of porous silicon oxides. Using low-k dielectric substance to the third interlayer insulating layer 13 has a merit of lower voltage driving because the electric field applied on dielectric layer 20 becomes stronger at the same driving voltages.

The dielectric layer 20 is provided between the word line WL and the bit line EL. The dielectric layer 20 is provided between the word line WL1 (first conductive layer) and the bit line BL1 (third conductive layer). The dielectric layer 20 is provided between the third interlayer insulating layer 13 (insulating layer) and the bit line BL1 (third conductive layer).

The first thickness (t1 in FIG. 30) of the dielectric layer 20 between the word line WL1 (first conductive layer) and the bit line BL1 (third conductive layer) is thicker than the second thickness (t2 in FIG. 30) of the dielectric layer 20 between the third interlayer insulating layer 13 (insulating layer) and the bit line BL1 (third conductive layer).

The first thickness t1 of the dielectric layer 20 is, for example, equal to or more than 5 nm and equal to or smaller than 40 nm. The second thickness t2 of the dielectric layer 20 is, for example, equal to or more than 3 nm and equal to or smaller than 20 nm. A difference between the first thickness t1 and the second thickness t2 is, for example, equal to or more than 2 nm and equal to or smaller than 20 nm.

The first thickness t1 is, for example, equal to or more than 1.1 times the second thickness t2 and equal to or smaller than 3 times the second thickness t2.

The thickness of the dielectric layer 20 between the word line WL and the word line WL is thinner than the thickness of the dielectric layer 20 between the word line WL and the bit line EL. The dielectric layer 20 is recessed using the corner of the end portion of word line WL on the bit line BL side, as a boundary.

The dielectric layer 20 includes a ferroelectric substance. The dielectric layer 20 includes an oxide which includes at least one of hafnium oxide and zirconium oxide. The oxide in the dielectric layer 20 is a ferroelectric substance. The oxide in the dielectric layer 20 mainly has at least one of orthorhombic crystal and trigonal crystal. The oxide in the dielectric layer 20 includes crystal of at least one of an orthorhombic crystal and trigonal crystal system.

Figure 31:
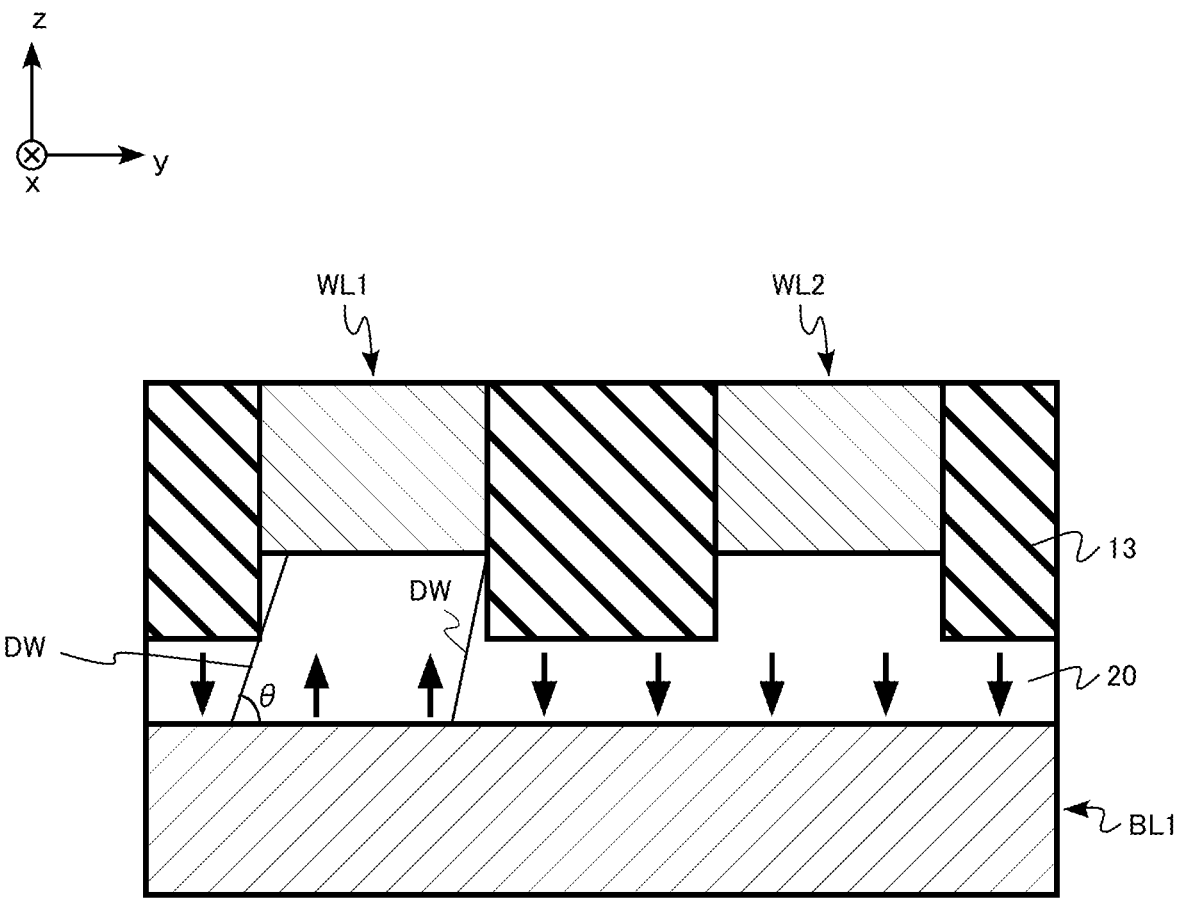
FIG. 31 is a diagram for a function and effect of the memory device in the third embodiment.

FIG. 31 is a diagram for a function and effect of the memory device in the third embodiment. FIG. 31 illustrates the low resistance state where a current easily flows between the word line WL and the bit line BL of the memory cell MC.

In the low resistance state illustrated in FIG. 31, domains having different polarization directions are formed in the dielectric layer 20 being the ferroelectric substance.

In the ferroelectric memory in the third embodiment, the dielectric layer 20 is recessed using the corner of the end portion of word line WL on the bit line BL side, as the boundary. It is possible to stably form the domain wall DW between the word line WL and the bit line BL by the structure in the vicinity of the corner of the end portion of the word line WL. The reason is that the domain wall DW is easily formed using the corner of the end portion of the word line WL as a start point. In addition, this is because that, even though the formed domain wall DW moves, the domain wall DW is easily pinned at the recess of the dielectric layer 20 at the end portion of the word line WL.

In the ferroelectric memory in the third embodiment, similar to the ferroelectric memory in the modification example of the first embodiment, a configuration in which a first switching layer 31 is provided between the dielectric layer 20 and the word line WL, and a second switching layer 32 is provided between the dielectric layer 20 and the bit line BL may also be made.

As described above, according to the memory device in the third embodiment, the stable operation of the memory cell is possible. Thus, according to the memory device in the third embodiment, it is possible to realize a memory device having high reliability and large capacity.

Fourth Embodiment

A memory device according to a fourth embodiment is different from the memory device in the third embodiment in that a memory cell array includes a three-dimensional structure. The memory device in the fourth embodiment is different from the memory device in the second embodiment in that the first thickness between the first conductive layer and the third conductive layer is thicker than the second thickness between the insulating layer and the third conductive layer. Descriptions of some contents overlapping those in the second embodiment and the third embodiment may be omitted.

Figure 32A:
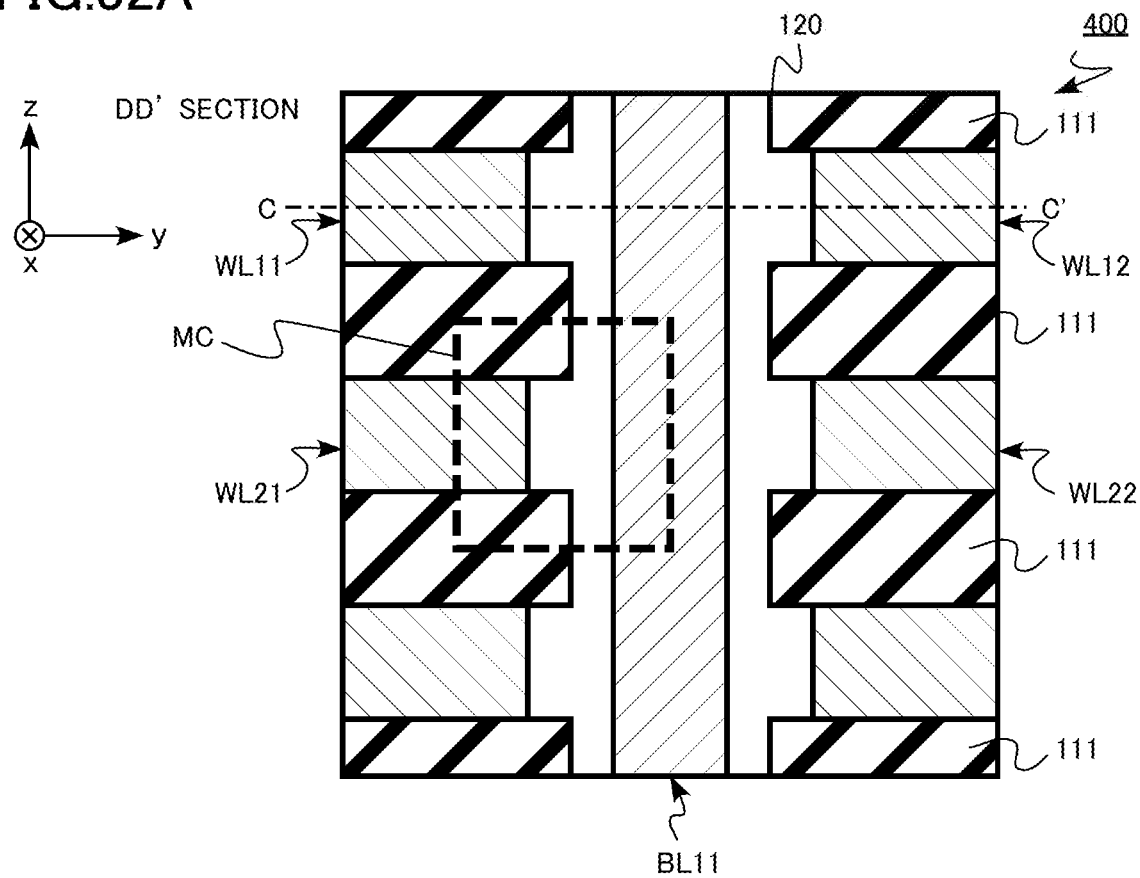
FIGS. 32A and 32B are schematic diagrams illustrating a portion of a memory cell array in a memory device according to a fourth embodiment.
Figure 32B:
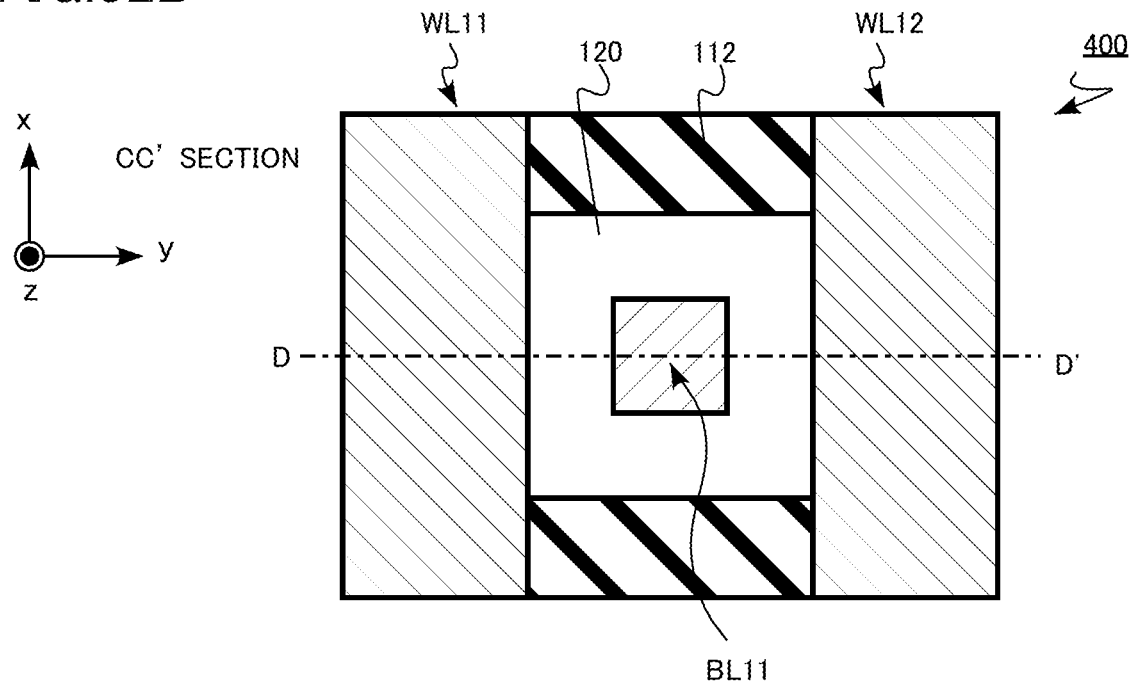

FIGS. 32A and 32B are schematic diagrams illustrating a portion of the memory cell array in the memory device in the fourth embodiment. FIG. 32A is a sectional view of a memory cell array 400 taken along the yz plane. FIG. 32B is a sectional view of the memory cell array 400 taken along the xy plane. FIG. 32A corresponds to a sectional view taken along line DD' in FIG. 32B. FIG. 32B corresponds to a sectional view taken along line CC' in FIG. 32A. For example, in FIG. 32B, a region surrounded by a broken line indicates one memory cell MC.

Figure 33:
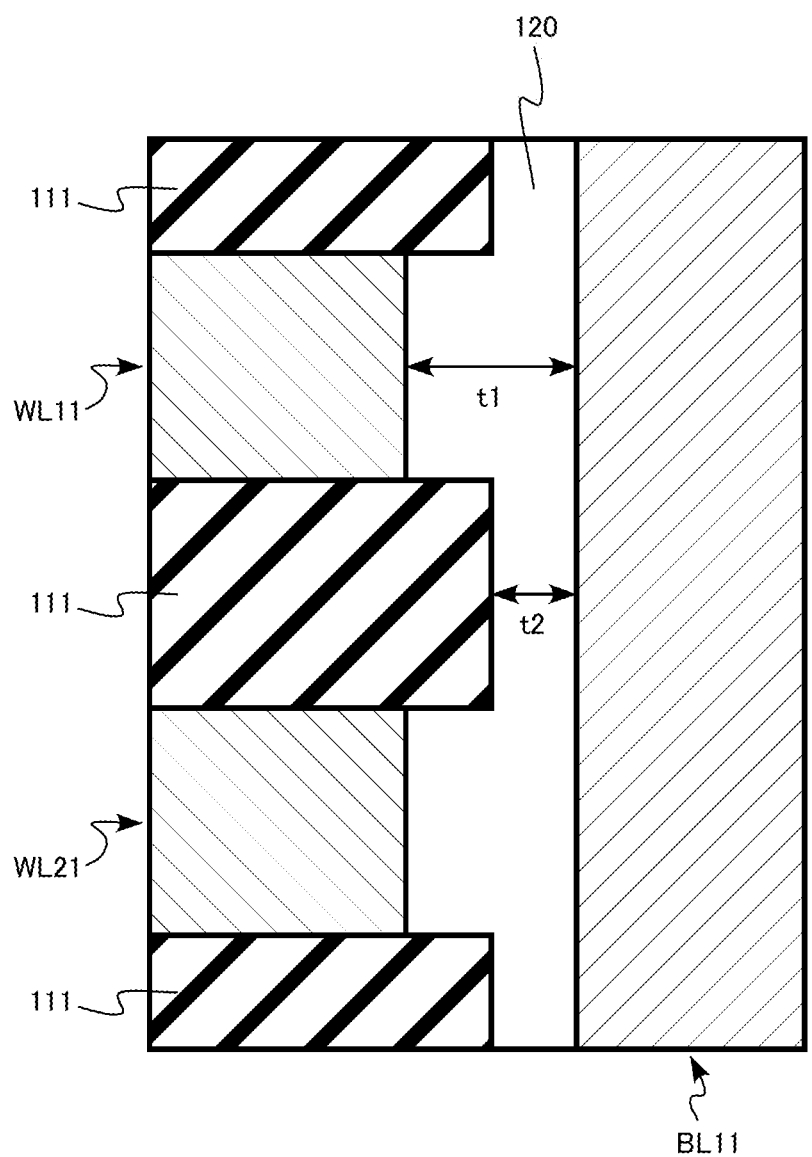
FIG. 33 is an enlarged sectional view schematically illustrating the portion of the memory cell array in the memory device in the fourth embodiment.

FIG. 33 is an enlarged sectional view schematically illustrating the portion of the memory cell array in the memory device in the fourth embodiment. FIG. 33 is an enlarged view of the portion in FIG. 32A.

The memory cell array 400 includes a plurality of word lines including a word line WL11 (first conductive layer) and a word line WL21 (second conductive layer), a plurality of bit lines including a bit line BL11 (third conductive layer), a first interlayer insulating layer 111 (insulating layer), a second interlayer insulating layer 112, and a dielectric layer 120. The plurality of word lines including the word line WL11 (first conductive layer) and the word line WL21 (second conductive layer) may be collectively and simply described as the word line WL below. The plurality of bit lines including the bit line BL11 (third conductive layer) may be collectively and simply described as the bit line BL below.

The word line WL is alternately stacked with the first interlayer insulating layer 111 in the z-direction (second direction). The word line WL extends in the x-direction (first direction).

The word line WL includes metal, for example. The word line WL includes titanium nitride, for example. The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The first interlayer insulating layer 111 is provided between the word line WL and the word line WL. The first interlayer insulating layer 111 includes, for example, silicon oxide. The first interlayer insulating layer 111 is an example of the insulating layer. The first interlayer insulating layer 111 includes low-k dielectric substances, for example, paraelectric substance of silicon, carbon, oxygen composition, or substance of porous silicon oxides. Using low-k dielectric substance to the first interlayer insulating layer 111 has a merit of lower voltage driving because the electric field applied on dielectric layer 20 becomes stronger at the same driving voltages.

The bit line BL intersects with the word line WL. The bit line BL is provided between the word line WL and the word line WL. The bit line BL extends in the z-direction (second direction).

For example, the bit line BL includes metal or a semiconductor. The bit line BL includes titanium nitride or tungsten, for example. The bit line BL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The second interlayer insulating layer 112 is provided between the bit line BL and the bit line BL. The second interlayer insulating layer 112 includes silicon oxide, for example. The second interlayer insulating layer 112 includes low-k dielectric substances, for example, paraelectric substance of silicon, carbon, oxygen composition, or substance of porous silicon oxides. Using low-k dielectric substance to the second interlayer insulating layer 112 has a merit of lower voltage driving because the electric field applied on dielectric layer 20 becomes stronger at the same driving voltages.

The dielectric layer 120 is provided between the word line WL and the bit line BL. The dielectric layer 120 is provided between the word line WL11 (first conductive layer) and the bit line BL11 (third conductive layer). The dielectric layer 120 is provided between the first interlayer insulating layer 111 (insulating layer) and the bit line BL11 (third conductive layer).

The first thickness (t1 in FIG. 33) of the dielectric layer 120 between the word line WL11 (first conductive layer) and the bit line BL11 (third conductive layer) is thicker than the second thickness (t2 in FIG. 33) of the dielectric layer 120 between the first interlayer insulating layer 111 (insulating layer) and the bit line BL11 (third conductive layer).

The first thickness t1 of the dielectric layer 120 is, for example, equal to or more than 5 nm and equal to or smaller than 40 nm. The second thickness t2 of the dielectric layer 120 is, for example, equal to or more than 3 nm and equal to or smaller than 20 nm. A difference between the first thickness t1 and the second thickness t2 is, for example, equal to or more than 2 nm and equal to or smaller than 20 nm.

The thickness of the dielectric layer 120 between the word line WL and the word line WL is thinner than the thickness of the dielectric layer 120 between the word line WL and the bit line BL. The dielectric layer 20 is recessed using the corner of the end portion of word line WL on the bit line BL side, as a boundary.

The dielectric layer 120 includes a ferroelectric substance. The dielectric layer 120 includes an oxide which includes at least one of hafnium oxide and zirconium oxide. The oxide in the dielectric layer 120 is the ferroelectric substance. The oxide in the dielectric layer 120 mainly has orthorhombic crystal or trigonal crystal. The oxide in the dielectric layer 120 includes crystal of an orthorhombic crystal system or a trigonal crystal system.

In the ferroelectric memory in the fourth embodiment, similar to the ferroelectric memory in the third embodiment, the first thickness (t1 in FIG. 33) of the dielectric layer 120 between the word line WL11 (first conductive layer) and the bit line BL11 (third conductive layer) is thicker than the second thickness (t2 in FIG. 33) of the dielectric layer 120 between the first interlayer insulating layer 111 (insulating layer) and the bit line BL11 (third conductive layer). Thus, the dielectric layer 120 is recessed using the corner of the end portion of word line WL on the bit line EL side, as a boundary.

Accordingly, with the function similar to the function of the ferroelectric memory in the third embodiment, it is possible to stably form a domain wall DW between the word line WL and the bit line BL. Accordingly, the stable operation of the memory cell MC is possible.

As described above, according to the memory device in the fourth embodiment, the stable operation of the memory cell is possible. Thus, according to the memory device in the fourth embodiment, it is possible to realize a memory device having high reliability and large capacity. Since the memory cell array includes the three-dimensional structure, it is possible to increase the capacity of the memory device.

Fifth Embodiment

According to a fifth embodiment, a memory device includes a first conductive layer extending in a first direction; a second conductive layer extending in the first direction; a third conductive layer extending in a second direction intersecting with the first direction; a fourth conductive layer extending in the first direction, the third conductive layer being located between the first conductive layer and the fourth conductive layer; an insulating layer provided between the first conductive layer and the second conductive layer; and a dielectric layer including a first region, a second region, and a third region, the dielectric layer including an oxide including at least one of hafnium oxide and zirconium oxide, the first region being provided between the first conductive layer and the third conductive layer and mainly having at least one of orthorhombic crystal and trigonal crystal, the second region being provided between the fourth conductive layer and the third conductive layer and mainly having at least one of orthorhombic crystal and trigonal crystal, and the third region being provided between the first region and the second region and mainly having crystal other than orthorhombic crystal and trigonal crystal.

The memory device in the fifth embodiment is different from the memory device in the second embodiment in that the first thickness of the dielectric layer between the first conductive layer and the third conductive layer is equal to the second thickness between the insulating layer and the third conductive layer. In addition, the memory device in the fifth embodiment is different from the memory device in the second embodiment in that the dielectric layer has the first region provided between the first conductive layer and the third conductive layer and mainly having at least one of orthorhombic crystal and trigonal crystal, the second region provided between the fourth conductive layer and the third conductive layer and mainly having at least one of orthorhombic crystal and trigonal crystal, and the third region provided between the first region and the second region and mainly having crystal other than orthorhombic crystal and trigonal crystal. Descriptions of some contents overlapping those in the second embodiment may be omitted.

Figure 34A:
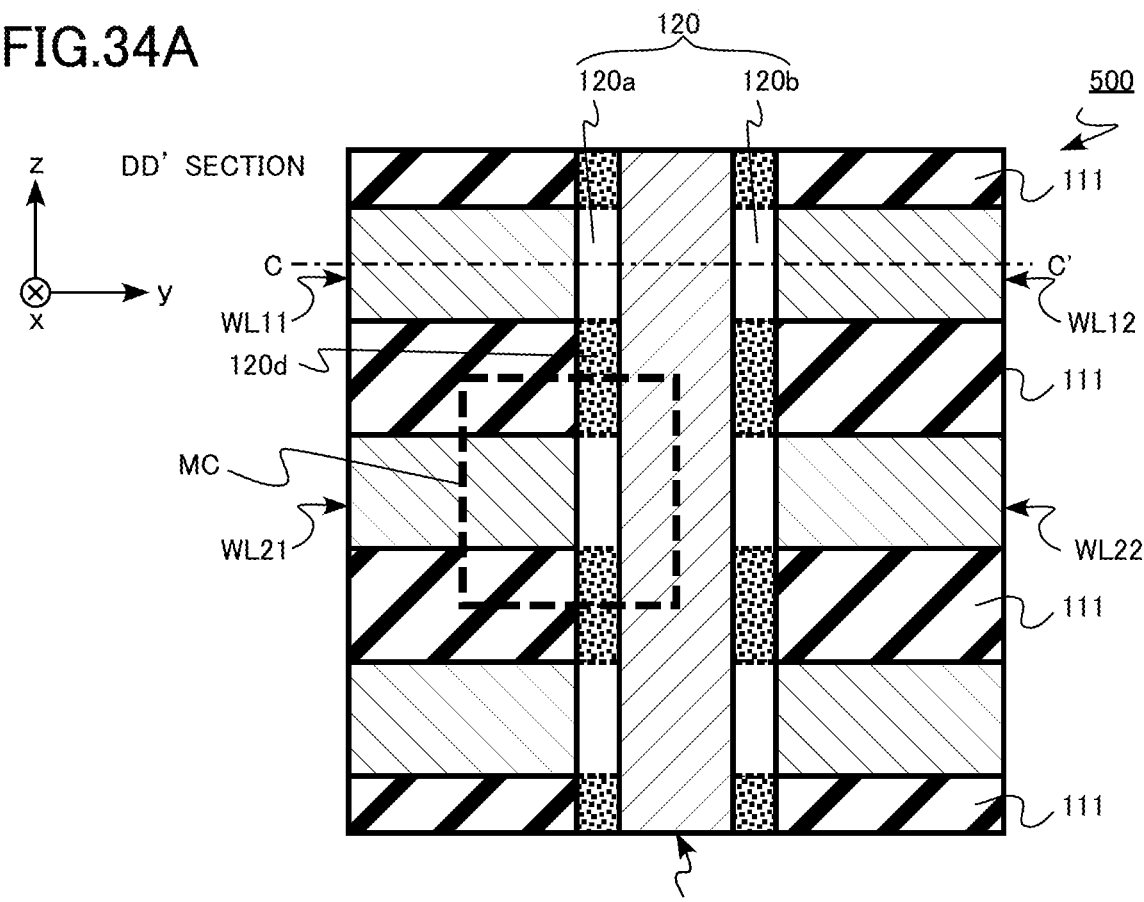
FIGS. 34A and 34B are schematic diagrams illustrating a portion of a memory cell array in a memory device according to a fifth embodiment.
Figure 34B:
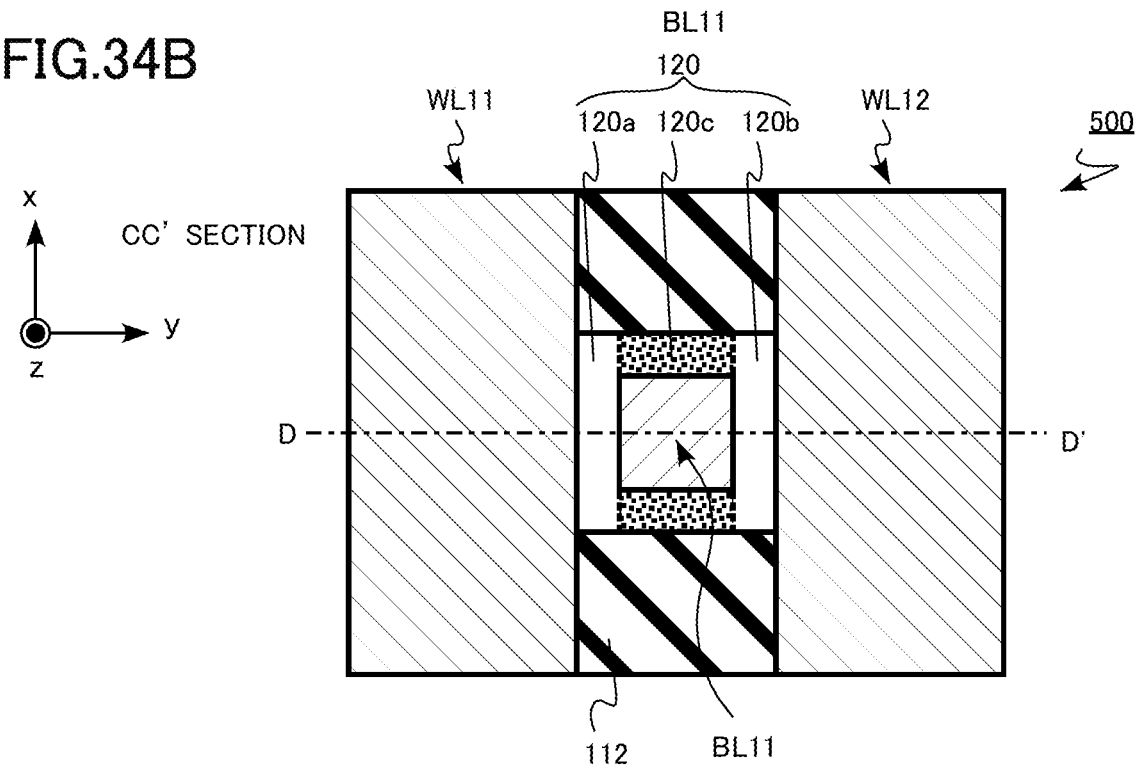

FIGS. 34A and 34B are schematic diagrams illustrating a portion of a memory cell array in the memory device in the fifth embodiment. FIG. 34A is a sectional view of a memory cell array 500 taken along the yz plane. FIG. 34B is a sectional view of the memory cell array 500 taken along the xy plane. FIG. 34A corresponds to a sectional view taken along line DD' in FIG. 34B. FIG. 34B corresponds to a sectional view taken along line CC' in FIG. 34A. For example, in FIG. 34A, a region surrounded by a broken line indicates one memory cell MC.

The memory cell array 500 includes a plurality of word lines including a word line WL11 (first conductive layer), a word line WL21 (second conductive layer), and a word line WL12 (fourth conductive layer), a plurality of bit lines including a bit line BL11 (third conductive layer), a first interlayer insulating layer 111 (insulating layer), a second interlayer insulating layer 112, and a dielectric layer 120. The plurality of word lines including the word line WL11 (first conductive layer), the word line WL21 (second conductive layer), and the word line WL12 (fourth conductive layer) may be collectively and simply described as the word line WL below. The plurality of bit lines including the bit line BL11 (third conductive layer) may be collectively and simply described as the bit line BL below.

The word line WL is alternately stacked with the first interlayer insulating layer 111 in the z-direction (second direction). The word line WL extends in the x-direction (first direction).

The word line WL includes metal, for example. The word line WL includes titanium nitride, for example. The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The first interlayer insulating layer 111 is provided between the word line WL and the word line WL. The first interlayer insulating layer 111 includes silicon oxide, for example. The first interlayer insulating layer 111 includes low-k dielectric substances, for example, paraelectric substance of silicon, carbon, oxygen composition, or substance of porous silicon oxides. Using low-k dielectric substance to the first interlayer insulating layer 111 has a merit of lower voltage driving because the electric field applied on dielectric layer 20 becomes stronger at the same driving voltages. The first interlayer insulating layer 111 is an example of the insulating layer.

The bit line EL intersects with the word line WL. The bit line BL is provided between the word line WL and the word line WL. The bit line BL11 (third conductive layer) is located between the word line WL11 (first conductive layer) and the word line WL12 (fourth conductive layer). The bit line BL extends in the z-direction (second direction).

For example, the bit line EL includes metal or a semiconductor. The bit line BL includes titanium nitride or tungsten, for example. The bit line BL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The second interlayer insulating layer 112 is provided between the bit line EL and the bit line BL. The second interlayer insulating layer 112 includes silicon oxide, for example. The second interlayer insulating layer 112 includes low-k dielectric substances, for example, paraelectric substance of silicon, carbon, oxygen composition, or substance of porous silicon oxides. Using low-k dielectric substance to the second interlayer insulating layer 112 has a merit of lower voltage driving because the electric field applied on dielectric layer 20 becomes stronger at the same driving voltages.

The dielectric layer 120 is provided between the word line WL and the bit line BL. The dielectric layer 120 is provided between the word line WL11 (first conductive layer) and the bit line BL11 (third conductive layer). The dielectric layer 120 is provided between the word line WL12 (fourth conductive layer) and the bit line BL11 (third conductive layer). The dielectric layer 120 is provided between the first interlayer insulating layer 111 (insulating layer) and the bit line BL11 (third conductive layer).

The thickness of the dielectric layer 120 between the word line WL11 (first conductive layer) and the bit line BL11 (third conductive layer) is equal to the thickness of the dielectric layer 120 between the first interlayer insulating layer 111 (insulating layer) and the bit line BL11 (third conductive layer). The thickness of the dielectric layer 120 is, for example, equal to or more than 3 nm and equal to or smaller than 20 nm.

The dielectric layer 120 includes an oxide which includes at least one of hafnium oxide and zirconium oxide.

The dielectric layer 120 has a first region 120*a*, a second region 120*b*, a third region 120*c*, and a fourth region 120*d*.

The first region 120*a* is provided between the word line WL11 (first conductive layer) and the bit line BL11 (third conductive layer). The second region 120*b* is provided between the word line WL12 (fourth conductive layer) and the bit line BL11 (third conductive layer). The third region 120*c* is provided between the first region 120*a* and the second region 120*b*. The fourth region 120*d* is provided between the first interlayer insulating layer 111 (insulating layer) and the bit line BL11 (third conductive layer).

The first region 120*a* and the second region 120*b* mainly have at least one of orthorhombic crystal and trigonal crystal. The third region 120*c* and the fourth region 120*d* mainly have crystal other than orthorhombic crystal and trigonal crystal. The oxide in the first region 120*a* and the second region 120*b* mainly has at least one of orthorhombic crystal and trigonal crystal. The oxide in the third region 120*c* and the fourth region 120*d* mainly has the crystal other than orthorhombic crystal and trigonal crystal. The crystal other than orthorhombic crystal and trigonal crystal includes cubic crystal, hexagonal crystal, tetragonal crystal, monoclinic crystal, and triclinic crystal.

The region of the dielectric layer 120 between the word line and the bit line BL mainly has orthorhombic crystal or trigonal crystal. The region of the dielectric layer 120 between the first interlayer insulating layer 111 and the bit line BL mainly has crystal other than orthorhombic crystal or trigonal crystal. The region of the dielectric layer 120 between the second interlayer insulating layer 112 and the bit line BL mainly has crystal other than orthorhombic crystal or trigonal crystal.

The first region 120*a* and the second region 120*b* include the ferroelectric substance. The third region 120*c* and the fourth region 120*d* include the paraelectric substance. The oxide in the first region 120*a* and the second region 120*b* is the ferroelectric substance. The oxide in the third region 120*c* and the fourth region 120*d* is the paraelectric substance.

The region of the dielectric layer 120 between the word line WL and the bit line BL includes the ferroelectric substance. The region of the dielectric layer 120 between the first interlayer insulating layer 111 and the bit line BL includes the paraelectric substance. The region of the dielectric layer 120 between the second interlayer insulating layer 112 and the bit line BL includes the paraelectric substance.

The oxide in the dielectric layer 120 is, for example, hafnium oxide. The oxide in the first region 120*a* and the second region 120*b* is, for example, hafnium oxide being the ferroelectric substance. The oxide in the first region 120*a* and the second region 120*b* is, for example, hafnium oxide of at least one of orthorhombic crystal and trigonal crystal. The hafnium oxide of orthorhombic crystal has ferroelectricity. The hafnium oxide of trigonal crystal has ferroelectricity.

The oxide in the third region 120*c* and the fourth region 120*d* is, for example, hafnium oxide being the paraelectric substance. The oxide in the third region 120*c* and the fourth region 120*d* is, for example, hafnium oxide of crystal other than orthorhombic crystal and trigonal crystal. The hafnium oxide of crystal other than orthorhombic crystal and trigonal crystal has no ferroelectricity but paraelectricity.

The oxide in the first region 120*a* and the second region 120*b* includes, for example, at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), germanium (Ge), and barium (Ba). In a case where the oxide is hafnium oxide, if the oxide includes the additive element, hafnium oxide is caused to easily exhibit ferroelectricity.

From a viewpoint of causing hafnium oxide to exhibit ferroelectricity, the concentration of the additive element is preferably equal to or more than 0.1 atomic % and equal to or less than 60 atomic %. An appropriate range of the concentration of the additive element for causing hafnium oxide to exhibit ferroelectricity varies depending on the type of additive element. For example, in a case where the additive element is silicon (Si) or trivalent elements of above elements for example aluminum (Al), the appropriate range of the concentration of the additive element for causing hafnium oxide to exhibit ferroelectricity is equal to or more than 3 atomic % and equal to or less than 7 atomic %. For example, in a case where the additive element is barium (Ba), the appropriate range of the concentration of the additive element for causing hafnium oxide to exhibit ferroelectricity is equal to or more than 0.1 atomic % and equal to or less than 3 atomic %. For example, in a case where the additive element is germanium (Ge), the appropriate range of the concentration of the additive element for causing hafnium oxide to exhibit ferroelectricity is equal to or more than 5 atomic % and equal to or less than 11 atomic %. For example, in a case where the additive element is zirconium (Zr), the appropriate range of the concentration of the additive element for causing hafnium oxide to exhibit ferroelectricity is equal to or more than 10 atomic % and equal to or less than 60 atomic %.

The oxide in the third region 120*c* and the fourth region 120*d* includes or does not include the additive element, for example. For example, the first concentration of the additive element in the first region 120*a* is different from the second concentration of the additive element in the third region 120*c*. The first concentration of the additive element in the first region 120*a* is higher than the second concentration of the additive element in the third region 120*c*.

As described above, in the ferroelectric memory in the fifth embodiment, the region of the dielectric layer 120 between the word line WL and the bit line BL includes the ferroelectric substance, and the region of the dielectric layer 120 between interlayer insulating layers (first interlayer insulating layer 111 and second interlayer insulating layer 112) includes the paraelectric substance. For example, if the concentration of the additive element in the region of the dielectric layer 120 between the word line WL and the bit line EL is set to be high, it is possible to set only the region of the dielectric layer 120 between the word line WL and the bit line BL to include the ferroelectric substance.

It is possible to set only the region in contact with the word line WL to include the ferroelectric substance, by performing crystallization annealing of the dielectric layer 120 before the bit line BL is formed, for example. With this method, consequently, it is possible to set only the region of the dielectric layer 120 between the word line WL and the bit line EL to include the ferroelectric substance.

In the ferroelectric memory in the fifth embodiment, since only the region of the dielectric layer 120 between the word line WL and the bit line BL includes the ferroelectric substance, the ferroelectric domain wall DW stays between the word line WL and the bit line EL. Thus, it is easy to stably form the domain wall DW as a current path between the word line WL and the bit line BL. The ferroelectric domain wall DW extend to the adjacent memory cell MC, and thus cell interference does not occur.

As described above, according to the memory device in the fifth embodiment, the stable operation of the memory cell is possible. Thus, according to the memory device in the fifth embodiment, it is possible to realize a memory device having high reliability and large capacity.

Sixth Embodiment

A memory device according to a sixth embodiment is different from the memory device in the first embodiment in that a memory cell array includes a three-dimensional structure, and word lines are commonly connected to all memory cells in a plane parallel to the substrate. Descriptions of some contents overlapping those in the first embodiment may be omitted.

The memory device in the sixth embodiment is a ferroelectric memory using a current flowing in a ferroelectric domain wall.

Figure 35:
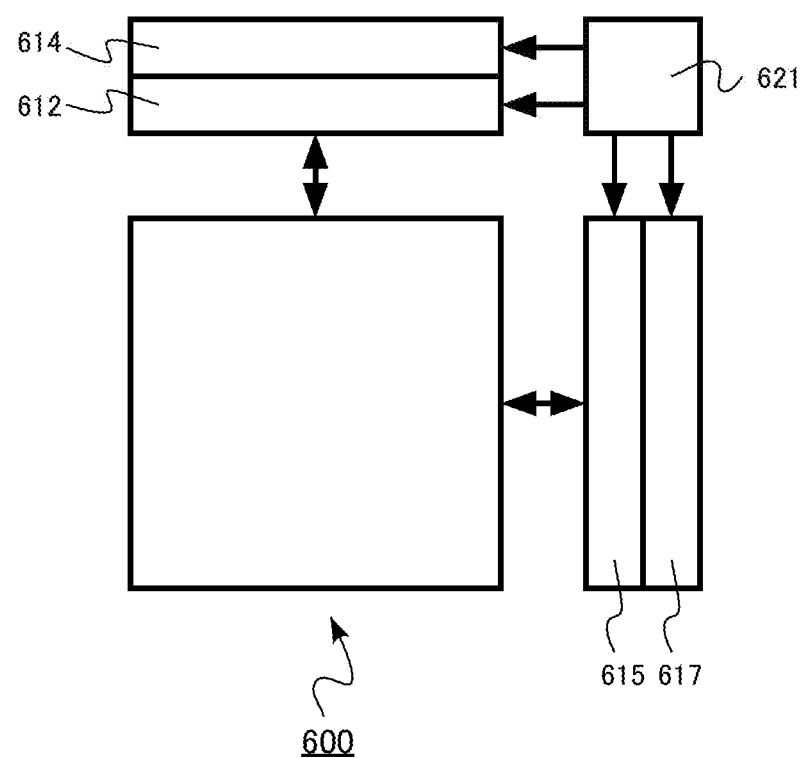
FIG. 35 is a block diagram illustrating a memory device according to a sixth embodiment.
Figure 36:
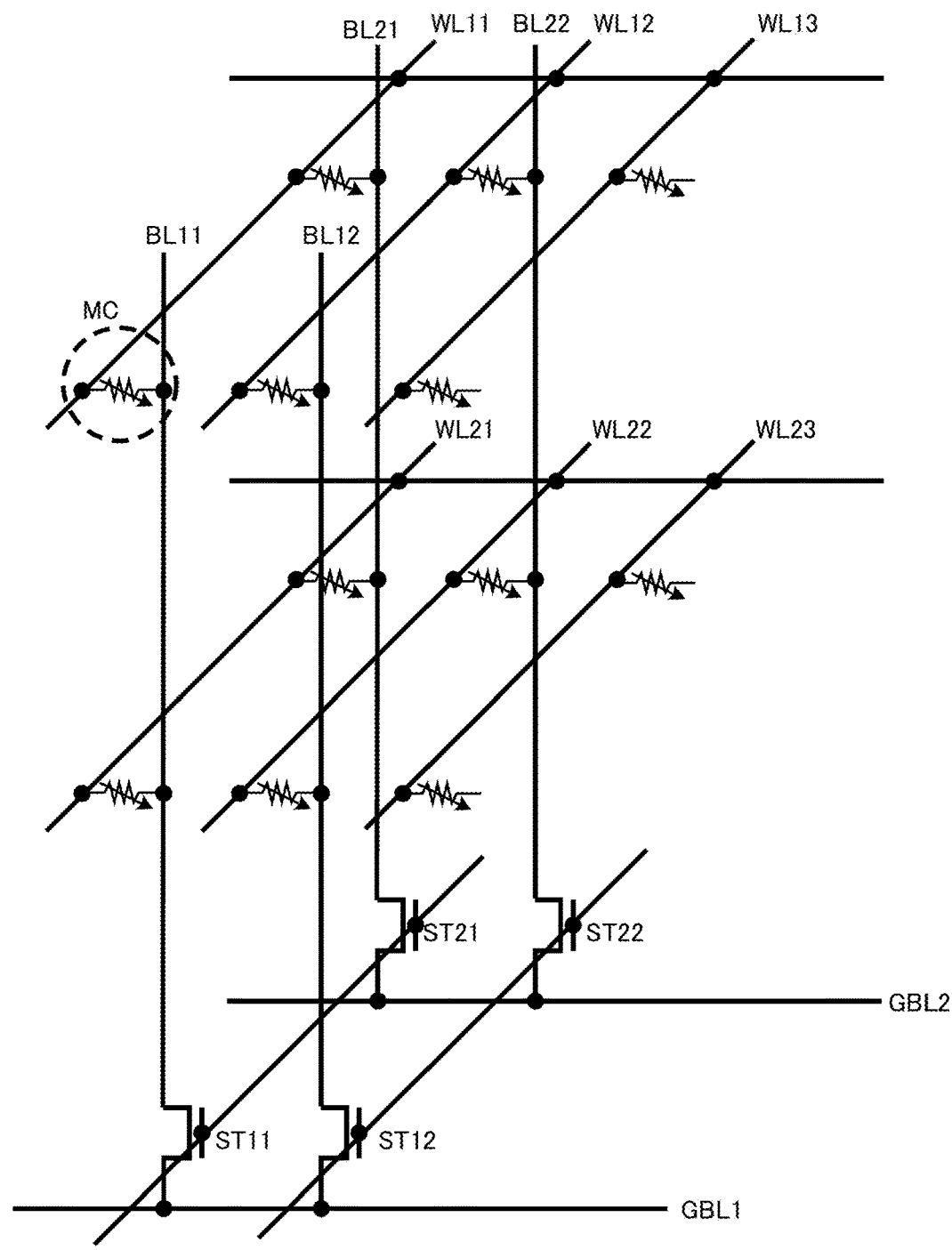
FIG. 36 is an equivalent circuit diagram illustrating a memory cell array of the memory device in the sixth embodiment.

FIG. 35 is a block diagram illustrating the memory device in the sixth embodiment. FIG. 36 is an equivalent circuit diagram illustrating the memory cell array of the memory device in the sixth embodiment. FIG. 36 schematically illustrating a wiring structure in the memory cell array. A memory cell array 600 in the sixth embodiment includes a three-dimensional structure in which memory cells MC are three-dimensionally arranged.

As illustrated in FIG. 35, the memory device includes the memory cell array 600, a word line driver circuit 612, a row decoder circuit 614, a sense amplifier circuit 615, a column decoder circuit 617, and a control circuit 621.

As illustrated in FIG. 36, a plurality of memory cells MC is three-dimensionally arranged in the memory cell array 600. In FIG. 36, a region surrounded by a dotted line corresponds to one memory cell MC.

The x-direction illustrated in FIG. 36 is defined as the first direction below, the y-direction is defined as the third direction below, and the z-direction is defined as the second direction below.

The memory cell array 600 includes, for example, a plurality of word lines WL (WL11, WL12, WL13, WL21, WL22, and WL23) and a plurality of bit lines BL (BL11, BL12, BL21, and BL22). The word line WL refers to a layer extending in the xy plane. For example, the word lines WL11, WL12, and WL13 correspond to one word-line electrically conductive layer, and the word lines WL21, WL22, and WL23 correspond to one word-line electrically conductive layer. In FIG. 36, this state is illustrated by an equivalent circuit in which all the word lines in the same plane, for example, the word lines WL21, WL22, and WL23 are electrically coupled to each other.

The bit line EL extends in the z-direction. The word-line electrically conductive layer and the bit line EL vertically intersect with each other. The memory cells MC are disposed at intersection portions between the word-line electrically conductive layer and the bit lines EL.

Figure 37:
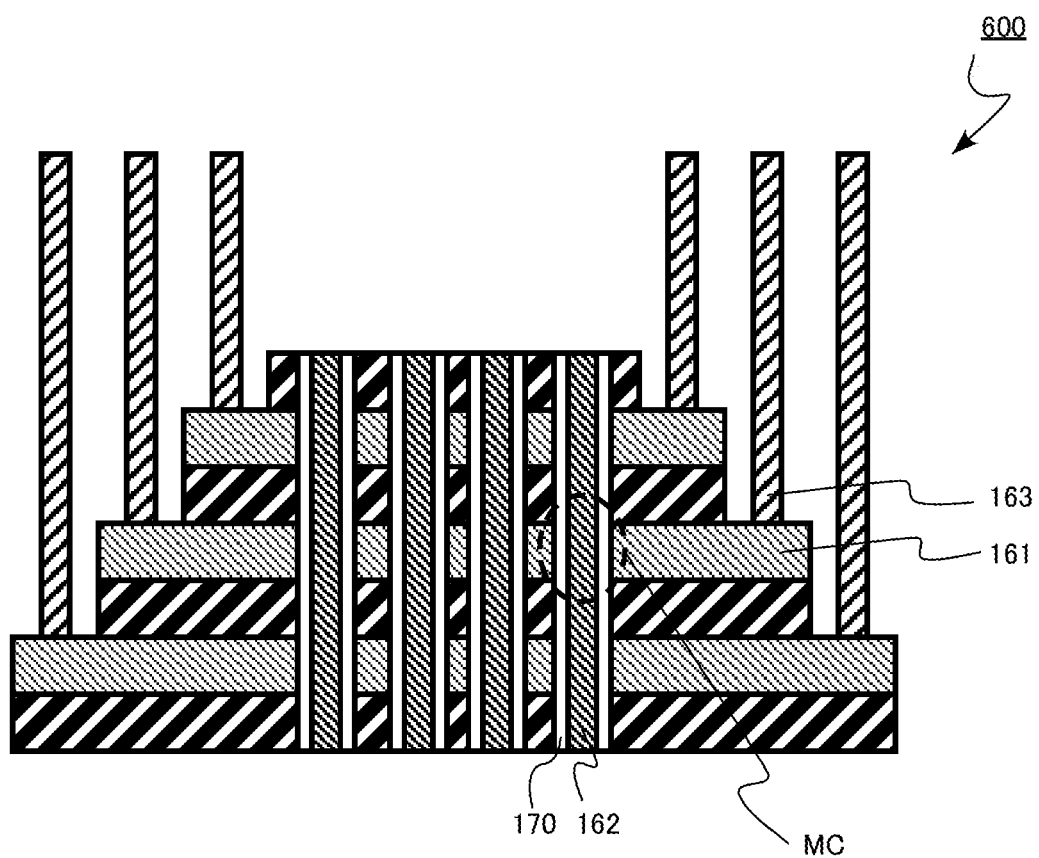
FIG. 37 is an enlarged sectional view schematically illustrating a portion of the memory cell array in the memory device in the sixth embodiment.

FIG. 37 is an enlarged sectional view schematically illustrating a portion of the memory cell array in the memory device in the sixth embodiment. An electrically conductive layer 161 as the word line is connected to a conductive line 163 extending in the z direction at a stepped portion provided in the peripheral portion of the memory cell array, for example. A region surrounded by a dotted line in FIG. 37 corresponds to a memory cell MC.

The conductive line 163 connected to a plurality of word-line electrically conductive layers is electrically connected to the row decoder circuit 614. The plurality of bit lines EL is connected to the sense amplifier circuit 615. Select transistors ST (ST11, ST21, ST12, and ST22) and global bit lines GBL (GBL1 and GBL2) are provided between the plurality of bit lines EL and the sense amplifier circuit 615.

The row decoder circuit 614 has a function of selecting a word line WL in accordance with an input row address signal. The word line driver circuit 612 has a function of applying a predetermined voltage to the word line WL selected by the row decoder circuit 614.

The column decoder circuit 617 has a function of selecting a bit line BL in accordance with an input column address signal. The sense amplifier circuit 615 has a function of applying a predetermined voltage to the bit line BL selected by the column decoder circuit 617. The sense amplifier circuit 215 has a function of detecting and amplifying a current flowing between the selected word line WL and the selected bit line BL.

The control circuit 621 has a function of controlling the word line driver circuit 612, the row decoder circuit 614, the sense amplifier circuit 615, the column decoder circuit 617, and other circuits (not illustrated).

The circuits such as the word line driver circuit 612, the row decoder circuit 614, the sense amplifier circuit 615, the column decoder circuit 617, and the control circuit 621 are configured, for example, by transistors and wiring layers using semiconductor layers (not illustrated).

Figure 38A:
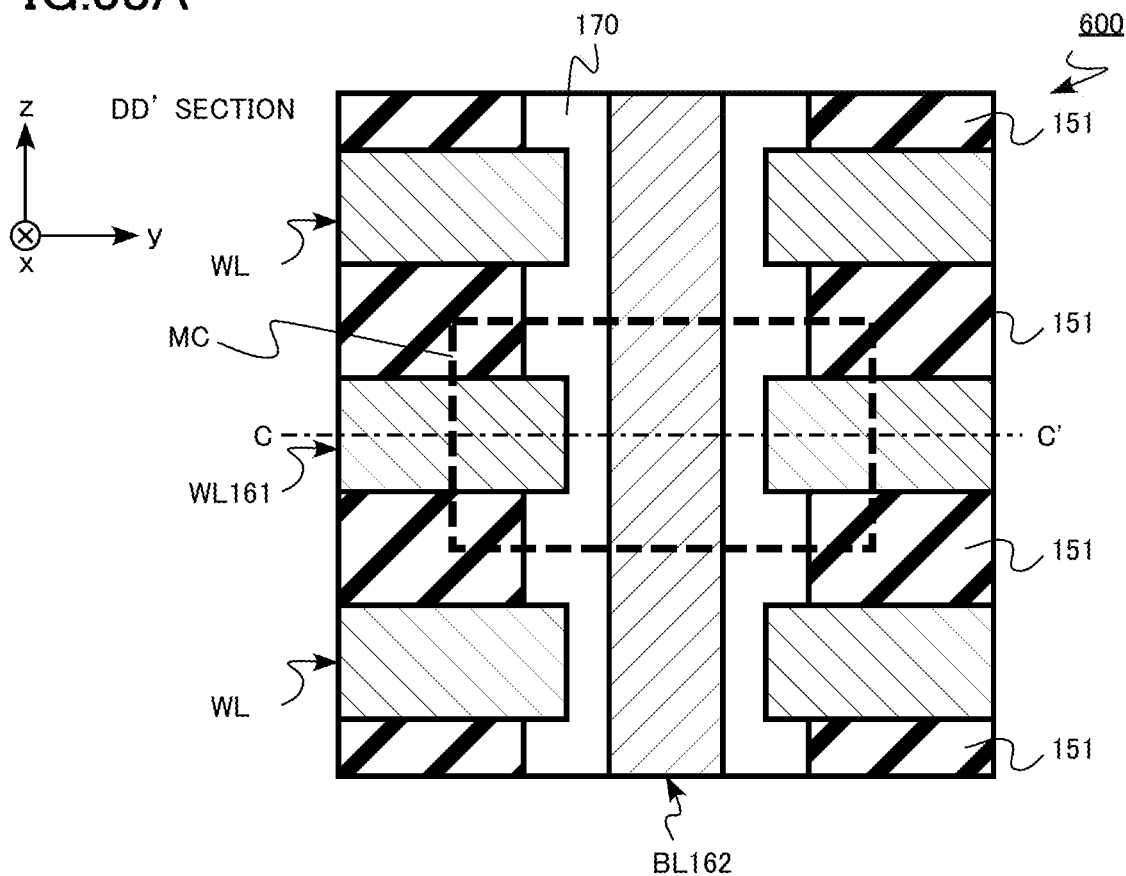
FIGS. 38A and 38B are enlarged schematic diagrams illustrating a portion of the memory cell array in the memory device in the sixth embodiment.
Figure 38B:
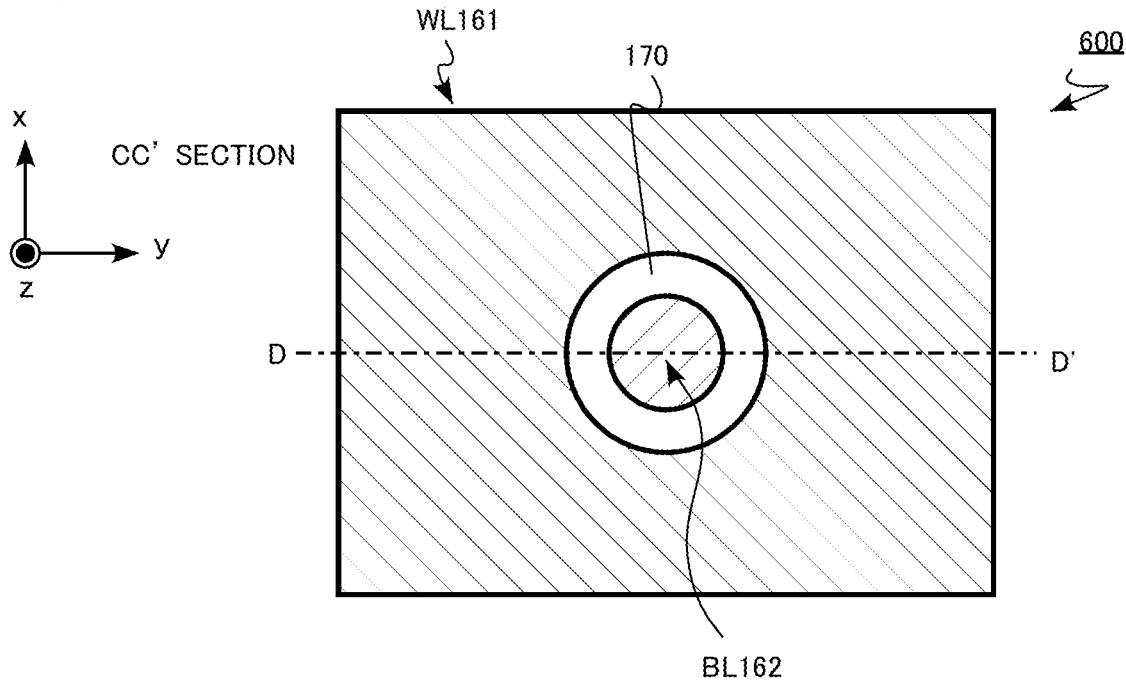

FIGS. 38A and 38B are enlarged schematic diagrams illustrating a portion of the memory cell array in the memory device in the sixth embodiment. FIG. 38A is a sectional view of the memory cell array 600 taken along the yz plane. FIG. 38B is a sectional view of the memory cell array 600 taken along the xy plane. For example, in FIG. 38A, a region surrounded by a broken line indicates one memory cell MC.

Figure 39:
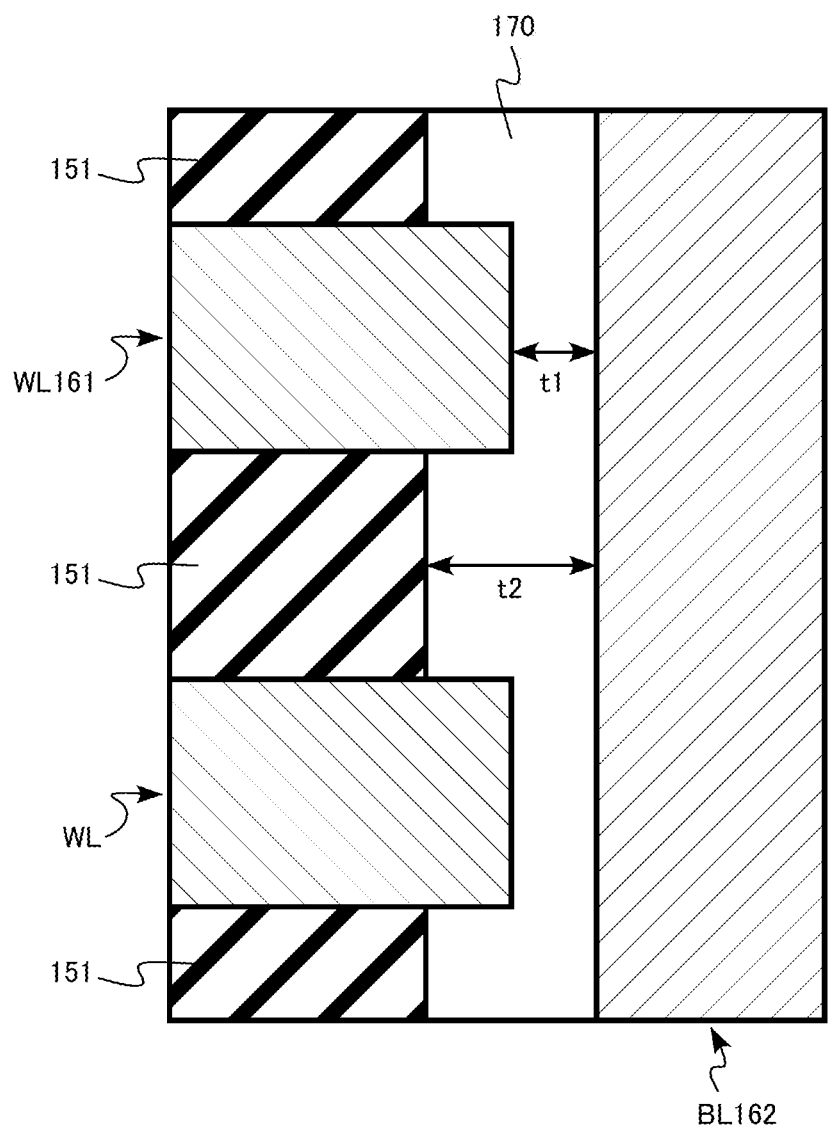
FIG. 39 is an enlarged sectional view schematically illustrating the portion of the memory cell array in the memory device in the sixth embodiment.

FIG. 39 is an enlarged sectional view schematically illustrating the portion of the memory cell array in the memory device in the sixth embodiment. FIG. 39 is an enlarged view of the portion in FIG. 38A.

The memory cell array 600 includes a plurality of word lines WL including a word line WL161, a plurality of bit lines including a bit line (z-direction conductive layer in a memory hole) BL162, an interlayer insulating layer 151 (insulating layer), and a dielectric layer 170.

The word line WL is alternately stacked with the interlayer insulating layer 151 in the z-direction. The word line WL extends in the xy plane.

The word line WL includes metal, for example. The word line WL includes titanium nitride, for example. The word line WL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The interlayer insulating layer 151 is provided between the word line WL and the word line WL. The interlayer insulating layer 151 includes silicon oxide, for example. The interlayer insulating layer 151 includes low-k dielectric substances, for example, paraelectric substance of silicon, carbon, oxygen composition, or substance of porous silicon oxides. Using low-k dielectric substance to the interlayer insulating layer 151 has a merit of lower voltage driving because the electric field applied on dielectric layer 20 becomes stronger at the same driving voltages. The interlayer insulating layer 151 is an example of the insulating layer.

The bit line BL intersects with the word line WL. The bit line BL extends in the z-direction.

For example, the bit line BL includes metal or a semiconductor. The bit line FL includes titanium nitride or tungsten, for example. The bit line BL contains conductive materials, for example, indium tin oxide (ITO), niobium doped strontium titanate (STO—Nb), which lattice constants match orthorhombic $HfO_2$ or orthorhombic $ZrO_2$ within the accuracy of 7%. The matched lattice constant facilitate the control of crystallinity.

The dielectric layer 170 is provided between the word line WL and the bit line EL. The dielectric layer 170 is provided between the word line WL161 and the bit line BL162. The dielectric layer 170 is provided between the interlayer insulating layer 151 (insulating layer) and the bit line BL162.

The first thickness (t1 in FIG. 39) of the dielectric layer 170 between the word line WL161 and the bit line BL162 is thinner than the second thickness (t2 in FIG. 39) of the dielectric layer 170 between the interlayer insulating layer 151 (insulating layer) and the bit line BL162.

The first thickness t1 of the dielectric layer 170 is, for example, equal to or more than 3 nm and equal to or smaller than 20 nm. The second thickness t2 of the dielectric layer 170 is, for example, equal to or more than 5 nm and equal to or smaller than 40 nm. A difference between the first thickness t1 and the second thickness t2 is, for example, equal to or more than 2 nm and equal to or smaller than 20 nm.

A corner of an end portion of the word line WL on the bit line EL side is covered by the dielectric layer 170. An end portion of the word line WL on the bit line BL side is buried in the dielectric layer 170.

The dielectric layer 170 includes the ferroelectric substance. The dielectric layer 170 includes an oxide which includes at least one of hafnium oxide and zirconium oxide. The oxide in the dielectric layer 170 is the ferroelectric substance. The oxide in the dielectric layer 170 mainly includes at least one of orthorhombic crystal and trigonal crystal. The oxide in the dielectric layer 170 includes crystal of at least one of an orthorhombic crystal system and a trigonal crystal system.

The oxide in the dielectric layer 170 is, for example, hafnium oxide being the ferroelectric substance. The dielectric layer 170 includes, for example, hafnium oxide as the main component. The phrase "including hafnium oxide as the main component" means that a molar ratio of hafnium oxide is the highest among substances in the dielectric layer 170. The molar ratio of hafnium oxide is equal to or more than 90%, for example.

The oxide in the dielectric layer 170 is, for example, zirconium oxide being the ferroelectric substance. The dielectric layer 170 includes, for example, zirconium oxide as the main component. The phrase "including zirconium oxide as the main component" means that a molar ratio of zirconium oxide is the highest among the substances in the dielectric layer 170.

The molar ratio of zirconium oxide in the dielectric layer 170 is equal to or more than 40% and equal to or less than 60%, for example. The oxide in the dielectric layer 170 is, for example, mixed crystal of hafnium oxide being the ferroelectric substance and zirconium oxide being the ferroelectric substance.

The oxide in the dielectric layer 170 includes, for example, at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), germanium (Ge), and barium (Ba). In a case where the oxide is hafnium oxide, if the oxide includes the additive element, hafnium oxide is caused to easily exhibit ferroelectricity.

From a viewpoint of causing hafnium oxide to exhibit ferroelectricity, the concentration of the additive element is preferably equal to or more than 0.1 atomic % and equal to or less than 60 atomic %. An appropriate range of the concentration of the additive element for causing hafnium oxide to exhibit ferroelectricity varies depending on the type of additive element. For example, in a case where the additive element is silicon (Si) or trivalent elements of above elements for example aluminum (Al), the appropriate range of the concentration of the additive element for causing hafnium oxide to exhibit ferroelectricity is equal to or more than 3 atomic % and equal to or less than 7 atomic %. For example, in a case where the additive element is barium (Ba), the appropriate range of the concentration of the additive element for causing hafnium oxide to exhibit ferroelectricity is equal to or more than 0.1 atomic % and equal to or less than 3 atomic %. For example, in a case where the additive element is germanium (Ge), the appropriate range of the concentration of the additive element for causing hafnium oxide to exhibit ferroelectricity is equal to or more than 5 atomic % and equal to or less than 11 atomic %. For example, in a case where the additive element is zirconium (Zr), the appropriate range of the concentration of the additive element for causing hafnium oxide to exhibit ferroelectricity is equal to or more than 10 atomic % and equal to or less than 60 atomic %.

The oxide in the dielectric layer 170 includes crystal of the orthorhombic crystal system. The oxide in the dielectric layer 170 is, for example, hafnium oxide mainly including hafnium oxide of the orthorhombic crystal system. Hafnium oxide is, for example, hafnium oxide mainly including the third orthorhombic crystal system (Orthorhombic III, space group $Pbc2_1$, space group number 29). Even though hafnium oxide of the trigonal crystal system (trigonal, space group R3m, or P3, or R3, space group number 160, or 143, or 146) is provided, this hafnium oxide may be used because this hafnium oxide has ferroelectricity.

The oxide in the dielectric layer 170 is, for example, zirconium oxide mainly including zirconium oxide of the orthorhombic crystal system. Zirconium oxide is, for example, zirconium oxide mainly including the third orthorhombic crystal system (Orthorhombic III, space group $Pbc2_1$, space group number 29). Even though zirconium oxide mainly including zirconium oxide having a crystal structure of the trigonal crystal system (trigonal, space group R3m, or P3, or R3, space group number 160, or 143, or 146) is provided, this zirconium oxide may be used because this zirconium oxide has ferroelectricity.

Next, an example of a manufacturing method of the memory device according to the sixth embodiment will be described.

Firstly, a stacked body in which a first titanium nitride film 161 and a silicon oxide film 151 are alternately stacked in the z-direction is formed on a substrate (not illustrated). A portion of the first titanium nitride film 161 finally becomes the word line WL electrically conductive layer. A portion of the silicon oxide film 151 finally becomes a portion of the interlayer insulating layer 151. The silicon oxide film 151 and the first titanium nitride film 161 are formed, for example, by the CVD method.

Then, deep hole etching is performed on the stacked body to form a hole.

Then, the silicon oxide film 151 on the inner surface of the hole is retracted by wet etching. The silicon oxide film 151 is selectively etched with respect to the first titanium nitride film 161 by wet etching.

Then, a hafnium oxide film 170 is formed on the inner surface of the hole. A portion of the hafnium oxide film 170 finally becomes a portion of a dielectric layer 170. The hafnium oxide film 170 includes, for example, silicon (Si) as an additive element.

The hafnium oxide film 170 is formed, for example, by an ALD method. The hafnium oxide film 170 is amorphous immediately after the hafnium oxide film is formed.

Then, the hole is filled with a second titanium nitride film 162. The second titanium nitride film 162 finally becomes the bit line BL. The second titanium nitride film 162 is formed, for example, by the CVD method.

Then, heat treatment is performed to crystallize the hafnium oxide film 170. The heat treatment is performed, for example, in a nitrogen gas atmosphere at a temperature which is equal to or higher than 600° C. and equal to or lower than 1050° C., for a period of 1 second or more and 30 seconds or less. The heat treatment is so-called crystallization annealing.

With the heat treatment, the hafnium oxide film 170 is crystallized to have at least one of orthorhombic crystal and trigonal crystal. With the heat treatment, the hafnium oxide film 170 becomes a ferroelectric film.

With the above-described manufacturing method, the memory device illustrated in FIGS. 38A to 39 according to the sixth embodiment is manufactured.

In the ferroelectric memory in the sixth embodiment, similar to the ferroelectric memory in the first and second embodiments, the first thickness (t1 in FIG. 39) of the dielectric layer 170 between the word line WL161 and the bit line BL162 is thinner than the second thickness (t2 in FIG. 39) of the dielectric layer 170 between the interlayer insulating layer 151 (insulating layer) and the bit line BL162. Thus, the corner of the end portion of the word line WL on the bit line BL side is covered by the dielectric layer 170. In other words, the end portion of the word line WL on the bit line BL side is buried in the dielectric layer 170.

Figure 40:
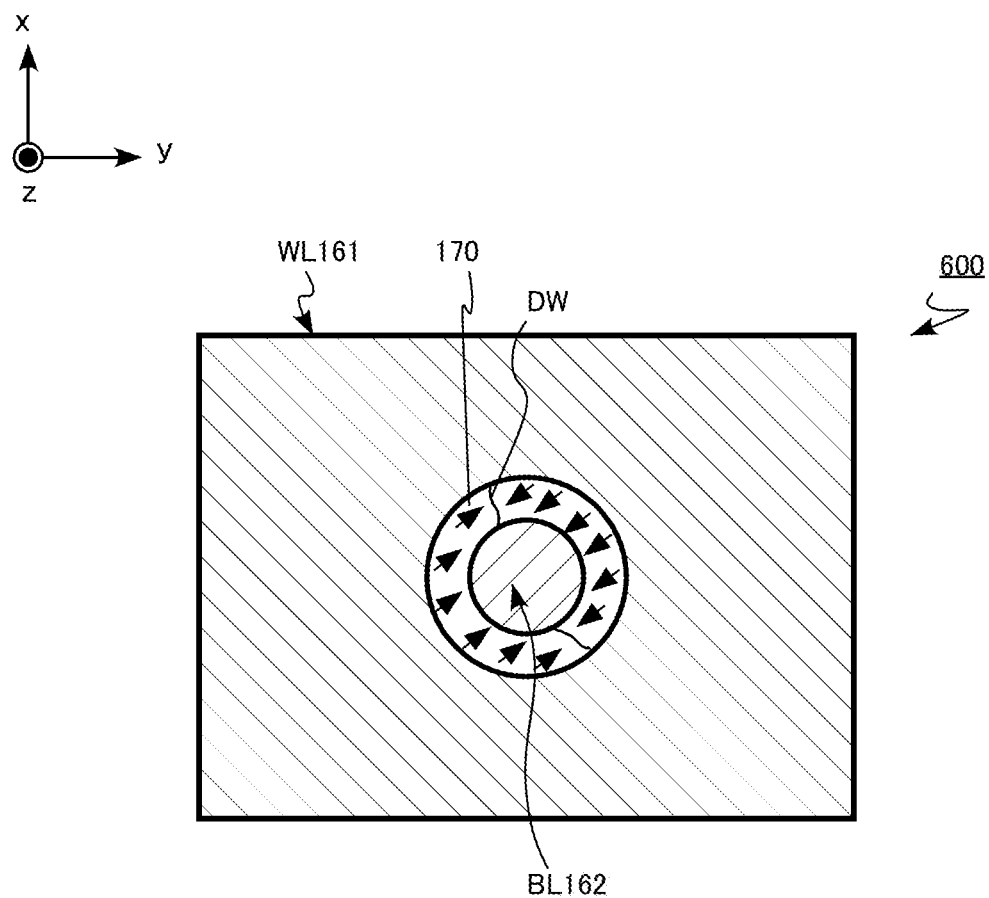
FIG. 40 is a diagram for a function and effect of the memory device in the sixth embodiment.

FIG. 40 is a diagram for a function and effect of the memory device in the sixth embodiment. FIG. 40 illustrates a form of a polarization domain of the ferroelectric substance.

FIG. 40 is an xy sectional view. Spontaneous polarization of the ferroelectric substance fluctuates by an electric field applied between an outer circumferential electrode (WL161) and a core wire (BL162). However, when a ferroelectric material having a circumferential shape is provided, the domain wall DW is necessarily provided at any two points of the element. When the domain wall DW has end portions at both the outer circumferential electrode and the core wire, a current flowing in the domain wall DW is obtained.

According to the memory device in the sixth embodiment, with the functions similar to the functions of the ferroelectric memory in the first embodiment and the second embodiment, it is possible to stably form a domain wall DW between the word line WL and the bit line BL. Accordingly, the stable operation of the memory cell MC is possible.

Figure 41A:
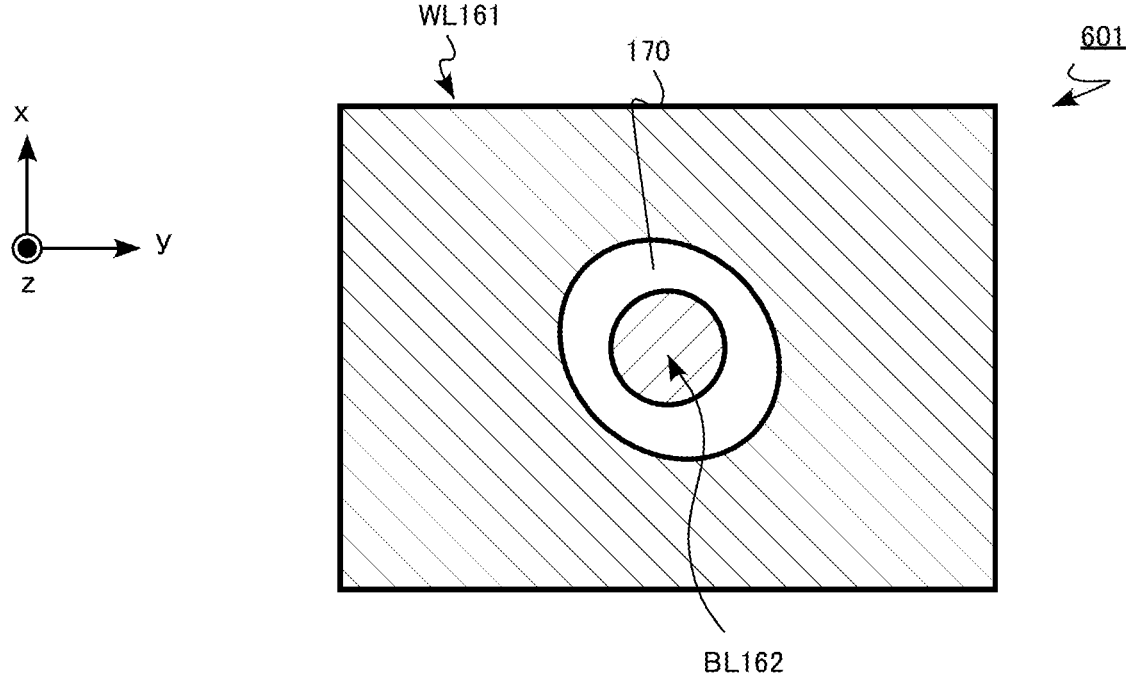
FIGS. 41A and 41B are enlarged schematic diagrams illustrating the portion of a memory cell array in a memory device according to a first modification example of the sixth embodiment.
Figure 41B:
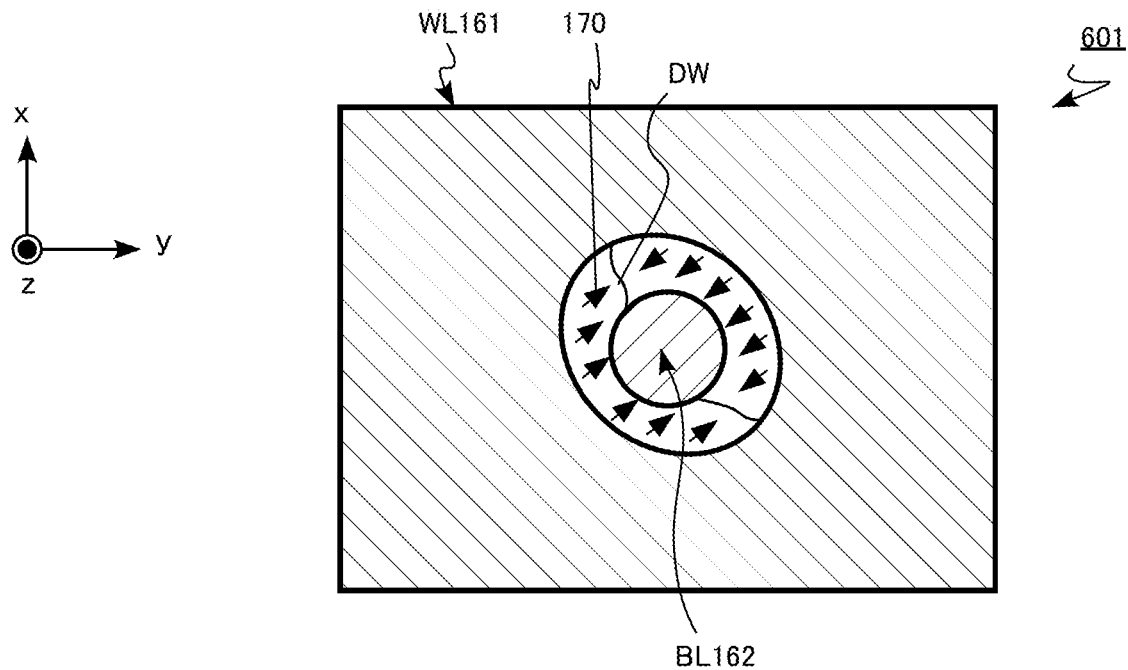

FIGS. 41A and 41B are enlarged schematic diagrams illustrating the portion of a memory cell array in a memory device according to a first modification example of the sixth embodiment. FIG. 41A corresponds to FIG. 38B, and FIG. 41B corresponds to FIG. 40.

In a memory cell array 601 in the first modified example, a boundary between the dielectric layer 170 and the word line WL161 is, for example, an ellipse other than a perfect circle. In addition to the ellipse, various structures such as an egg shape and a rice ball shape may be made, and how to deform from the perfect circle is a design matter depending on the convenience of the process and the like. In a case of the memory cell array 601 in the first modification example, for example, as illustrated in FIG. 41B, the domain wall DW is stably formed in a major axis direction of the ellipse. Thus, it is possible to stably form the domain wall DW. Accordingly, the stable operation of the memory cell MC is possible.

Figure 42A:
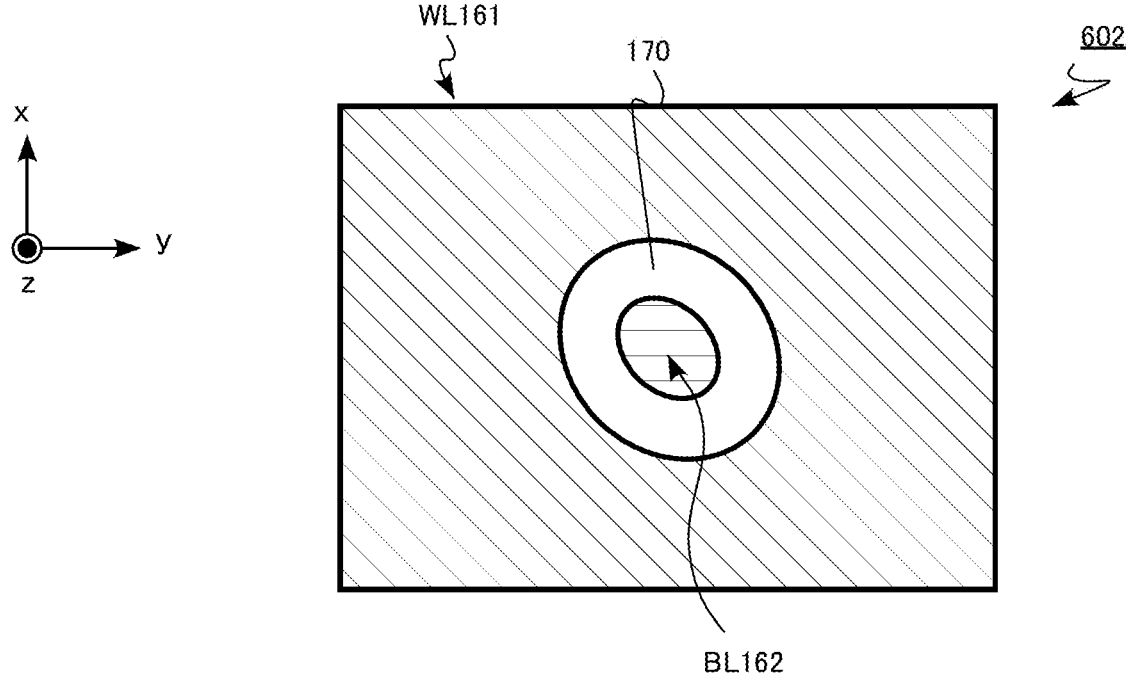
FIGS. 42A and 42B are enlarged schematic diagrams illustrating the portion of a memory cell array in a memory device according to a second modification example of the sixth embodiment.
Figure 42B:
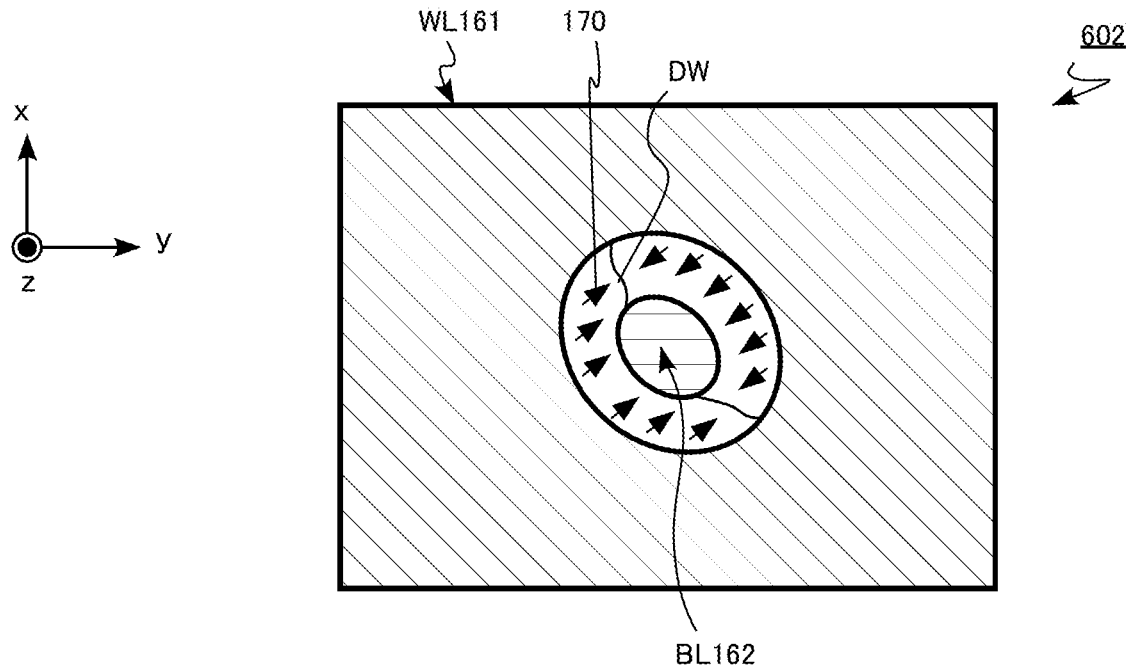

FIGS. 42A and 42B are enlarged schematic diagrams illustrating the portion of a memory cell array in a memory device according to a second modification example of the sixth embodiment. FIG. 42A corresponds to FIG. 38B, and FIG. 42B corresponds to FIG. 40.

In a memory cell array 602 in the second modification example, a boundary between the bit line BL162 and the dielectric layer 170 and a boundary between the dielectric layer 170 and the word line WL161 are, for example, ellipses other than a perfect circle. In addition to the ellipse, various structures such as an egg shape and a rice ball shape may be made, and how to deform from the perfect circle is a design matter depending on the convenience of the process and the like. In a case of the memory cell array 602 in the second modification example, for example, as illustrated in FIG. 42B, the domain wall DW is stably formed in a major axis direction of the ellipse. Thus, it is possible to stably form the domain wall DW. Accordingly, the stable operation of the memory cell MC is possible.

Figure 43A:
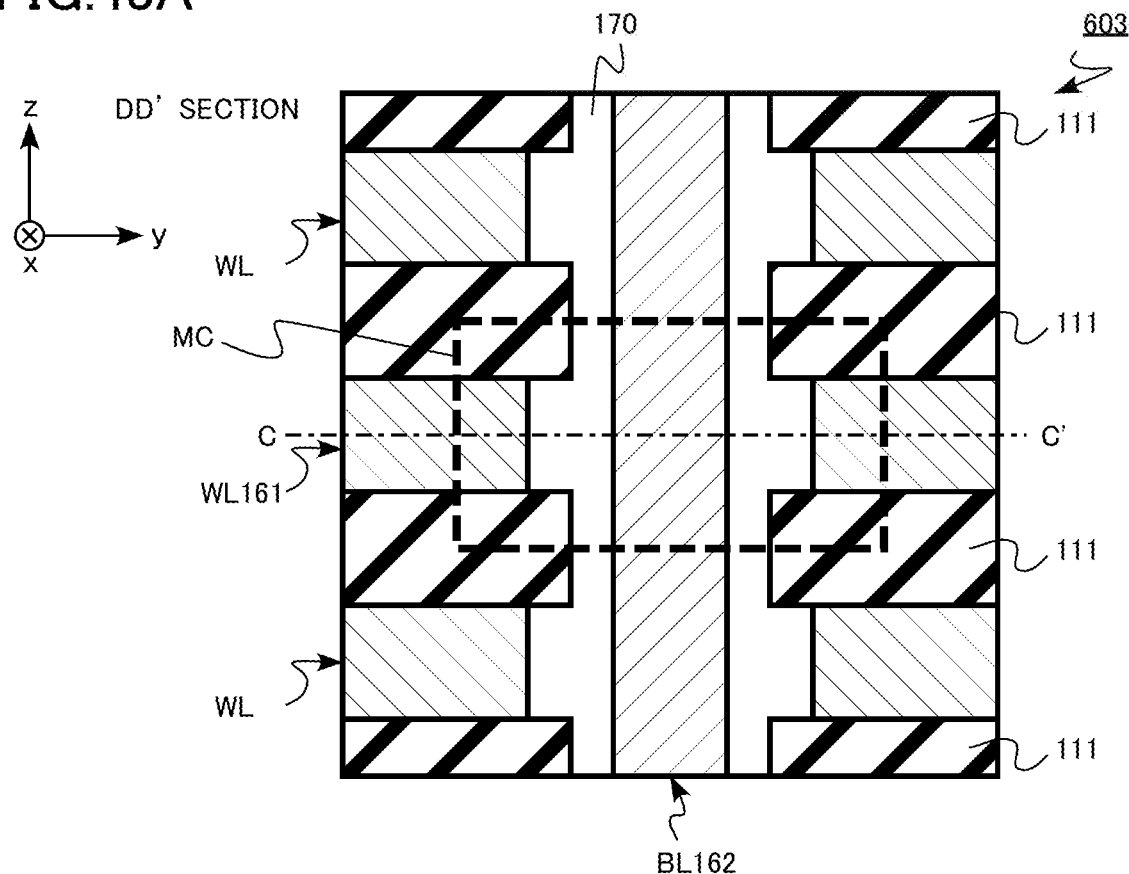
FIGS. 43A and 43B are enlarged schematic diagrams illustrating the portion of a memory cell array in a memory device according to a third modification example of the sixth embodiment.
Figure 43B:
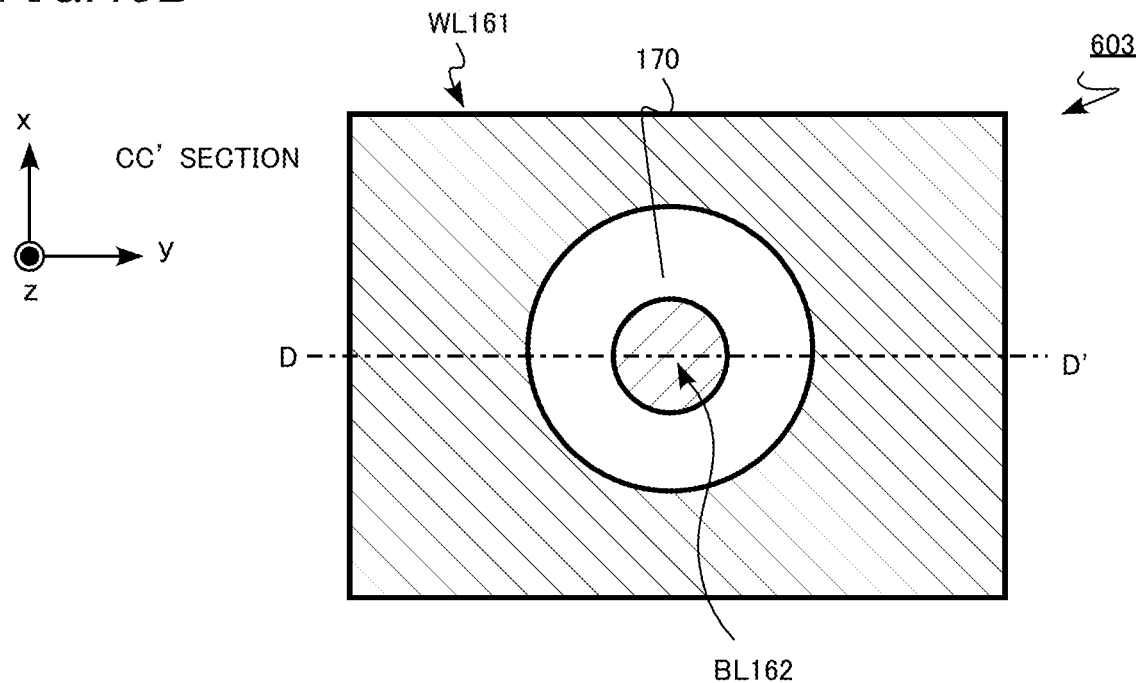

FIGS. 43A and 43B are enlarged schematic diagrams illustrating the portion of a memory cell array in a memory device according to a third modification example of the sixth embodiment. FIG. 43A is a sectional view of a memory cell array 603 taken along the yz plane. FIG. 43B is a sectional view of the memory cell array 603 taken along the xy plane. For example, in FIG. 43A, a region surrounded by a broken line indicates one memory cell MC.

Figure 44:
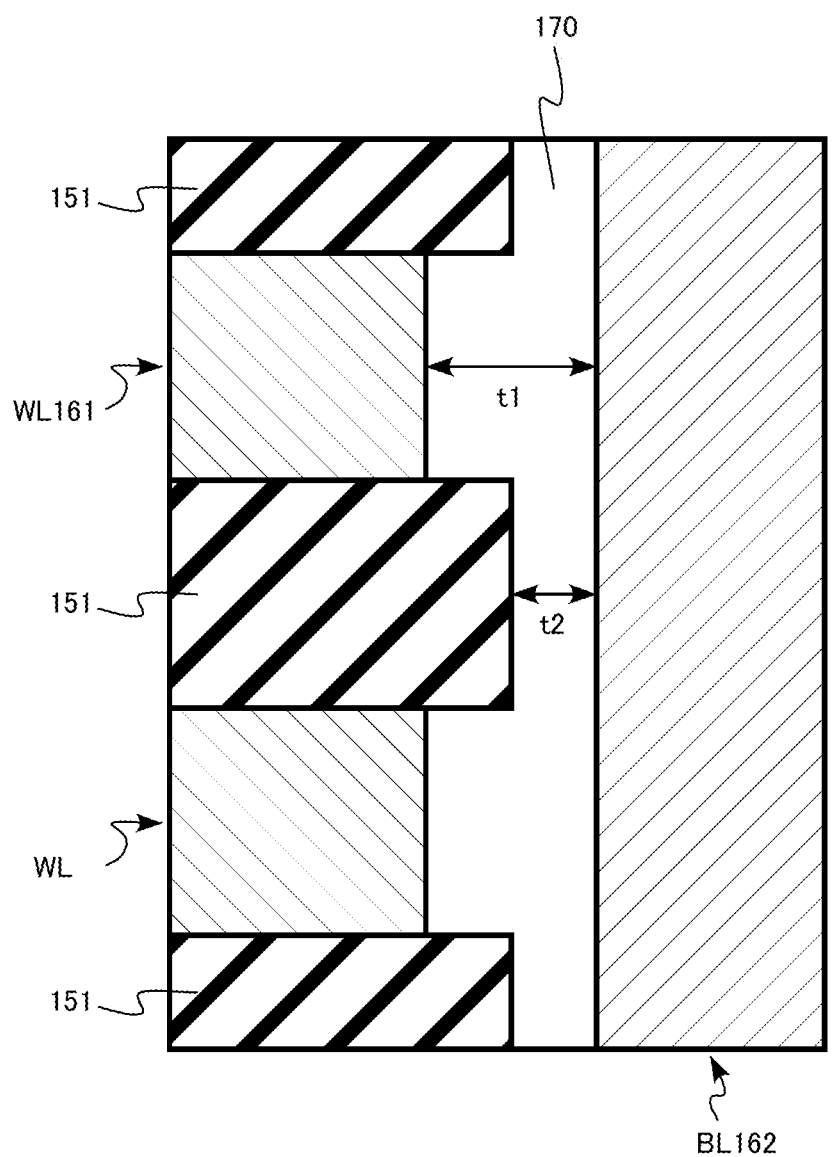
FIG. 44 is an enlarged sectional view schematically illustrating the portion of the memory cell array in the memory device in the third modification example of the sixth embodiment.

FIG. 44 is an enlarged sectional view schematically illustrating the portion of the memory cell array in the memory device in the third modification example of the sixth embodiment. FIG. 44 is an enlarged view of the portion in FIG. 43B.

In a ferroelectric memory in the third modification example of the sixth embodiment, similar to the ferroelectric memory in the third and fourth embodiments, the first thickness (t1 in FIG. 44) of the dielectric layer 170 between the word line WL161 and the bit line BL162 is thicker than the second thickness (t2 in FIG. 44) of the dielectric layer 170 between the interlayer insulating layer 151 (insulating layer) and the bit line BL162. The dielectric layer 170 is recessed using the corner of the end portion of word line WL on the bit line BL side, as a boundary. In the third modification example, the shape described in the first modification example and the second modification example may also be applied as the xy sectional view of the memory cell array 603.

Accordingly, with the function similar to the function of the ferroelectric memory in the third embodiment or the fourth embodiment, it is possible to stably form a domain wall DW between the word line WL and the bit line BL. Accordingly, the stable operation of the memory cell MC is possible.

As described above, according to the memory device in the sixth embodiment and the memory device in the modification examples of the sixth embodiment, the stable operation of the memory cell is possible. Thus, according to the memory device in the sixth embodiment and the modification examples of the sixth embodiment, it is possible to realize a memory device having high reliability and large capacity.

In the first and third embodiments, a case where the cross-point structure of the memory cell array includes only one layer is described as an example. However, for example, the memory cell array in the first and third embodiments may have a three-dimensional structure in which a plurality of layers is stacked.

In the first to sixth embodiments, a case where the insulating layer between the word line WL and the word line WL is solid is described as an example. However, the insulating layer between the word line WL and the word line WL may be gas. For example, a cavity may be provided between the word line WL and the word line WL.

While certain embodiments have been described, these embodiments have been presented by way of example only, and are not intended to limit the scope of the inventions. Indeed, a memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
a first conductive layer extending in a first direction;
a second conductive layer extending in the first direction;
a third conductive layer extending in a second direction intersecting with the first direction;
an insulating layer provided between the first conductive layer and the second conductive layer; and
a dielectric layer provided between the first conductive layer and the third conductive layer, and between the insulating layer and the third conductive layer, the dielectric layer having a first thickness thinner than a second thickness, the first thickness being a thickness between the first conductive layer and the third conductive layer, the second thickness being a thickness between the insulating layer and the third conductive layer, and the dielectric layer including an oxide including at least one of hafnium oxide and zirconium oxide.

2. The memory device according to claim 1, wherein the oxide is a ferroelectric substance.

3. The memory device according to claim 1, wherein the oxide mainly has at least one of orthorhombic crystal and trigonal crystal.

4. The memory device according to claim 1, wherein the first conductive layer, the second conductive layer, and the third conductive layer include metal.

5. The memory device according to claim 1, wherein the oxide includes at least one element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), germanium (Ge), and barium (Ba).

6. The memory device according to claim 1, further comprising a first switching layer provided in at least one of a position between the dielectric layer and the first conductive layer and a position between the dielectric layer and the third conductive layer.

7. The memory device according to claim 6, further comprising a second switching layer provided in the other of the position between the dielectric layer and the first conductive layer and the position between the dielectric layer and the third conductive layer, a material of the second switching layer being the same as a material of the first switching layer.

8. The memory device according to claim 1, wherein the first thickness is equal to or more than 3 nm and equal to or less than 20 nm.

* * * * *